United States Patent
Masuda et al.

(10) Patent No.: US 6,245,190 B1
(45) Date of Patent: Jun. 12, 2001

(54) PLASMA PROCESSING SYSTEM AND PLASMA PROCESSING METHOD

(75) Inventors: Toshio Masuda, Toride; Katsuhiko Mitani, Hikari; Tetsunori Kaji, Tokuyama; Jun'ichi Tanaka, Chiyoda-machi; Katsuya Watanabe; Shigeru Shirayone, both of Kudamatsu; Toru Otsubo, Fujisawa; Ichiro Sasaki, Yokohama; Hideshi Fukumoto, Hitachinaka; Makoto Koizumi, Naka-machi, all of (JP)

(73) Assignee: Hitachi, Ltd., Tokyo (JP)

( * ) Notice: Subject to any disclaimer, the term of this patent is extended or adjusted under 35 U.S.C. 154(b) by 0 days.

(21) Appl. No.: 09/048,075

(22) Filed: Mar. 26, 1998

(30) Foreign Application Priority Data

Mar. 26, 1997 (JP) ................................................ 9-073063

(51) Int. Cl.$^7$ .............................. H05H 1/46; H05H 1/50
(52) U.S. Cl. .............. 156/345; 118/723 R; 118/723 MA
(58) Field of Search ........................ 156/345 P, 345 MG, 156/345; 204/298.16, 298.37; 216/70; 118/723 R, 723 MR, 723 MA

(56) References Cited

U.S. PATENT DOCUMENTS

| | | | |
|---|---|---|---|
| 4,740,268 | * | 4/1988 | Bukhman ............................ 156/345 |
| 4,919,783 | | 4/1990 | Asamaki et al. . |
| 5,292,395 | | 3/1994 | Fujiwara . |
| 5,401,351 | * | 3/1995 | Samukawa .......................... 156/345 |
| 5,431,769 | | 7/1995 | Kisakibaru et al. . |
| 5,554,223 | * | 9/1996 | Imahashi ............................ 118/723 I |
| 5,556,501 | * | 9/1996 | Collins et al. ....................... 156/345 |

FOREIGN PATENT DOCUMENTS

| | | |
|---|---|---|
| 0 669 637 A1 | 8/1995 | (EP) . |
| 0 740 328 A2 | 10/1996 | (EP) . |
| 0 793 254 A2 | 9/1997 | (EP) . |
| 2-312231 | 12/1990 | (JP) . |
| 3-259517 | 11/1991 | (JP) . |
| 7-288195 | 10/1995 | (JP) . |
| 7-297175 | 11/1995 | (JP) . |

OTHER PUBLICATIONS

"Ultra-Clean Technology", vol. 8, No. 1, 1996, pp. 20–24 (Month Unavailable).

* cited by examiner

Primary Examiner—Robert J. Warden, Sr.
Assistant Examiner—Kaj K. Olsen
(74) Attorney, Agent, or Firm—Antonelli, Terry, Stout & Kraus, LLP

(57) ABSTRACT

A plasma processing apparatus and a method therefor which can achieve a preferred process rate, a fine pattern process capability, a selectivity and uniformity of processing at the same time compatibly for a large size wafer, which effects are achieved by controlling the plasma state and the dissociation state of etching gas through control of the electron resonance through application of a magnetic field thereto. A high frequency power at 20–300 MHz is applied across a pair of electrodes in a vacuum process chamber, and a magnetic field is formed parallel to the plane of the electrodes in the space between the electrodes. By controlling the intensity of the magnetic field in a range of 100 gauss or smaller, formation of electron cyclotron resonance and electron sheath resonance occurring from interaction between the electrical field and the magnetic field in the electrode sheath portion is controlled. Thereby, the plasma state, i.e., the electron density, electron energy distribution and dissociation state of the process gas in the plasma, can be controlled. The magnetic field is generated by a plurality of coils, an outer shield, and pendant yoke to form magnetic field parallel to the plane of the electrodes in the space between the upper and the bottom electrodes.

10 Claims, 34 Drawing Sheets

PRINCIPLE OF ELECTRON HEATING BY ECR-S

PRINCIPLE OF ELECTRON HEATING BY ESR (a) B = 0 Gauss   (b) B = 30 Gauss (a)

(b)

PLASMA PROCESSING SYSTEM AND PLASMA PROCESSING METHOD

BACKGROUND OF THE INVENTION

The present invention relates to a plasma processing system and a plasma processing method, and in particular, it relates to a a plasma processing system and a method therefor which are suitable for forming fine patterns in the process of semiconductor manufacture.

RELATED ART

Various types of conventional plasma processing equipment have been used in the fine pattern processing in the semiconductor manufacture. In particular, the parallel plate type plasma processing equipment, which is known for its advantages of a relatively simple structure and uniformity of plasma, is widely used.

A conventional parallel plate type plasma processing system applies a high frequency power across a pair of parallel plate electrodes which are disposed oppositely in the upper part and the bottom part in a processing chamber, and processes a wafer using a plasma produced therein. For example, when processing a wafer by etching, so-called reactive ion etching (RIE) method is used. According to this RIE method, etching gas is introduced into the processing chamber, in which the etching gas is dissociated into ions and radicals (excited active species) by plasma to cause these ions and radicals to act on the surface of the wafer.

Also, the ion energy modulation (IEM) method is used in the parallel plate type plasma processing system. This IEM method which is disclosed in JP-A 7-297175 applies a different frequency power to each of the pair of electrodes in the upper and the bottom portions. A frequency of power to be applied to the electrode on the side where a plasma is produced is set at several tens MHZ or more, and a frequency of power to be applied to the electrode on the bias side on which a sample wafer is placed is set at several MHz or less. As a result, since a plasma density and a self bias of the sample, i.e., ion energy can be controlled independently, controllability of plasma and etching process is improved.

On the other hand, a magnetically enhanced RIE (MERIE) method which applies a magnetic field of approximately 30–90 gauss in a direction parallel to the upper and bottom parallel plate electrodes is also used in the parallel plate type plasma processing system. According to this MERIE method, an improved etching rate better than the RIE method is obtained due to the magnetic effect. Further, a magnetron RIE (M-RIE) plasma processing system as disclosed in JP-A 2-312231 is also used. According to this M-RIE method, a strong magnetic field in excess of 100 gauss is formed between the upper and the bottom electrodes in a direction parallel to the surfaces of the electrodes. Then, by interaction between this magnetic field and the electrical field generated between the upper and the bottom electrodes, electrons move in a cycloid motion in a manner to twine around a line of magnetic force. As a result, a frequency of collision between electrons and gas increases, thereby ensuring a high plasma density to be obtained.

Problems to be Solved by the Invention

Now, with an increasing demand for a larger-scale integration of semiconductor devices, it is required for the plasma processing system further to improve its fine pattern process capability and processing rate as well as selectivity. For example, in etching of a contact hole or via hole, it is required that a large aspect hole, i.e., a narrow and deep hole, can be etched vertically and at a higher rate. In addition, only a hole portion must be etched selectively and precisely. Also, such etching characteristics must be ensured to be highly reproducible and controllable. Still further, with an increasing diameter of wafers, it is required that uniformity of such etching rate and selectivity is ensured over the whole area of a large-sized wafer.

In order to satisfy such requirements, efforts to lower the process pressure and to increase plasma density are proceeding. If process pressure is lowered to several Pa, a frequency of collision between ions/radicals and molecules will decrease, thereby improving directivity of ions and radicals, and consequently, improvement in fine pattern processability can be expected. Further, since densities of ions and radicals which proceed etching can be increased by increasing plasma density, etching rate can be improved. However, a dissociate state of etching gas in such a plasma at a low pressure and with a high density acts, in most cases, disadvantageously against the selectivity, thereby preventing the selectivity from being ensured. Therefore, in order to satisfy the requirements to improve the fine pattern processibility, process rate and selectivity at the same time, it is necessary to optimize overall process conditions by controlling the dissociation state of etching gas which governs the process. It is also necessary to be able to control the plasma density and the dissociation state of the gas uniformly across the overall plasma and over the whole area of the wafer. This is because that if plasma density in a reactor chamber has any locally higher density region, there result in distributions in the density of ions and radicals as well as in the dissociation state of etching gas, thereby preventing the uniformity from being ensured. Further, in order to be able to cope with various etching conditions, it is necessary to set its optimum process conditions to have a wider process margin. Still further, in order to be able to construct a process in a short time, it is preferable for any main process parameters to be controlled independently as much as possible.

The above-mentioned prior arts are associated with the following problems to be solved in order to satisfy the imposed requirements described above.

The prior art parallel plate type plasma processing system can produce plasma stably without decreasing its plasma density at a low pressure of several Pa by increasing its frequency. However, by simply lowering the pressure, as high energy ions increase, the wafer will be damaged.

The above-mentioned IEM method is directed to solving this problem by controlling the plasma density and ion energy independently from each other. However, this IEM method does not have a means to control the dissociation state of etching gas directly. Therefore, the dissociation state of the gas will have to be controlled indirectly by appropriately controlling various process conditions, such as pressures in the reactor chamber, flow rate of etching gas, high frequency source power, bias power and the like. However, since these process parameters are interrelated in a very complicated manner from each other, it is not easy to construct any appropriate process therefor.

Still further, there is such a problem associated with the parallel plate type plasma processing system that the plasma density therein tends to have a distribution due to a distribution in the intensity of electrical fields. In the parallel plate type plasma processing system, it is necessary, in order to produce plasma stably, to have a wider area for a grounded portion than the plasma producing electrode in the reactor chamber. Thereby, there occurs uneven distribution in electrical fields within the reactor chamber, more specifically there occurs an intense electrical field at edge portions of the electrodes and in the peripheral portion of the wafer, thereby causing the plasma density to be distributed unevenly. In particular, when the diameter of the electrodes becomes large-sized with an increasing diameter of wafers, this problem becomes more significant, thereby it becomes more difficult to ensure the uniformity requirement.

On the other hand, with respect to the above-mentioned M-RIE method, there is a problem of drift due to the magnetic field. In order to increase the plasma density by magnetron effect, a strong magnetic field of at least 100 gauss or more is required. However, in such a strong magnetic field, there occurs a drift (E×B drift) due to interaction between the magnetic field and the electrical field formed across the electrodes, thereby causing a large uneven distribution in the plasma density. Further, since potential over the wafer is biased by the strong magnetic field, the wafer may be damaged.

As a simple method to solve these problems described above, JP-A 7-288195 discloses to rotate the magnets which produce magnetic fields. However, according to this simple method, although its plasma density appears to become uniform, the problems of drift and the damage of wafers resulting therefrom are not solved. Further, a mechanism provided for rotating the magnets mechanically will become large-sized. On the other hand, "Ultra-Clean Technology", vol.8, no.1, 1996, pp20–24 discloses provision of a gradient magnetic field. According to this method, a magnetic field parallel to a sample is formed using permanent magnets, and the distribution of its magnetic field intensity is inclined in a plane parallel to its sample specimen and in a direction vertical to the direction of magnetic field in a range of 90–180 gauss so as to provide a gradient magnetic field. It is disclosed that by provision of such gradient magnetic field, its plasma density is improved approximately to $2\times10^{10}$ cm$^{-3}$, and the plasma density is uniformly distributed in the plane of sample surface, thereby eliminating electrostatic damage of the sample. However, with an increasing demand for a greater diameter of wafers, difficulty increases in designing an optimum magnetic field which ensures a uniform plasma density over a broader region of a large-sized wafer to be achieved. Further, once the distribution of a magnetic field intensity is fixed, a condition under which plasma becomes uniform is limited to a specifically narrow range. Therefore, there is such a disadvantage that under such condition it cannot cope with various changes in process conditions that will be required since its process margin is narrow and limited. In particular, when permanent magnets are used to form magnetic field, it is difficult to modify the distribution of magnetic field once it has been set, thereby limiting optimization of any magnetic field distribution only to a specific process. Still further, it is difficult to ensure for every permanent magnets to have a fully uniform magnetic property, thereby resulting in non-uniform property therebetween. Thereby, there occurs a problem that plasma process characteristics differ from unit to unit even of the same type.

On the other hand, according to the above-mentioned MERIE method, since its magnetic field intensity is approximately from 30 to 90 gauss, the influence of drift is smaller than that in the M-RIE method. However, an adverse effect by the drift starts to appear in a magnetic field when its intensity exceeds approximately 50–60 gauss. Thereby, it becomes necessary to give gradient to the magnetic field or rotate the magnetic field, thereby involving essentially the same problem as in the M-RIE method.

By way of example, in order to control the dissociation state of etching gas and etching property, it is normally practiced to add a small amount of additive gas into the process gas. For example, when etching a hole into an oxide film, oxygen gas is added so as to improve vertical processibility and etching rate, consequently improving so-called pierceability. However, addition of oxygen gas will lower the selectivity at the same time. This problem becomes serious, in particular, in the case of self aligned contact (SAC). In SAC etching, it is required that the oxide film is etched at a higher selectivity compared to nitride film. However, addition of oxygen gas will proceed etching of the nitride film, thereby making it difficult to ensure a high selectivity therebetween. As described above, when the control of the dissociation state of etching gas is attempted by gas addition, it becomes difficult some times to attain compatibility between etching rate and selectivity which are contradictory etching characteristics. Therefore, another method which can control the dissociation state of etching gas without relying on the addition of oxygen gas or the like is needed. However, according to any of the above-mentioned methods of IEM, MERIE and M-RIE, the dissociation state of etching gas cannot be controlled independently.

As described hereinabove, in the parallel plate type plasma processing system, conventional IEM method, MERIE method, M-RIE method are finding more difficulty in forming a uniform high intensity plasma at a low pressure over the whole area of a large-sized wafer. After elaboration to optimize various process conditions such as the pressure, gas flow rate, power, gradient magnetic field and the like, even if an optimum process is constructed, its process margin will be limited to a very narrow extent, thereby unable to cope with variously changing process conditions. In addition, in the dissociation control by gas addition, compatibility between contradictory etching characteristics will become more difficult. Therefore, it is strongly felt that there is a need to develop a novel control method that can control plasma conditions and dissociation state of etching gas efficiently and stably.

In order to solve the problems associated with the prior art described above, the present invention is conceived. An object of the invention is to provide a plasma processing system and a plasma processing method therefor which can control plasma state and the dissociation state of etching gas by controlling electron resonance state in plasma using magnetic field, wherein this control is ensured to be effected throughout the plasma and over the whole area of a large-sized wafer such that while a preferable etching rate and selectivity are ensured uniformly over the large-sized wafer, the etching process rate and fine pattern processibility are satisfied at the same time.

Another object of the invention is to provide a plasma processing system and a plasma processing method therefor which is comprised of a means for forming magnetic field over the whole area of a large-sized wafer which prevents damages to the wafer resulting from electron drift and non-uniform distribution of potentials over the wafer, and without involving any difficulty associated with the prior art design of gradient magnetic fields for avoiding such damages.

Means to Solve the Problem

According to one feature of the invention, a plasma processing apparatus which has a pair of electrodes provided within a reactor chamber, and a power supply for applying a high frequency power across the pair of electrodes, and which processes a sample mounted on one of the pair of electrodes, comprises:

a means for forming a magnetic field in a direction intersecting an electrical field formed between the pair of electrodes at least over a main surface of one of the pair of electrodes;

forming an electron resonance region in a plasma sheath portion which is formed over the main surface of the one of the pair of electrodes, the electron resonance resulting from interaction between the electrical field and the magnetic field; and controlling a plasma state by controlling at discretion intensity of the magnetic field generated by the magnetic field forming means, and thereby controlling electron resonance in the electron resonance region.

According to another feature of the invention, the above-mentioned high frequency power supply applies a high frequency power the frequency of which is 20–300 MHz, and more preferably 40–150 MHz, across the pair of electrodes;

the magnetic field forming means is capable of controlling the intensity of its magnetic field at discretion with respect to frequency (f) of the high frequency power, in a range which includes at least one of electron cyclotron resonance (ECR-S) magnetic field intensity Bc which is defined by Bc (gauss)=0.357×f(MHz), and electron sheath (ESR) magnetic field intensity Bs which is defined by BS (gauss)=Bc/2 (gauss); and an electron cyclotron resonance region and an electron sheath resonance region are formed by interaction between the electrical field and the magnetic field in a plasma sheath portion which is formed over the main surface of the one of the pair of electrodes.

According to still another feature of the invention, the above-mentioned magnetic field forming means is allowed to form a magnetic field the intensity of which can be controlled freely in a range from 2 to 100 gauss; and thereby, controlling a plasma state which includes a plasma density, electron energy distribution in plasma, and dissociation state of process gas, through the control of the electron cyclotron resonance and electron sheath resonance by controlling the intensity of magnetic field.

According to still more feature of the invention, the region in which the electron resonance is formed is allowed to be formed substantially over an entire area of a main surface of an upper electrode or the bottom electrode of the pair of electrodes According to still another feature of the invention, an extent of the region over the upper electrode or the bottom electrode main surface in which the electron resonance takes place is controlled by positioning of the magnetic field forming means and by the intensity of the magnetic field.

According to the invention, using two types of electron resonance phenomena of ECR-S and ESR resulting from the interaction between the magnetic field and the electrical field in the sheath portion, and by controlling a degree of these electron resonances by the magnetic field, the plasma state which includes the density of plasma, electron energy distribution in plasma and the dissociation state of process gas are allowed to be controlled.

Further, according to the invention, since electron resonance phenomena corresponding to frequencies from 20 MHz to 300 MHz, or more preferably, from 40 MHz to 150 MHz are used, an intense magnetic field in excess of 100 gauss which causes drift of electrons is not used, thereby facilitating control of the plasma state and dissociation state of etching gas. Therefore, there are no problems of damages resulting from biased potentials over the wafer, and difficulty in the design of gradient magnetic fields in order to avoid such damages.

Still further, according to the invention, since electron resonance is utilized, there is an advantage that the plasma state can be controlled efficiently by the magnetic field. At the same time, since the property of magnetic resonance has some width for variance of the intensity of magnetic fields, excellent controllability is obtained. In addition, since the electron resonance phenomena occur in a broad region in the sheath portion in the vicinity of the surfaces of the electrodes, there is such an advantage that the plasma state can be controlled uniformly to an broad extent throughout the whole plasma and over the entire surface of the wafer without causing any local distribution.

According to the invention, by regulating respective extent of ranges where two types of electron resonance of ECR-S and ESR occur using the magnetic field, plasma distribution can be controlled.

Still further, according to the invention, since the controls of the plasma state and the dissociation state of the etching gas can be executed without resorting to the gas addition, improvements of the etching rate and the selectivity which are of the contradictory characteristics can be achieved compatibly.

According to another feature of the invention, a plasma processing system having a pair of electrodes provided in a process chamber, and a high frequency power supply for applying a high frequency electrical field across the pair of electrodes, thereby processing a sample mounted on one of the pair of electrodes in the process chamber, comprises:

a plurality of coils which are disposed oppositely external of the pair of electrodes, a center axis therebetween being approximately parallel to a main surface of one of the pair of the electrodes on which the sample is mounted;

a shield comprised of a magnetic substance which surrounds the plurality of coils and at least a part of the processing chamber; and a means for forming a magnetic field in a gap between the pair of the electrodes, a component of the magnetic field which is parallel to main surfaces of the pair of the electrodes is dominant.

According to still another feature of the invention, a plasma processing system including the above-mentioned means for forming the magnetic field comprises:

at least one pair or more of coils oppositely disposed in an upper portion of a surface on which a sample specimen is mounted and of a loading path of the sample; and a yoke of magnetic substance having a structure penetrating a portion in the coil including at least a bottom portion thereof, or a yoke of magnetic substance having a pendant structure suspending internally of the coil, wherein, a magnetic field vector is formed in the vicinity of the surface mounting the sample specimen, the parallel component of the magnetic field vector being dominant.

According to the plasma processing system of the invention, a magnetic flux from the coils can be utilized efficiently by use of the yoke and the shield, and further, a position in the magnetic fields at which its parallel component becomes dominant becomes below the center line of these coils by use of the pendant type yoke.

According to still another feature of the invention, the above-mentioned means for forming the magnetic field is characterized by rotating or reversing its magnetic field by controlling coil currents flowing through the oppositely disposed at least one pair of coils by shifting their phases, and/or providing a gradient magnetic field by changing ratios of currents flowing through the plurality of coils.

According to still more another feature of the invention, since electromagnetic coils are used to form the magnetic fields, there results in no problem associated with permanent magnets which differ in their properties from magnet to magnet, thus from unit to unit even of the same type.

Further, since the intensity of the magnetic field and its distribution can be modified in accordance with changes required in the process setting conditions, localization of plasma due to drift of electrons can be alleviated, thereby ensuring a uniform plasma processing to be attained.

According to still another feature of the invention, a plasma processing apparatus having a pair of electrodes provided in a process chamber, and a power source for applying a high frequency power across the pair of electrodes, for processing a sample mounted on one of the pair of electrodes in the process chamber, further comprises: a magnetic field forming means for forming a magnetic field which is substantially parallel to the plane of the electrodes in a space between the pair of electrodes; and a plasma dispersion prevention means having openings of a narrow rectangular slit having a different width and length.

According to still another feature of the invention, the above-mentioned plasma dispersion prevention means is disposed in the periphery of the bottom electrode, and a plurality of slit openings are formed concentrically such that the direction of the plurality of slit openings and the direction of the magnetic field formed by the magnetic field forming means intersect.

According to still another feature of the invention, the intensity of the magnetic field formed by the magnetic field forming means is 40 gauss or more.

According to the plasma processing apparatus embodying the invention, since a plasma dispersion in the process chamber can be prevented, the plasma density between the upper and the bottom electrodes can be improved. Further, it becomes possible to prevent deposition of reaction products on the surfaces other than the process chamber such as the bottom of the process chamber or the vacuum exhaust system resulting from the dispersion of plasma outside the process chamber. Thereby, the region which allows deposition is restricted to a specified area, thereby reducing the time and cost required for removal of such deposits. Further, by setting the intensity of the magnetic field at 40 gauss or more, the plasma dispersion can be prevented more effectively, thereby further enhancing the effect of the above-mentioned plasma density improvement and the effect to restrict the deposition area.

BRIEF DESCRIPTION OF THE DRAWINGS

The invention will be more particularly described with reference to the accompanying drawings, in which.

PREFERRED EMBODIMENTS OF THE INVENTION

Preferred embodiments of the invention will be described with reference to the accompanying drawings.

Figure 1:
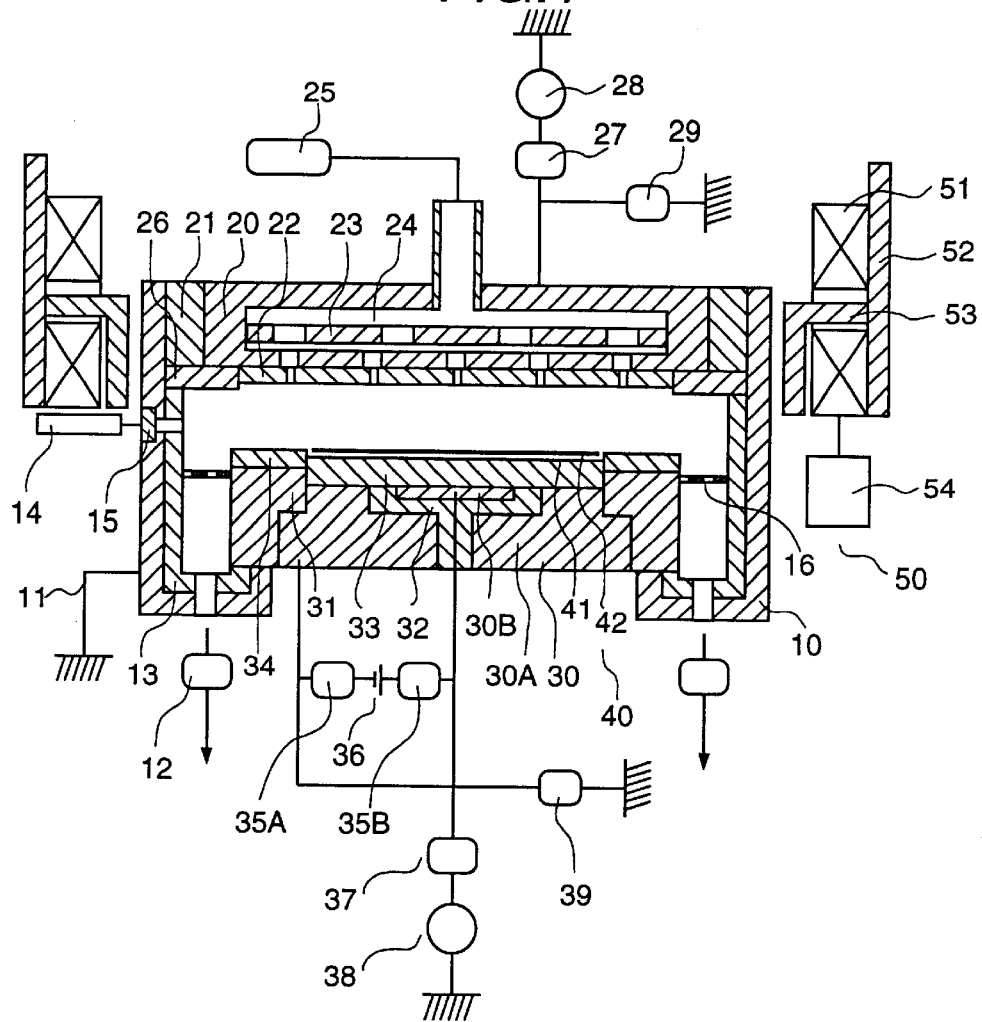
FIG. 1 is a schematic cross-sectional diagram of a plasma etching apparatus according to one embodiment of the invention.

FIG. 1 is a schematic cross-sectional view of a plasma etching apparatus embodying the invention. In FIG. 1, a process chamber 10 is a vacuum chamber which can attain a vacuum of approximately $10^{-6}$ torr. Inside process chamber 10, there are provided a pair of electrodes, i.e., upper electrode 20 and bottom electrode 30 disposed oppositely to form a pair of parallel plate type electrodes. Process chamber 10 is grounded via earth line 11. Upper electrode 20 and bottom electrode 30 are electrically insulated from process chamber 10 by upper electrode insulator 21 and bottom electrode insulator 31 made of, for example, ceramics or the like, respectively.

Upper electrode 20 is provided with upper electrode plate 22 on the bottom surface thereof, and a gas inlet space 24 having a gas disperse plate 23 inside thereof. A process gas required for etching of a sample is supplied into chamber 10 from a gas supply unit 25 through gas inlet space 24. Gas supply unit 25 which includes a gas supply source, valve, flow control (they are not shown) supplies a gas with a predetermined flow rate and a mixture ratio into gas inlet space 24. When introducing the gas into process chamber 10, it is regulated to have a predetermined gas distribution by holes provided in upper electrodes 20 and upper electrode plate 22, and by openings in gas disperse plate 23. On the other hand, process chamber 10 is evacuated by vacuum exhaust system 12. Vacuum exhaust system 12 which includes valve, pressure control unit, vacuum pump (they are not shown) regulates a process pressure inside process chamber 10 at a predetermined value. Further, an end point detector 14 is attached to process chamber 10 for detecting completion of etching process by monitoring internal state of process chamber 10 through viewport 15.

On the other hand, in the bottom portion of process chamber 10, there is provided bottom electrode 30 disposed opposite to upper electrode 20. Bottom electrode 30 mounts and holds a sample 42 on its upper surface, i.e., on sample mount surface 41. Bottom electrode 30 is a dipole electrostatic chuck which comprises a first bottom electrode 30A disposed in the bottom endmost, a second bottom electrode 30B disposed thereupon via insulator 32, and a dielectric layer for the electrostatic chuck 33 (hereinafter referred to as electrostatic chuck film) disposed over the first and the second bottom electrodes 30A and 30B. DC power 36 is connected to bottom electrodes 30A and 30B via high frequency cut-off filters 35A and 35B, respectively, and several hundred V to several kV DC voltage is applied therebetween with the side of second bottom electrode 38B being positive. Coulomb force acting between sample specimen 42 and bottom electrode 30 via electrostatic chuck film 33 firmly attracts sample 42 on bottom electrode 30. As electrostatic chuck film 33, a dielectric substance such as aluminum oxide or a mixture of aluminum oxide and titanium oxide is used.

Although the present embodiment of the invention has been described to be the dipole type electrostatic chuck, it is not limited thereto, and any type of electrostatic chuck, for example, of a mono-pole or multi-pole type chuck can be used.

A gap distance between the upper and the bottom electrodes, that is, a distance between the bottom surface of upper electrode plate 22 of upper electrode 20 and sample specimen mounting surface 41 which is the upper surface of electrostatic chuck 40 of bottom electrode 30, is set in a range between 15 mm and 100 mm, and more preferably between 20 mm and 50 mm. Bottom electrode 30 is moved vertically by elevating mechanism (which is not shown) to adjust the distance from the upper electrode 20.

Process chamber 10 is a vacuum chamber made of non-magnetic metal, for example, aluminium. Process chamber 10 can control temperatures of the internal surface thereof using a temperature control unit which is not indicated, for example, from 20 to 150° C. By such temperature control, chemical reaction and deposition of reactive products on the internal surface of process chamber 10 can be controlled.

Also, temperatures of upper electrode 20 and bottom electrode 30 are controlled by temperature control devices which are not indicated in the drawing. This is for the purpose of controlling chemical reactions to take place on the surfaces thereof which can be controlled by controlling temperatures of upper electrode plate 22 and sample 42 at a predetermined value. Further, into bottom electrode 30, inert gas such as He gas is supplied to flow between electrostatic chuck 40 and sample 42 at a predetermined flow rate and pressure in order to improve heat transfer therebetween.

Internal wall surface of process chamber 10 is covered by process chamber internal cover 13 so as to prevent exposure of internal metal portion of process chamber 10 to plasma. Further, respective surfaces of upper electrode 20, upper electrode insulator 21, and bottom electrode 30, bottom electrode insulator 81 are covered by an upper electrode cover 26 and a bottom electrode cover 34, respectively to prevent exposure thereof to plasma. These process chamber internal wall cover 13, upper electrode cover 26 and bottom electrode cover 34 are made of a material which has a high resistance to plasma. Such a material includes ceramics such as SiC and AlN, Si, quartz, aluminized or alumi spray-coated aluminium, or polyimide resin coated aluminium and the like. These covers may be provided as dividable. Further, these covers are provided easily replaceable to reduce the time and cost in maintenance. Further, temperatures of these covers are controlled by temperature controllers not indicated in the drawing. Thereby, a state of depositions of reaction products, i.e., film thickness of deposition or rate of deposition is controlled to be maintained at constant thereby preventing damages on the internal surfaces exposed to plasma. As a result, interval of exchange of these covers is prolonged thereby reducing running cost of the apparatus substantially.

Further, process chamber 10 is provided with a plasma dispersion prevention means 16 which is installed in the periphery of the bottom electrode inside the chamber. This plasma dispersion prevention means 16 has a structure to prevent dispersion of plasma while maintaining its conductance sufficiently small to vacuum exhaust. By the provision of such structure, since plasma is prevented from dispersing to the bottom portion of the process chamber 10 or into vacuum exhaust system 12, plasma density between the pair of electrodes within the chamber can be increased, thereby improving etching properties such as etching rate. Further, since its conductance to vacuum exhaust is ensured to be small enough, a low process pressure is maintained within the chamber 10. Still further, by restricting the region of the internal walls of the process chamber and the vacuum exhaust system which are in contact with plasma, since an area on which reaction products deposit can be limited, it becomes possible to prolong the cycle of exchange to replace damaged internal covers within the process chamber.

Upper electrode 20 is connected via a matching box (automatic impedance matching device) 2 to high frequency power supply 28 which supplies a high frequency power. Further, upper electrode 20 is grounded via filter 29. This filter 29 is set to have frequency characteristics to have a high impedance to the frequency of high frequency power supply 28 which is supplied to the upper electrode 20, and have a low impedance to the frequency of bias power supply 38 which is supplied to bottom electrode 30. On the other hand, the bottom electrode 30 (30A, 30B) is connected likewise via a matching box (automatic impedance matching device) 37 to bias power supply 38 which supplies bias power. Further, bottom electrode 30 is grounded via filter 39. This filter 39 is set to have frequency characteristics to have a high impedance to the frequency of bias power supply 38 of the bottom electrode 30, and to have a low impedance to the frequency of the high frequency power 28 of the upper electrode 20.

Further, the plasma etching apparatus according to this embodiment of the invention is characterized by comprising magnetic field forming means 50 which is installed in a peripheral portion of upper electrode 20. Magnetic field forming means 50 is provided with coil 51, outer shield 52, and yoke 53. Coil 51 is connected to coil power supply 54. Further, magnetic field forming means 50 is arranged to form a magnetic field which is parallel to the surfaces of the plate electrodes in a space between the upper and the bottom electrodes.

In this arrangement described above, a relationship between the frequency of powers to be supplied to the upper and the bottom electrodes, and the intensity of magnetic fields to be formed by the magnetic field forming means are set as follows. Firstly, the frequency of a high frequency power to be applied to upper electrode 20 for producing a plasma is set at 20–300 MHz, and more preferably, in a range at 40–150 MHz. Further, this frequency is advantageously selected at an integer multiple of 13.56 MHz which is industrial frequency. The frequency of bias power to be applied to the bottom electrode is preferably 300 kHz or more and less than one fourth of the frequency of the upper electrode. For example, advantageously, the frequency of the upper electrode is set at 68 MHz, and the frequency of the bottom electrode is set at 800 kHz. Secondly, the intensity of a magnetic field formed by the magnetic field forming means is in a range which is less than 100 gauss, and more preferably, in a range from 2 to 60 gauss, and which is a static magnetic field (or a low frequency magnetic field at 1 kHz or less) the intensity of which can be controlled freely.

Figure 2:
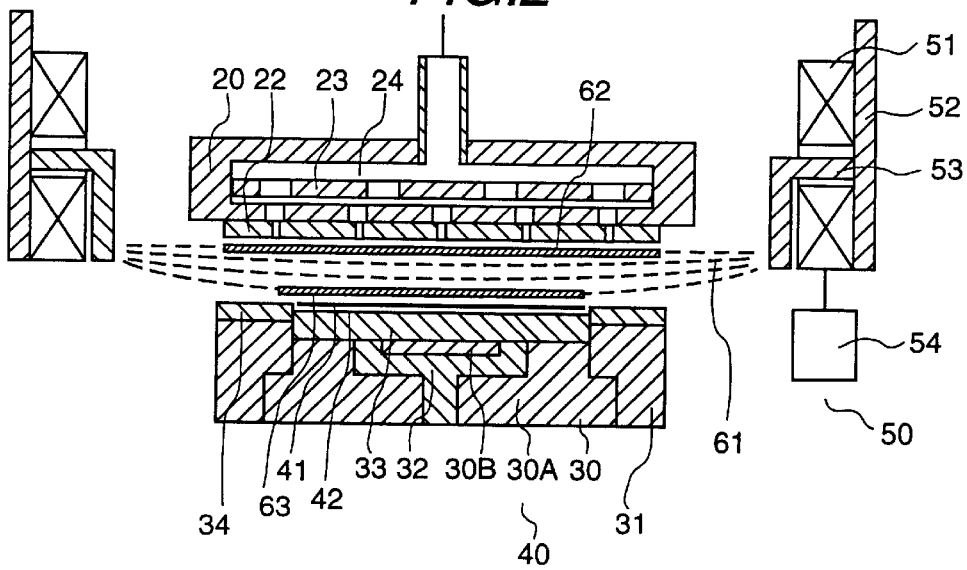
FIG. 2 is a schematic block diagram indicative of a relationship between a magnetic field formed by a magnetic field forming means and an electron resonance region in the plasma etching apparatus of FIG. 1.
Figure 3:
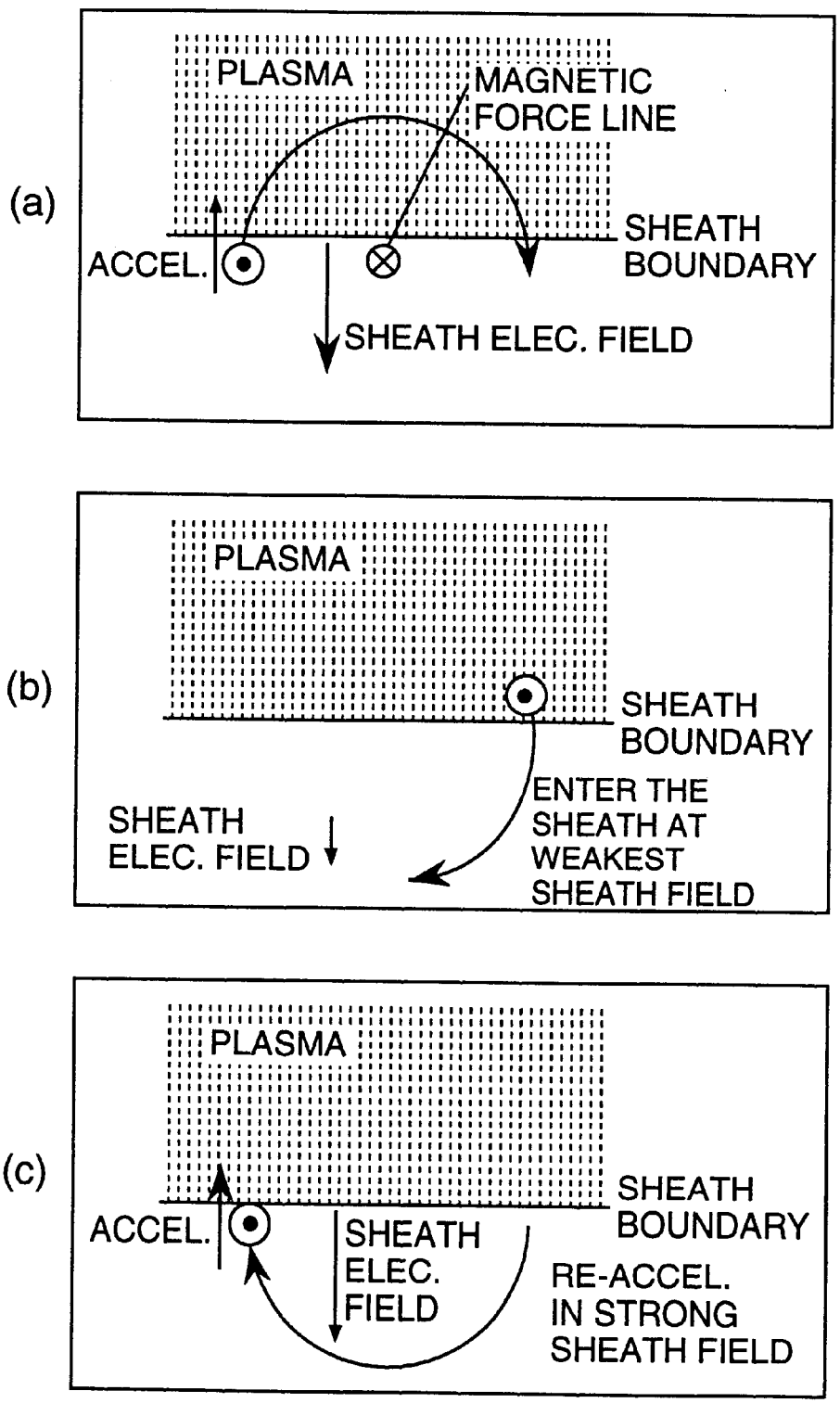
FIGS. 3(a)–(c) are drawings indicative of the principle of electron cyclotron resonance (ECR-S) in a plasma sheath.
Figure 4:
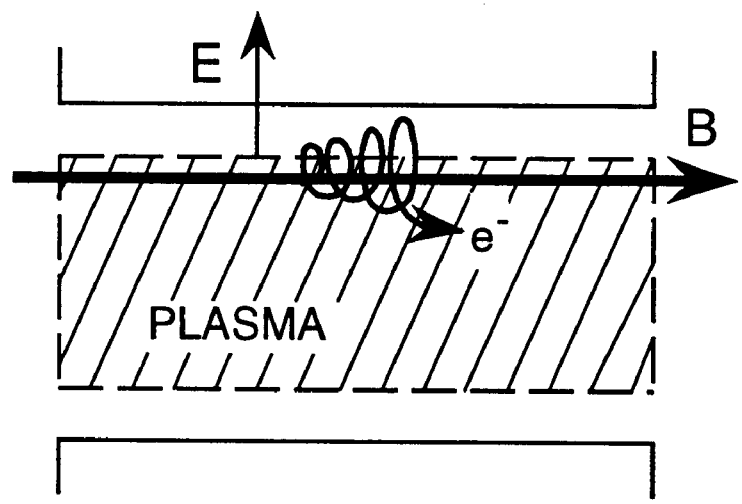
FIG. 4 is another drawing indicative of the principle of the electron cyclotron resonance in the sheath.

By provision of the system configuration of the apparatus embodying the invention described above, it becomes possible for the electron resonance phenomenon occurring in the sheath portion of plasma to be controlled using the magnetic field. FIG. 2 is a schematic block diagram which more specifically indicates a correlation between the state of magnetic fields formed and the region of electron resonance in the plasma etching apparatus of FIG. 1. In FIG. 2, a distribution of lines of magnetic force 61 produced in the gap between the upper and the bottom electrodes and in the vicinity thereof by magnetic field forming means 50 is indicated by broken lines.

As will be described more in detail later, the electron resonance phenomenon which will be used in the control of plasma becomes most significant when a parallel magnetic field which is parallel to the plane of the electrodes is formed in the plasma sheath portion. The plasma sheath is formed at a boundary of a bulk plasma over the electrode surface. Thereby, it becomes necessary to form a parallel magnetic field which is parallel to the plane of electrodes at least on one of main surfaces of the upper and the bottom electrodes which are in contact with plasma, that is, on the bottom surface of the upper electrode or on the sample mount surface of the bottom electrode. Such parallel magnetic field can be easily formed by disposing the magnetic field forming means such as to surround the peripheral portion of the gap between the upper and the bottom electrodes. However, as will be described more in detail later, arrangement of magnetic field forming means 50 in actual apparatuses is restricted in order to prevent any interference with a sample loading mechanism (which is not indicated in FIG. 1) and end point detection unit 14. Thereby, in order to avoid such interference, magnetic field forming means 50 is required to be disposed in the upper direction of the gap between the upper and the bottom electrodes, that is, in the vicinity of the peripheral portion of the upper electrode 20. Then, in this case, the region in which the parallel magnetic field parallel to the plates of the electrodes is formed is required to be below the center axis of the body of coil 51.

With reference to FIGS. 1 and 2, yoke 53 which is disposed suspending downward from coil 51 and internal thereof enables such formation of magnetic field described above. As described in FIG. 2 in which lines of magnetic force 61 which are formed using a pendant type yoke 53 are indicated by broken lines, the parallel magnetic field parallel to the electrodes is formed at a height of the yoke, that is, in the lower position than the center axis of the body of coil 51. Then, the position and extent of its parallel magnetic field formed can be regulated by the design of magnetic field forming means 50 and its positioning in a height direction. Thereby, as indicated in FIG. 2, the position of the parallel magnetic field to be formed can be adjusted to correspond to the bottom surface of the upper electrode plate 22 and to the sample mount surface of the bottom electrode 20. In this case, the region where electron resonance occurs includes a region 62 which extends almost all area of a sheath portion below upper electrode plate 22, and a region 63 which extends almost all area of a sheath portion on the sample mount surface of bottom electrode 20. Thereby, the electron resonance phenomena taking place in the plasma sheath portions can be controlled efficiently and uniformly in broad areas and extent of the electrode surfaces and the sample surface.

Now, apart from the magnetic field forming means itself which will be described in detail later, the electron resonance control and plasma state control by application of magnetic field which are the principles of the present invention will be described in detail. In the following description, FIGS. 3–6 describe the principles of the invention, and FIGS. 7–10 describe results of demonstration by simulation of these principles of the invention.

Generally, in a parallel plate type plasma processing apparatus, when a high frequency power is applied across its upper and bottom electrodes, an oscillating electrical field is produced between the electrodes which oscillates in directions perpendicular to the plane of the electrodes. From an observation of the fact that changes of potential in plasma are larger in a sheath portion of plasma, electrical fields produced in a space between the electrodes are small in a bulk portion of plasma and are large in the sheath portion thereof. That is, a strong oscillating electrical field is generated in the plasma sheath portion in the vicinity of the parallel plate electrodes. On the other hand, when a magnetic field of a strong intensity is applied in directions perpendicular to the oscillating electrical field, and the intensity of the magnetic field is most appropriate to cause electron resonance to occur, interaction between the magnetic field and the electrical field accelerates electrons by resonance, thereby ensuring electron resonance phenomenon to sustain.

By way of example, as typical electron resonance phenomena caused by magnetic field, the microwave electron cyclotron resonance (ECR) is generally known. According to this, by applying a magnetic field at 875 gauss in the direction of microwave of 2.45 GHz for generating a plasma, electrons moving along lines of magnetic force in the magnetic field are caused to absorb microwave by resonance to be accelerated. In this case of ECR resonance, "rotating electrical field" of microwave causes the electron resonance.

On the other hand, according to this embodiment of the invention, the electron resonance is caused by "oscillating electrical fields". This mechanism of occurrence will be described with reference to FIGS. 3(a)–(c). These figures illustrate behaviors of electrons in electrical fields at a boundary portion between plasma (shaded portion) and the sheath (hereinafter referred to as sheath electrical field). The sheath electrical field oscillates in directions perpendicular to the plane of the sheath boundary. On the other hand, a line of magnetic force is indicated to pierce into a depth direction of the plane of FIG. 3(a). In this case, electron is transported along the line of magnetic force, and moves along the line of magnetic force as indicated in the following. Namely, as indicated in FIG. 3(a), electron is accelerated by the sheath electrical field in a direction to be expelled from the sheath, and rotates in plasma around the line of magnetic force. In (b), when the sheath electrical field becomes weakest, electron having rotated half way around the line of magnetic force enters from bulk plasma into the sheath, and in (c), electron having rotated another half way around the line of magnetic force is caused to be expelled and accelerated by the sheath electrical field which becomes maximum again.

As described above and as indicated in FIG. 4, electron is accelerated by resonance while moving in a spiral motion around the line of magnetic force in the boundary portion between the plasma and the sheath. This phenomenon is understood to be one in which an electron in orbital motion in magnetic fields absorbs, by resonance, electromagnetic wave having the same frequency as its orbital frequency, therefore, it is a so-called electron cyclotron resonance (ECR). However, in order to distinguish it from the generally known microwave rotation field ECR, we call this as ECR-S (S stands for sheath) to indicate more clearly that it is the ECR using oscillating electrical field in the sheath. Further, resonance magnetic field intensity Bc (gauss) is generally known to be expressed as follows, $$Bc = 0.357 \times f$$

where f is a frequency (MHz) of high frequency power which generates plasma. However, this value of f is a value corresponding to the rotating electrical field, and in the case of ECR-S of the oscillating electrical field, since the orbital frequency of electron is caused to shift, its value of resonance magnetic field intensity has a slightly higher value than the above Bc. This will be indicated experimentally later. However, for the convenience of explanation, the value of resonance magnetic field intensity as defined by the foregoing equation will be used.

By way of example, when electron is accelerated by the oscillating electrical field, even in the case where its rotation speed of the electron is one half of that of ECR-S, there takes place a resonance phenomenon. A way how it takes place will be described with reference to FIGS. 5(a)–(c). In this figures, a line of magnetic force is indicated to pierce into a depth direction perpendicular to the plane of the drawing, likewise in FIG. 3. Further, although its sheath electrical field oscillates in directions perpendicular to the plane of its sheath boundary, its oscillation frequency is one half of that of FIG. 3. In this case, electron is transported along the line of magnetic force, and moves around the line of magnetic force as follows. Namely, in FIG. 5(a), electron is accelerated by sheath electrical field in a direction to be expelled from the sheath, and rotates around the line of magnetic force in bulk plasma; in (b), when the sheath electrical field becomes weakest, the electron is at a position which is one fourth way of rotation around the line of magnetic force and still in motion in plasma; then in (c), when the electron having rotated one half way around the line of magnetic force enters the sheath, it is repelled from the sheath portion by the sheath electrical field which becomes maximum thereat, thus being reflected therefrom into the bulk plasma to be accelerated by resonance.

Figure 6:
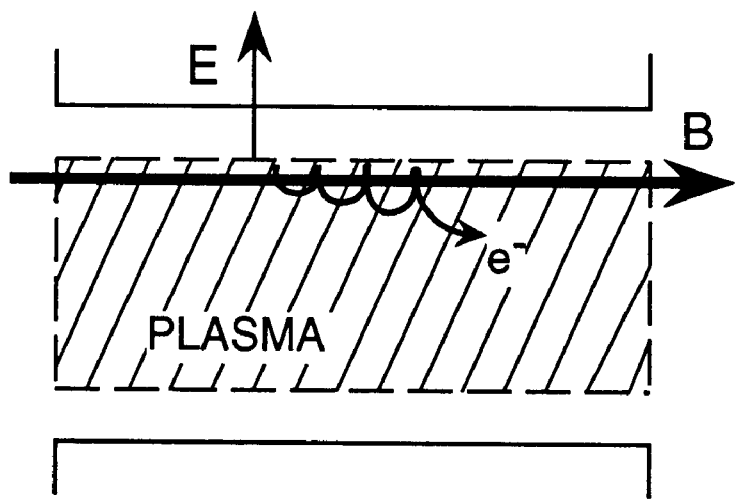
FIG. 6 is another drawing indicative of the principle of the electron sheath resonance in the sheath.
Figure 5:
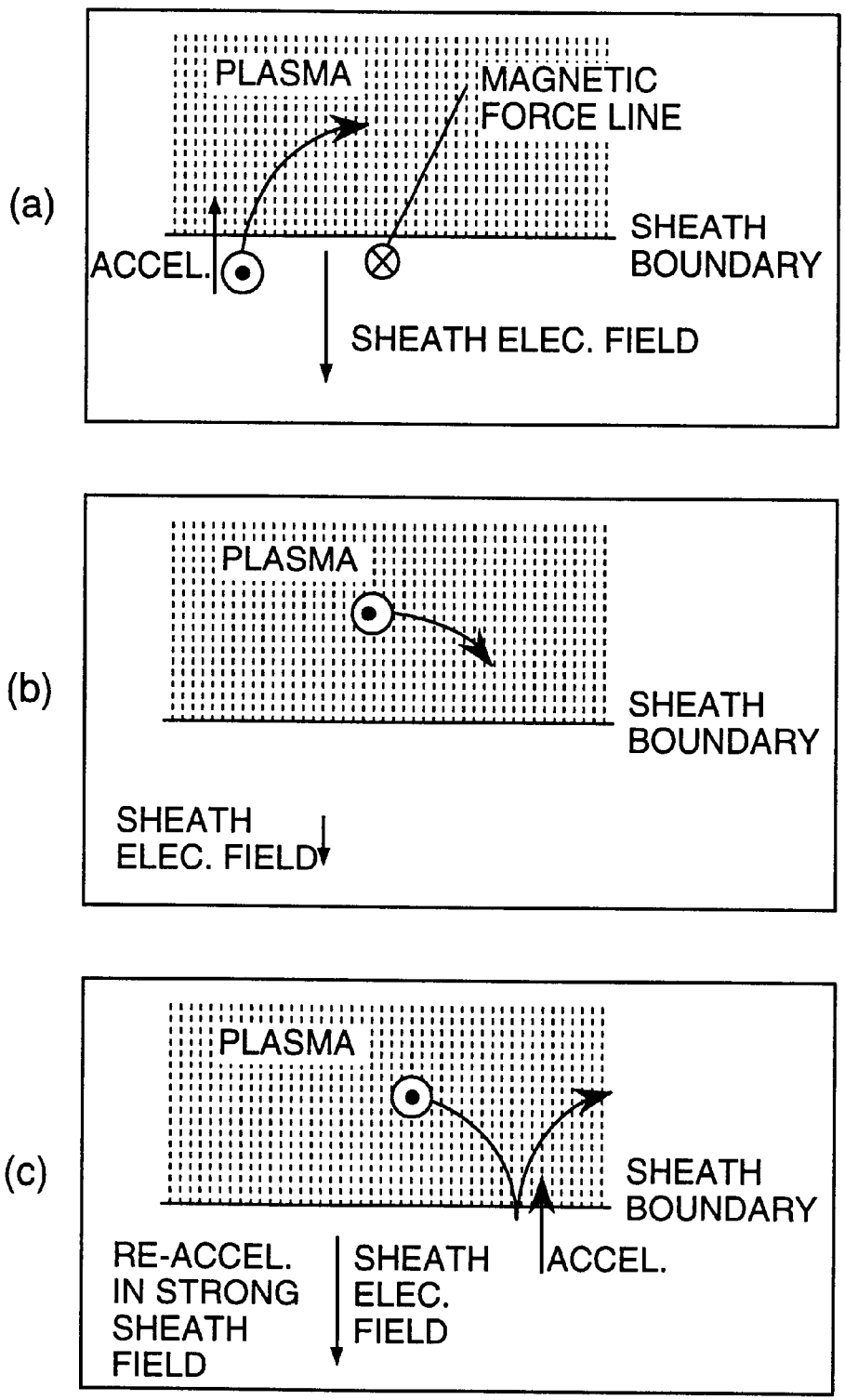
FIGS. 5(a)–(c) are drawings indicative of the principle of electron sheath resonance (ESR) in the sheath.

As a result, as indicated in FIG. 6, electron is accelerated by resonance by moving in a cycloid motion in the boundary portion between plasma and the sheath. This phenomenon and a basic demonstration of its principles using a coaxial cylinder chamber is reported by Okuno et al., in Applied Physics Letters 64(13), pp1623–1625. This phenomenon will be referred to as electron sheath resonance (ESR) according to the description in this report hereinafter. Further, since the speed of rotation of electron (i.e., frequency) in ESR is one half of that of ECR-S, the intensity of resonance magnetic field Bs (gauss) of ESR becomes one half of the intensity of magnetic field Bc of ECR, that is, $$Bs=Bc/2=(\tfrac{1}{2})\times 0.357\times f$$

where f is a frequency of a high frequency power (MHz) for producing plasma.

Therefore, in the parallel plate type plasma processing apparatus, by applying a magnetic field which is most appropriate to cause electron resonance to occur, in a direction parallel to the plane of the upper and the bottom electrodes (i.e., in the direction perpendicular to the the oscillating electrical field which occurs in the plasma sheath portion), electrons are caused to accelerate by resonance. Then, corresponding to the intensities of magnetic fields Bc and Bs, electron resonance phenomena of ECR-S and ESR take place, respectively. Then, by changing the intensity of magnetic field, the magnitude of its electron resonance becomes controllable, thereby enabling the state of electrons in plasma, i.e., electron density and distribution of electron energy, to be controlled. Further, since the dissociation of process gas changes in accordance with electron state in plasma, the dissociation state of process gas can be controlled by changing the intensity of magnetic field. Thereby, by controlling the electron resonance phenomenon in plasma using magnetic fields, it becomes possible to control the electron state in plasma and the dissociation state of process gas.

In a capacitively coupled plasma in the parallel plate type, electrons are accelerated in the sheath portion and are stochastically heated to have energy in plasma to be delivered thereto. Here, in the above-mentioned ECR-S and ESR, electrons are accelerated by resonance in the sheath portion. Therefore, acceleration of electrons in the sheath portion, namely, stochastic heating, is carried out efficiently, thereby enabling for its electron state to be effectively controlled (i.e., more sensitively to the intensity of magnetic field).

Heretofore, the principles of the invention to control the plasma properties and the dissociation state of process gas through control of the electron resonance by applying magnetic fields in the direction parallel to the plane of the electrodes have been described in the apparatus embodying the invention. Now, the result of demonstration of the principles by simulation using Ar gas will be described. An example using high frequency power supply 28 of 68 MHz will be described in the following. In this case, ECR-S magnetic field intensity is 24 gauss, and ESR magnetic field intensity is 12 gauss which is a half of that of ECR-S. At such magnetic field intensities, almost no electron drift occurs. Further, as to a preferable range of frequencies of high frequency power supply 28 for upper electrode 20, and its relationship with the intensities of magnetic fields will be described in detail later.

Figure 7:
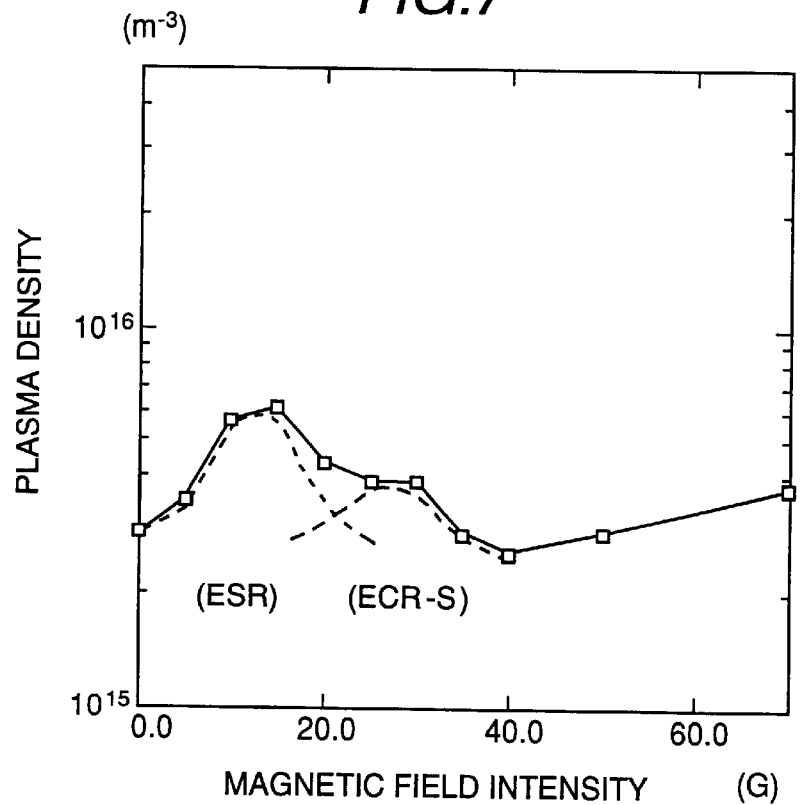
FIG. 7 shows a result of simulation of the effect of magnetic field intensity on the changes in plasma density.

With reference to FIG. 7, a mode of changes of plasma densities in the gap between the electrodes relative to changes of magnetic fields applied parallel to the plane of the electrodes is indicated. In this instance, the gap between the electrodes is 20 mm, and a pressure is 0.7 Pa. As clearly indicated in FIG. 7, plasma density increases with an increasing intensity of magnetic field until it reaches a maximum value at 15 gauss, then it keeps decreasing although it has a shoulder portion approximately at 30 gauss until it reaches a minimum value at 40 gauss, then it turns to increase again. This behavior can be understood to be obtained by superimposing two different curves having a different peak as depicted by broken lines. These two peaks correspond to a peak at 12 gauss of intensity for ESR, and another peak at 24 gauss of intensity for ECR-S, respectively. This can be understood that with an increase of the intensity of magnetic field, the effects of ECR-S and ESR are demonstrated to act complementarily thereby causing the plasma density to change accordingly. Thereby, by controlling the intensity of magnetic field in a range including the magnetic field intensities for ESR and/or ECR, the plasma density can be controlled appropriately.

Further, as indicated in FIG. 7, a change of the plasma density corresponding to the curve of intensities of magnetic fields including ECR-S and ESR has a slope which is gradual without sharp peaks. This indicates that the electron resonance due to ECR-S and ESR occurs advantageously, not limited to a narrow range only in the vicinity of each resonance magnetic field intensity, but in a broad extent of width of the intensity of magnetic field. Such a resonance property having the broad width is easier to control compared to a sharp resonance property. That is, this ECR-S and ESR has an excellent advantage of easier controllability. Further, since its resonance has a broader extent of width with respect to the intensity of magnetic field, it is not always necessary to form a completely uniform magnetic field over a wide range of the whole area of the electrode plates, provided that some appropriate distribution of magnetic fields is ensured, in order to prevent localization of the electron resonance. Since the electron resonance is ensured to occur uniformly in a broad range, any local distribution of plasma density is avoided, thereby preventing adverse effect on the uniformity of processing.

The advantage of application of magnetic field is not limited to enabling control of the plasma density. Since a degree of electron resonance, in other word, a degree of acceleration of electrons, can be controlled through controlling the intensity of magnetic field, it becomes possible to control the electron energy distribution in plasma.

Figure 8:
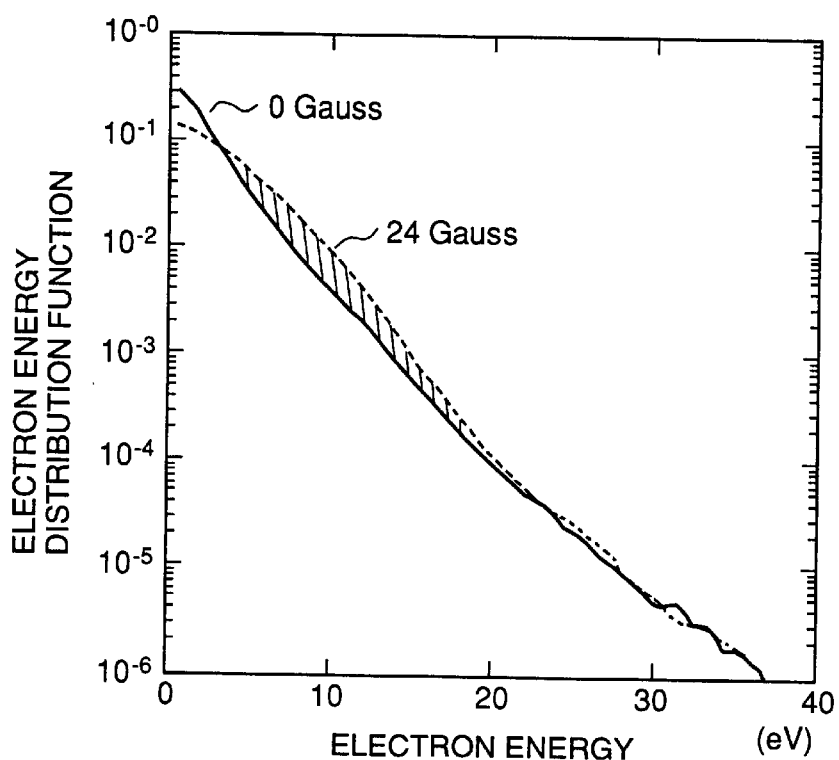
FIG. 8 shows a result of simulation of the effect of the magnetic field on the changes in electron energy distributions in plasma.

FIG. 8 plots calculated results of changes in electron energy distributions in plasma due to magnetic fields applied. Calculations were made in the same condition as in FIG. 7. A solid line depicts electron energy distributions without application of magnetic field, and a broken line depicts electron energy distribution under application of magnetic field of 24 gauss which corresponds to the intensity of ECR-S magnetic field. As clearly indicated in FIG. 8, application of magnetic field of 24 gauss causes electrons having a low energy lower than 5 eV to decrease, and causes electrons having energy from 5 to 20 eV to increase as indicated by slant lines. Therefore, it can be understood from this result that, by application of magnetic field, electron energy distributions in plasma can be changed. Although it is not described here, the present inventors have confirmed by simulation that this change in the electron energy distributions occurs continuously in response to the intensity of magnetic field. Thereby, by controlling the intensity of magnetic field, it becomes possible to continuously control the state of plasma, that is, the electron energy distribution in plasma. Further, in FIG. 7, it is indicated that the change in the electron energy distributions due to application of magnetic field becomes significant in a range of 5–20 eV. Electrons in this energy range contributes to dissociation of process gas. Therefore, it is expected that according to the magnetic fields at intensities of ECR-S and ESR, the state of dissociation of process gas can be controlled.

In the next, we will discuss how the control of the plasma state by application of magnetic field will influence the dissociation of the process gas and etching property to change. The dissociation of gas and the etching property are dominantly controlled by the amounts of ions and radicals produced. Therefore, through evaluation of efficiencies of production of ions and radicals, changes in the dissociation of gas and etching property can be estimated. Therefore, we calculated frequencies of ionization collisions and excitation collisions in Ar gas from the electron energy distribution and cross-sections of collisions of Ar. Here, the ionization collision refers to a process of collision of Ar gas with electrons to be ionized, and the excitation collision refers to a process of collision of Ar gas with electrons to be excited. Namely, ionization collision: $e^-+Ar \rightarrow e^-+e^-+Ar^+$ excitation collision: $e^-+Ar \rightarrow e^-+Ar^*$.

Therefore, a frequency of ionization (or excitation) collision is considered to be an index of efficiency of ionization.

Figure 9:
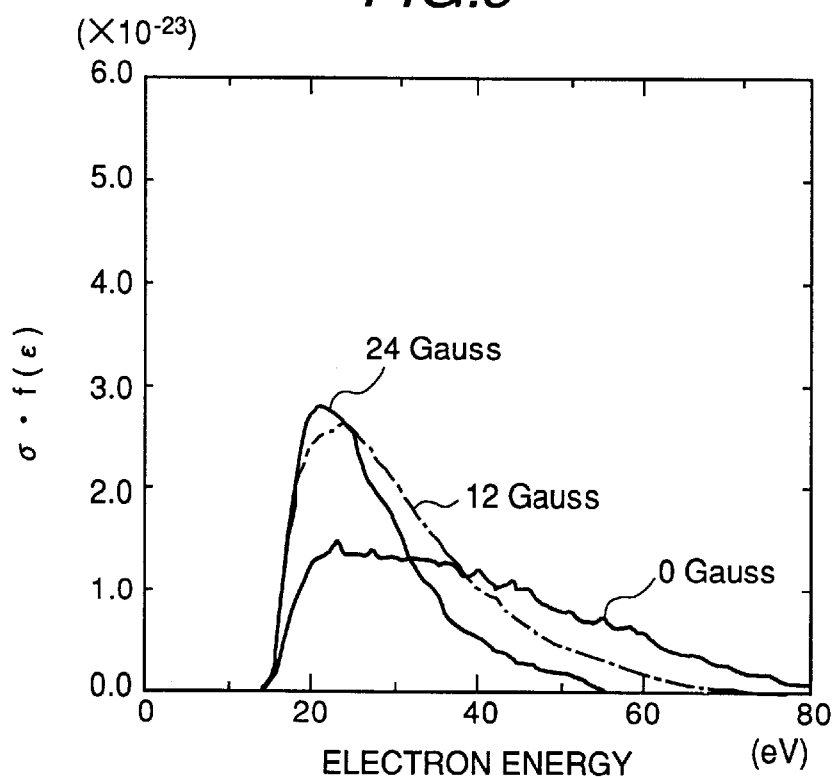
FIG. 9 shows a result of simulation of the effect of the magnetic field on the frequency of ionization collision of Ar.
Figure 10:
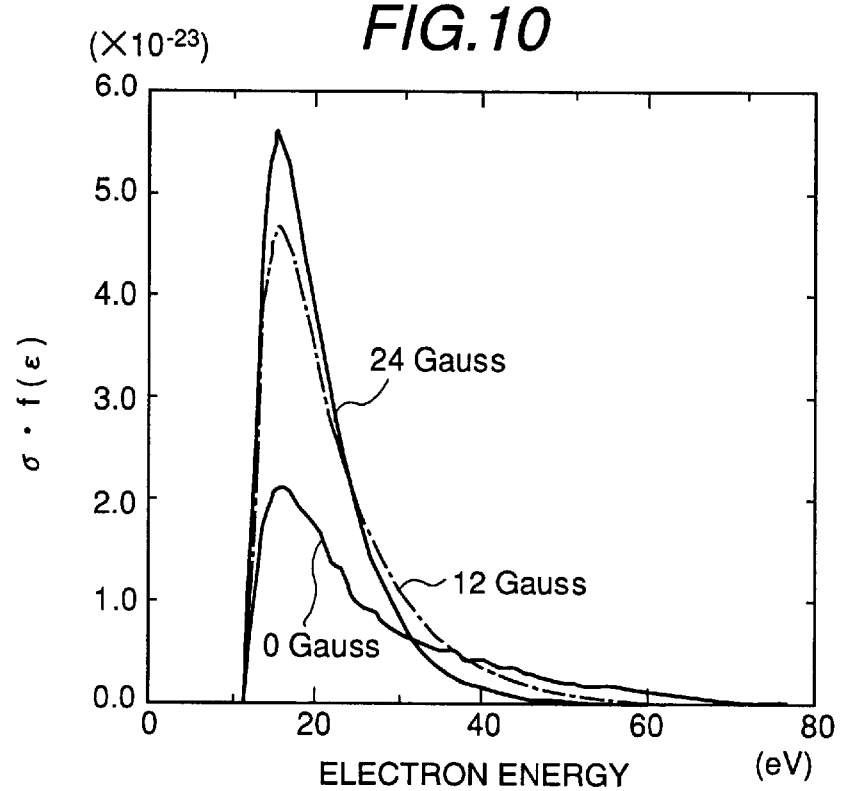
FIG. 10 shows a result of simulation of the effect of the magnetic field on the frequency of excitation collision of Ar.

FIG. 9 indicates a dependency of the frequency of ionization collisions of Ar on electron energy when magnetic field is changed. Also, FIG. 10 indicates a dependency of the frequency of excitation collision of Ar on the electron energy when magnetic field is changed. In these figures, solid lines depict frequencies of ionization collisions (FIG. 9) or excitation collisions (FIG. 10) under application of no magnetic field, dots and lines depict frequencies thereof under application of ESR magnetic field intensity (12 gauss), and broken lines depict frequencies thereof under application of ECR-S magnetic field intensity (24 gauss). As indicated in FIG. 9, peaks of frequencies of ionization collisions are caused to shift to the side of lower electron energies by application of magnetic fields. An overall efficiency of each ion production can be obtained by integrating each curve for comparison. It can be clearly understood that ionization efficiency of ESR increases remarkably compared to that of a case without application of magnetic field. Further, as clearly indicated in FIG. 10, frequencies of excitation collisions by ECR-S and ESR increased almost twice that of the case without application of magnetic field. As a result, a production quantity of ions and radicals is known to be controlled by magnetic fields. Namely, the dissociation state of process gas is known to be controlled by magnetic fields. Further, by causing the intensity of magnetic fields to change in a range which includes non-magnetic field, ESR magnetic intensity field, and ECR-S magnetic intensity field, a ratio of ionization efficiency and excitation efficiency can be varied. This suggests that the plasma state can be controlled by magnetic field to allow the ratio of ions and radicals in plasma to be controlled.

As described above, the main feature of the invention resides in utilizing two types of electron resonance phenomena of ECR-S and ESR which are caused to occur in the sheath portion due to the interaction between the magnetic field and the electrical field therein. Then, by controlling the degree of these electron resonance phenomena by the magnetic field, the state of plasma, i.e., the density of plasma, electron energy distribution and the dissociation state of process gas, becomes controllable. In addition, since the magnetic field used here is only several tens gauss or so at most, no electron drift occurs to cause any plasma drift. Further, there is another advantage that since the electron resonance is utilized, the plasma state can be controlled by the magnetic field very efficiently. At the same time, since the electron resonance property has some degree of margin with respect to the intensities of the magnetic fields, an excellent controllability is ensured as still another advantage. Still further, since the electron resonance phenomena take place in an entire region of the sheath portion, the plasma state can be controlled uniformly in a wide range across the entire plasma and over the entire surface of a wafer without causing any localization in the the plasma distribution as still another advantage of the invention.

We will now discuss a difference between the plasma etching apparatus and the magnetron type M-RIE according to the embodiment of the invention described above.

According to M-RIE as already described, electron moves in cyclotron motion entwining around the line of magnetic force thereby increasing a probability of collision of electrons, and thereby enabling a high density plasma to be produced even at a low pressure. However, since M-RIE constrains electrons by a high intensity magnetic field, and is not designed to utilize the electron resonance phenomenon, an efficient acceleration of electrons cannot be achieved. A high intensity magnetic field of at least 100 gauss is required in order to constrain electrons. However, this high intensity will result in damages of the wafer due to the drift of plasma density and bias of potentials over the wafer. Thereby, requiring to rotate the magnetic fields or provide gradient magnetic fields. In addition, an adequate countermeasure to prevent leakage of the magnetic fields is required.

On the other hand, according to the plasma etching apparatus of the embodiment of the invention described above, two types of electron resonance phenomena including ECR-S and ESR are utilized, thereby enabling electrons to be accelerated very efficiently. Further, the plasma state such as plasma density and the like becomes controllable as well by magnetic field intensities. The intensity of magnetic fields required for this purpose may be 60 gauss or less at which the influence of the drift starts to appear. Therefore, since there do not occur non-uniformity in the plasma density or biased potentials over the wafer due to the drift of electrons, the intensity of magmatic field may be maintained uniform. Further, since the intensity of magnetic field is small, a size of coils for producing magnetic fields becomes compact, and a countermeasure against leakage of magnetic field becomes easy. The plasma etching apparatus according to the embodiment of the invention as described above differs from the M-RIE method in that the electron resonance phenomenon is utilized, thereby providing various advantages resulting therefrom.

By way of example, according to the electron resonance of ECR-S or ESR, collisions between electrons and molecules tend to decrease when the pressure becomes lower, and the effect of the resonance phenomenon tends to appear more significant. From the result of our simulation, the effect of the magnetic field on the increase of plasma density appears more significant at 2 Pa or lower. On the other hand, a finer pattern processing capability is more and more required with a demand for a greater integration of semiconductor devices. In a low pressure region at several Pa or less, the frequency of molecule collisions in plasma will decrease, thereby enhancing directivities of ions and radicals, and thereby improving the fine pattern process capability. Further, according to calculations by the present inventors, there is such an advantage that in a low pressure at 2 Pa or less, ion energy becomes monochromatic. Therefore, it is noted that this pressure region where the electron resonance takes place more effectively suggests a direction desirable also for the improvement of the fine pattern process capability the need of which is increasing.

Still further, with an increasing need for a larger-sized wafer, assurance of uniformity is required to be addressed as a problem to be solved. The present invention also solve this problem of uniformity control, which will be described in the following with reference to FIG. 11.

As described heretofore, the feature of the invention resides in the utilization of the electron resonance phenomenon in the sheath portion in plasma so as to control the plasma state. This electron resonance phenomenon becomes most significant when a magnetic field which is parallel to the plane of sheath is formed in the plasma sheath portion. According to another embodiment of the invention, a position of magnetic field forming means 50 which forms the magnetic field parallel to the electrode plates in the gap between the upper and the bottom electrodes is allowed to be adjusted in the direction of height such that in-plane distributions of the plasma density and the dissociation state of gas are controlled by changing the size of the electron resonance region.

Figure 11:
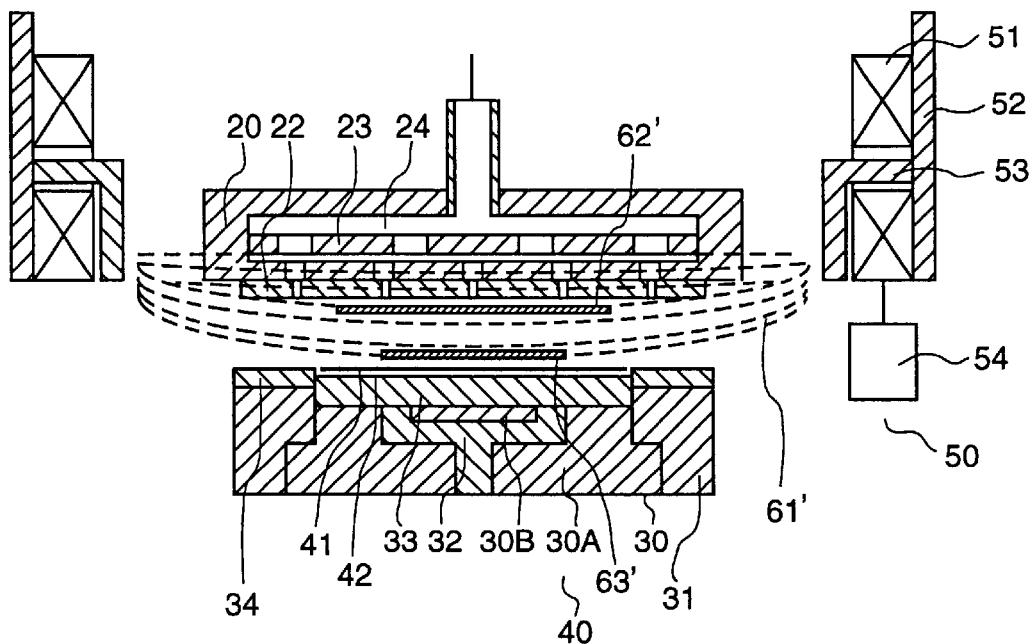
FIG. 11 is a schematic cross-sectional diagram of a plasma etching apparatus according to another embodiment of the invention, and also indicative of a relationship between the state of magnetic field formation and its electron resonance region.

Now, with reference to FIG. 11, let's assume an example of magnetic field forming means 50 which is disposed in the upper direction than that of FIG. 1. In this case, a curved magnetic field 61' slightly curved downward is formed on the bottom surface of upper electrode plate 22. Therefore, a region having a parallel magnetic field in a sheath portion of upper electrode plate 22 is limited to a central portion and in the vicinity thereof. Therefore, its electron resonance occurs mainly in a central portion 62' which is indicated by slant lines below the bottom surface of the upper electrode, and also in a central portion 63' over a sample mount surface of bottom electrode 20. By regulating the position of magnetic field forming means 50 in the direction of height as described above, the size or scale of the region of electron resonance is controlled so as to be able to regulate a degree of change in the plasma state.

Generally, the parallel plate type plasma etching apparatus is known to be excellent in uniformity. However, due to a difference in intensities of electrical field between the central portion of the electrode and the peripheral portion thereof, the plasma density tends to have a distribution across the center portion and the peripheral portion of the electrodes. Therefore, in the case where a plasma density in the central portion of the electrode is lower than a density in the peripheral portion thereof, if such magnetic fields as described are formed, electron resonance is caused to occur just in the region 62' in the central portion of the electrode and in the region 63' in the central portion over the sample mount surface of bottom electrode 20 such as to compensate this nonuniform distribution. In addition, the size or scale of the region where this electron resonance takes place can be controlled by magnetic field. Thereby, by adjustment of the position of magnetic field forming means 50 in the direction of height, and by modifying the intensity of magnetic field, not only the plasma state, but also the uniformity of plasma density can be controlled.

Now, with reference to FIGS. 12–14, an example of configurations of magnetic field forming means 50 and in-plane patterns of magnetic fields produced thereby will be described.

Figure 12:
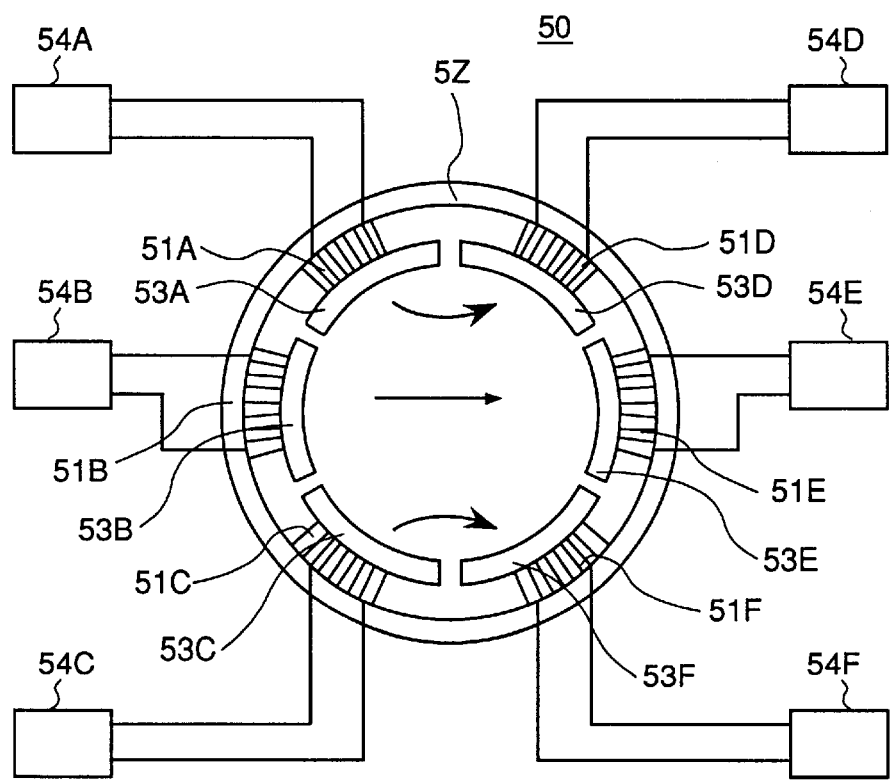
FIG. 12 is a plan view of a magnetic field forming means according to the embodiment of the invention.

FIG. 12 is a plan view of magnetic field forming means 50 to be able to more easily understand arrangements of coil 51, outer shield 52 and yoke 53. A plurality of coils 51A–51F (six coils in this embodiment) curved in a saddle are arranged concentrically and symmetrically with respect to upper electrode 20 (not shown). Then, each of these coils is connected to coil power sources 54A–54F, respectively. Further, outer shield 52 is disposed to surround the outer peripheries of these 6 coils 51A–51F. On the other hand, yoke 53 which is divided into six segments 53A–53F is disposed corresponding to these 6 coils, respectively. Then, these six coils are grouped into symmetrical pairs, for example, 51A–51D, 51B–51E, and 51C–51F, then, by generating magnetic fields in the directions from 51A to 51D, from 51B to 51E and from 51C to 51F, respectively, such magnetic fields as indicated in FIG. 12 in a direction from left to right are generated as a whole.

The saddle type curved coils are used in FIG. 12, by which a more compact size can be attained by decreasing the major diameter and increasing the minor diameter of magnetic field forming means 50. On the other hand, in place of the curved coils, a rectangular coil can be used as well. In this case, manufacture becomes easier, thereby providing magnetic field forming means 50 at a low production cost.

Further, by changing the above combination of each pair such as to 51D–51E, 51A–51F and 51B–51C, then, to 51E–51F, 51D–51C and 51A–51B sequentially and continuously, it becomes possible to rotate the magnetic field. In FIG. 12, the six coils are described to have been connected to six coil power sources respectively, however, it is not limited thereto, and these six coils may be driven using one coil power source via a drive circuit. Further, the number of coils 51 is not limited to six, but any number of coils if it is even number may be used since coils are used in pair.

Figure 14:
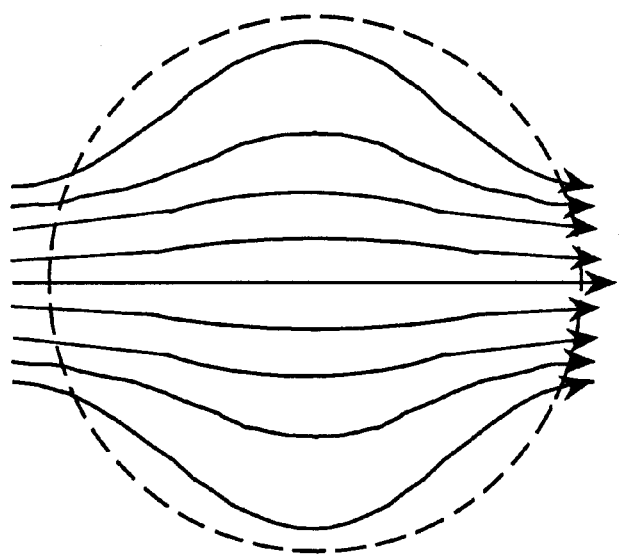
FIG. 14 is another example of magnetic field patterns which is a mirror type formed by the magnetic field forming means of the invention.
Figure 15:
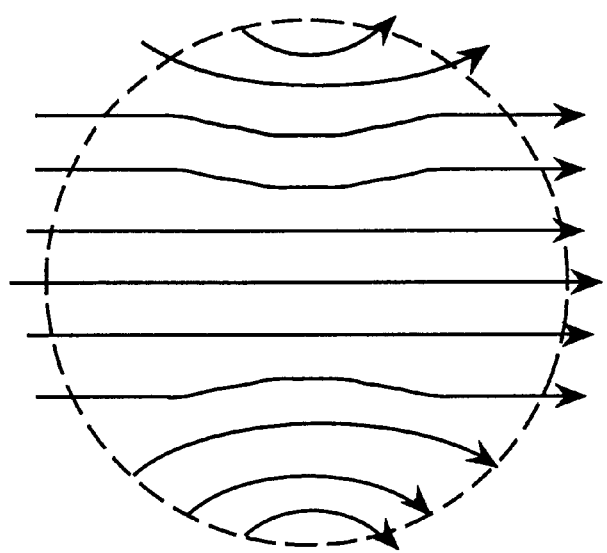
FIG. 15 is still another example of magnetic field patterns which is approximately a parallel type formed by the magnetic field forming means of the invention.

Further, by changing each ratio of currents flowing through these six coils in pair, it is possible to change the pattern of magnetic fields. FIGS. 13–15 indicate respective patterns of magnetic fields, i.e., distributions of magnetic fields, in the case of coil pair combination of 51A–51D, 51B–51E and 51C–51F, and when the ratios of respective currents I1, I2 and I3 flowing through these pairs of coils are changed. Broken lines in the figures depict a size of sample area 42. In particular, FIG. 13 is a case where I1:I2:I3=1:1:1, that is, a same current is caused to flow through each pair of coils. In this case, a divergent pattern of magnetic field is obtained. On the other hand, FIG. 14 is a case where I1:I2:I3=0:1:0, that is, zero current flows through the upper and the bottom pairs of coils (51A–51D and 51C–51F). In this case a mirror type pattern of magnetic field is obtained. FIG. 15 is a case where I1:I2:I3=1:2:1, and an intermediate pattern between those of FIGS. 13 and 14, which is substantially a parallel pattern is obtained. As will be described later, it has been confirmed by experiments that the mode of changes in the plasma state differs according to changes in these patterns of magnetic fields.

The plasma etching apparatus according to this embodiment of the invention having the configuration described above is used for etching, for example, of silicon oxide films. Such etching process will be described more specifically with reference once again to FIG. 1.

A wafer 41 which is an object to be subjected to etching process is delivered from a sample transport mechanism, which is not depicted, into process chamber 10, then, is mounted on bottom electrode 30 where it is chucked by electrostatic chuck device 40. The inside of the process chamber 10 is evacuated to vacuum by vacuum exhaust system 12. On the other hand, gases such as $C_4F_8$ and Ar required for etching of sample 42 are supplied from gas supply means 25 at a predetermined flow rate and mixture ratio, for example, Ar at a flow rate of 200 sccm and $C_4F_8$ at a flow rate of 10 sccm, to gas inlet chamber 24, then, passing through respective holes provided in gas disperse plate 23, upper electrode 20 and upper electrode plate 22, the gas having been distributed at a predetermined value is supplied into process chamber 10. At the same time, process chamber 10 is exhausted by a vacuum pump and a pressure controller (not shown) provided in vacuum exhaust system 12 such that the internal pressure of process chamber 10 is regulated at a predetermined process pressure, for example, at 0.4–4.0 Pascal. Then, high frequency power source 28 is caused to supply a high frequency power at 68 MHz, thereby producing plasma and dissociating the process gas in process chamber 10 to produce ions and radicals. At the same time, by applying a bias to the sample from bias power source 38, etching of the wafer is carried out. On the other hand, by magnetic field forming means 50, a magnetic field having a predetermined intensity is formed parallel to the plate electrode in the space between the upper and the bottom electrodes. The intensity and distribution of magnetic field in this instance are set at a predetermined value in accordance with process conditions such as pressures and flow rates, then the state of electron resonance in plasma, plasma density and its distribution, and the dissociation state of the gas are controlled appropriately. Further, during the process of etching, the magnetic field may be rotated, for example, at a speed of 5–30 rpm by magnetic field forming means 50. Still further, in accordance with the progress of etching, the intensity of magnetic field may be changed. Then, upon completion of the etching process detected by monitoring through end point detector 14, or after a predetermined period of time after completion of the etching, supplies of the high frequency power, bias power and process gas are stopped thereby completing the etching process.

Next, the results of evaluation of the effect of the magnetic field on the controllability of the plasma state and etching characteristics obtained by experiments using the plasma etching apparatus embodying the invention will be described.

Figure 16:
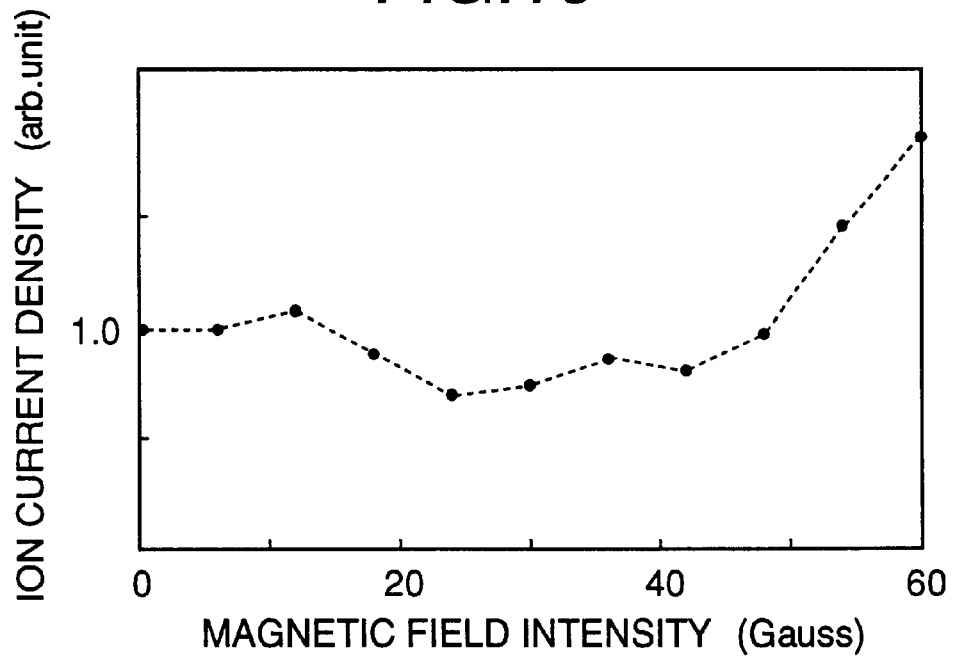
FIG. 16 is an experimental result to evaluate changes of plasma properties by magnetic fields evaluated as changes in ion current densities.
Figure 17:
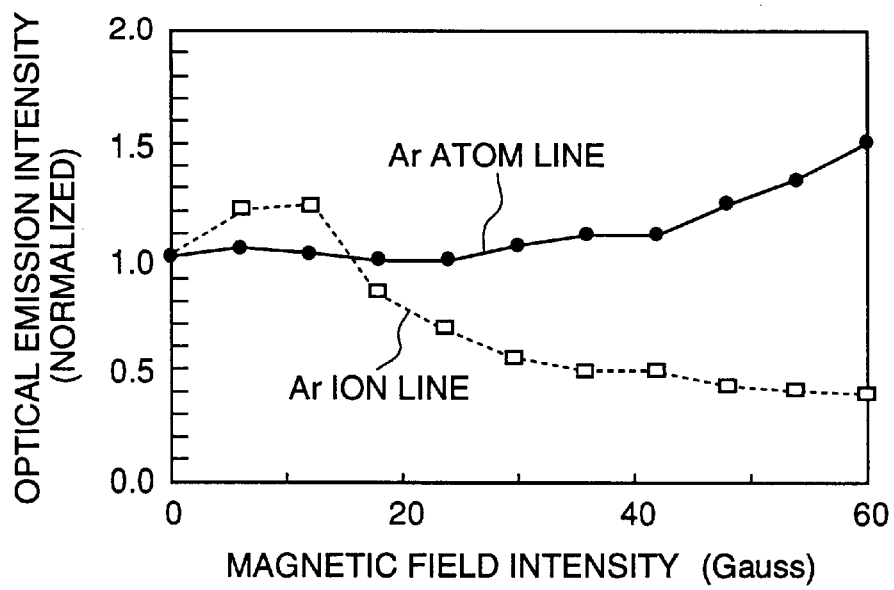
FIG. 17 is an experimental result to evaluate changes of plasma properties by magnetic fields evaluated as changes in optical emission intensities of Ar plasma.

Changes in the plasma state by the intensity of magnetic field are evaluated as changes in ion current density and plasma emission intensity, the results of evaluation of which are shown in FIGS. 16 and 17, respectively. The process gas used is a mixture gas of Ar and $C_4F_8$ with a flow ratio of $Ar/C_4F_8$=200/6 sccm. A gap distance between the upper and the bottom electrodes is 30 mm, and a process pressure is set at 1 Pa. In particular, FIG. 16 indicates changes in the ion current density versus magnetic field intensity. The ion current density, as indicated clearly, changes with an increase of the magnetic field intensity having two peaks one at 12 gauss which is the intensity of ESR magnetic field and the other in the vicinity of 30–36 gauss, then it turns to increase incrementally in excess of 40 gauss. This tendency as a whole coincides quantitatively with the result of simulation on the changes in the plasma density versus the magnetic field intensity indicated in FIG. 7. Next, changes in plasma characteristics responsive to changes in the intensity of magnetic field, as evaluated by optical emissions from Ar atom and Ar ion are indicated in FIG. 17. In FIG. 17, a solid line indicates emission of Ar atoms (wavelength: 452.2 nm), and a broken line indicates emission of Ar ions (wavelength: 461.0 nm). Excitation energy of each emission is as follows.

Ar atom line: 14.46 eV

Ar ion line: 21.14 eV.

Therefore, its Ar atom line indicates qualitatively the state of electrons having energy of 14.46 eV or more, and its Ar ion line indicates qualitatively the state of electrons having energy of 21.14 eV or more. Thereby, any changes in intensities of these emissions are considered to reflect qualitatively the changes of electron state in plasma for electrons having energy of approximately 15–20 eV or more.

As clearly indicated in FIG. 17, the emission intensity of Ar atoms increases incrementally with an increase of the intensity of magnetic field, while the emission intensity of Ar ions which increases until approximately 12 gauss of the magnetic intensity which corresponds to that of ESR, turns on the decrease to decrement gradually. From these results, it is understood that the electron energy distribution in plasma does not change uniformly with an increase in the intensity of magnetic field, but undergoes a change by resonance in magnetic fields at intensities of ESR and ECR-S. By way of example, ECR's magnetic field intensity Bc is calculated to be 24 gauss, however, as described in the foregoing chapter, this calculated value corresponds to the rotating electrical field, thereby in the case of ECR-S in the oscillating electrical field, its resonance magnetic field intensity is considered to be approximately 30–36 gauss.

Figure 18:
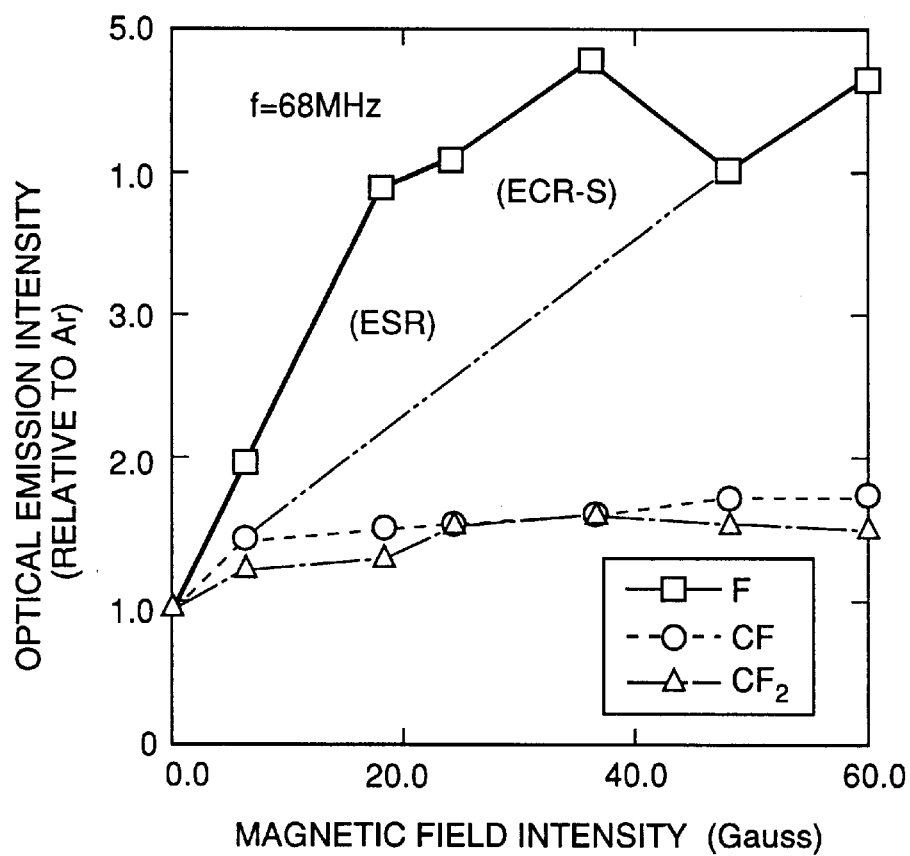
FIG. 18 is a result of measurements of changes in the dissociation state of process gas by magnetic fields, measured as changes in optical emission intensities of CF, $CF_2$, and F.

With reference to FIG. 18, the result of measurements of changes in the dissociation state of etching process gas, that is, the production state of radicals, caused by the magnetic field is indicated. Process gas is a mixture gas of Ar, $C_4F_8$ and $O_2$ with a flow ratio of $Ar/C_4F_8$=500/6 sccm. Dissociation states of these gases are measured by optical emission intensities of $CF_2$, CF and F which are radicals which contribute to etching. The gap distance between the upper and the bottom electrodes is 30 mm, and the process pressure is 1 Pa. With an increase of magnetic field intensity, an optical emission intensity of F increases and abruptly at approximately 12 gauss which is ESR's magnetic field intensity, then keeps on the increase until it exceeds approximately 40 gauss having a hill compared to any monotonous incremental curve. Such behavior, as indicated in FIG. 18, is considered to have resulted from the effects of two types of resonance of ESR and ECR-S which acted complementarily one another. On the other hand, emission intensities of $CF_2$ and CF undergo almost no change with the increase of magnetic field. Therefore, it is understood that a ratio of components of F radicals, $CF_2$ radicals and CF radicals can be controlled by the magnetic filed, that is, any monochromic control of radicals becomes possible.

Figure 19:
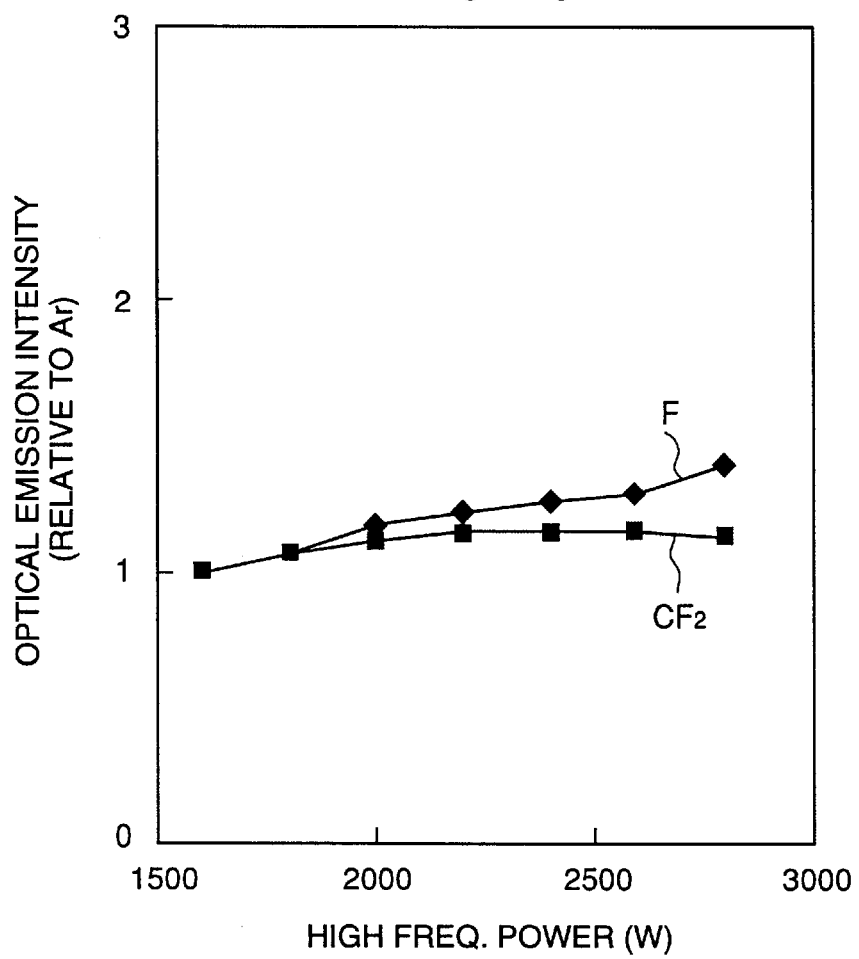
FIG. 19 is a result of measurements of changes in the dissociation state of process gas when high frequency power is changed, as measured by changes in optical emission intensities of CF and F.
Figure 20:
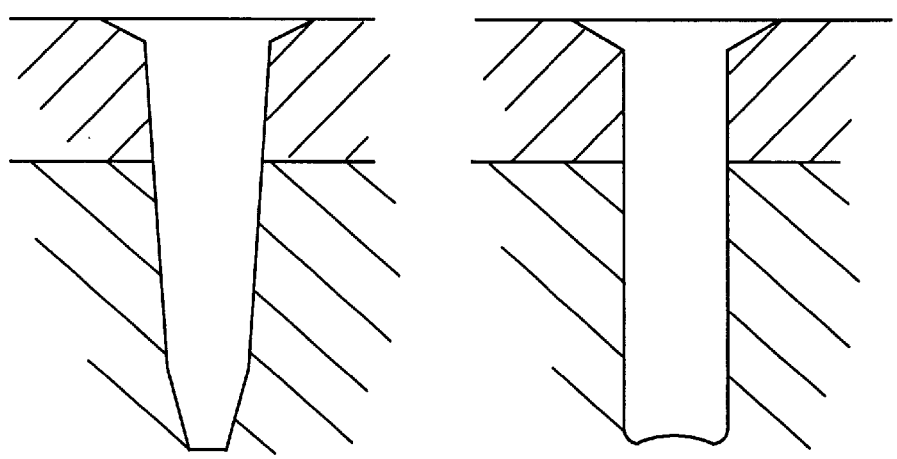
FIGS. 20(a) and (b) show etched cross-sectional view of a hole with and without improvement due to changes in etching properties by magnetic fields.

Such monochromic changes of the dissociation state cannot be obtained by conventional methods nor by changing various process parameters such as power, pressure, flow rate and the like. For example, FIG. 19 indicates changes of optical emission intensities of $CF_2$ and F when high frequency power is changed. However, the optical emission intensities of both $CF_2$ and F are shown to increase in the same monotonous manner, thereby unable to obtain the effect of monochromic control of radicals by the magnetic field.

Such changes of the ratio of radical components as described above are expected to cause the etching characteristics to change as well. The results of experiments conducted to confirm such effects are indicated in FIGS. 20–23. A sample used is a wafer having an oxide film (2.4 $\mu$m thick) and a resist film (0.7 $\mu$m thick) formed on Si, and which is etched to have a hole with a diameter of 0.28–0.40 µm. Its etching condition is the same as in FIG. 18.

FIGS. 20(a) and (b) indicate an effect of the magnetic field on the improvement in the shape of a hole having been etched. They illustrate schematic cross-sectional views of SEM photographs of holes with 0.3 µm diameter, and FIG. 20(a) is a case without application of magnetic field, and FIG. 20(b) is a case where 30 gauss magnetic field is applied (which corresponds to ECR-S). As is clear from these comparison, by application of magnetic field, a verticality along the internal wall of the hole and an opening aperture in the bottom portion of the hole are improved substantially, thereby improving pierceability and processability. This is considered to have been effected since its radical component ratio of F/CF$_2$ has increased substantially by the application of magnetic field.

Figure 21:
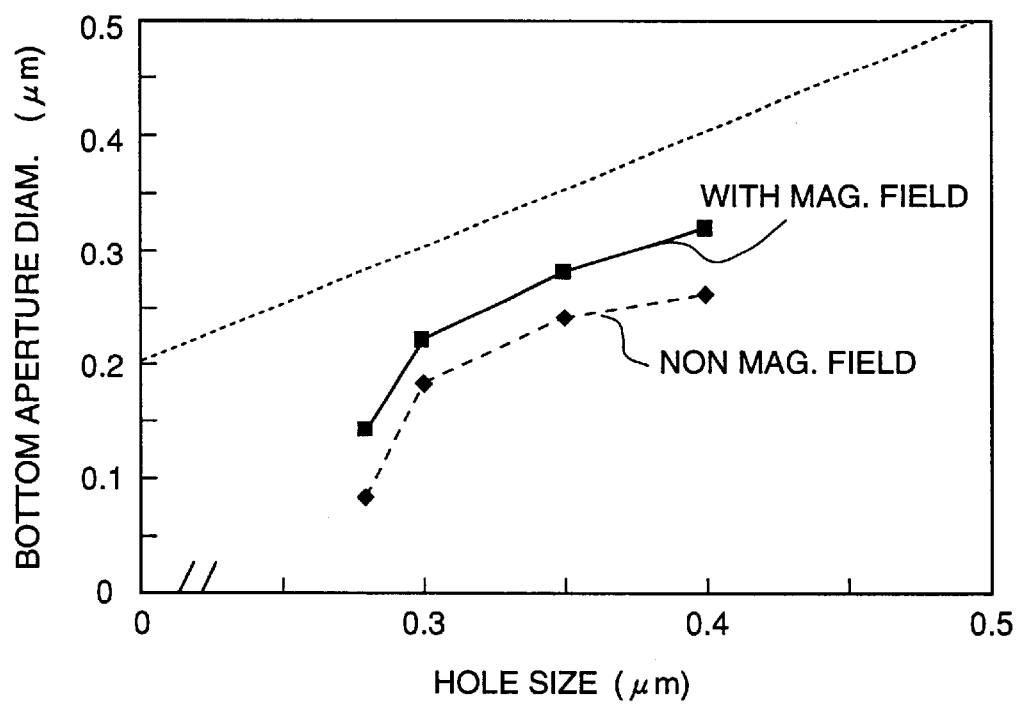
FIG. 21 is a drawing indicative of the changes in etching properties due to application of magnetic fields, as measured by improvement in the bottom aperture of etched holes.

FIG. 21 is a diagram which plots diameters in the bottom of holes for each hole size (hole diameter) of 0.28–0.40 µm with (solid line) and without (broken line) application of magnetic fields. By application of magnetic field, the bottom aperture diameter curve approaches toward a dot line which indicates coincidence between the bottom aperture diameter and the hole opening diameter, thereby indicating improvements of the hole bottom shape for all openings of 0.28–0.40 µm.

Figure 22:
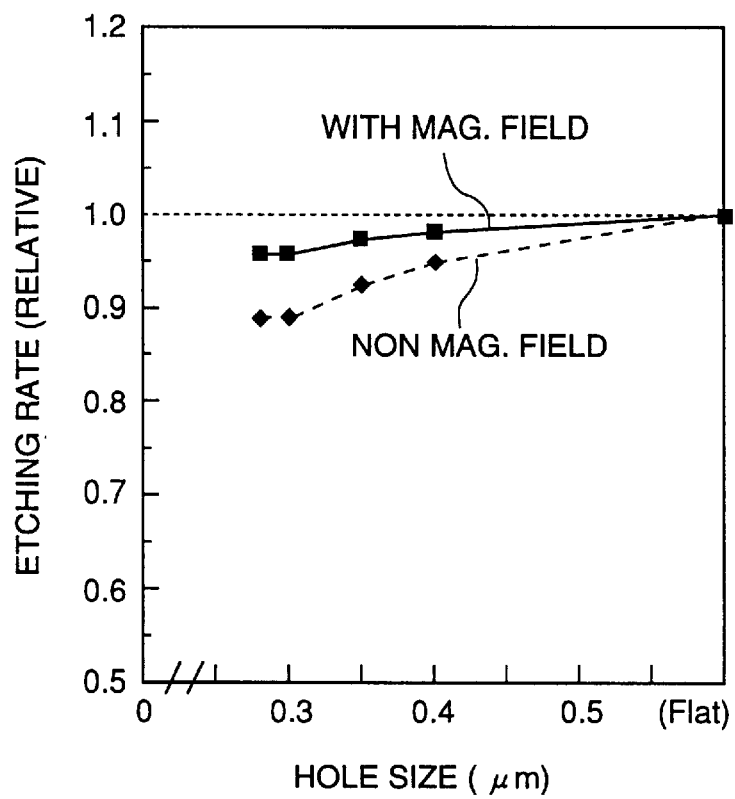
FIG. 22 is a drawing indicative of the changes in etching properties due to application of magnetic fields, as measured by improvement in micro-loading.
Figure 23:
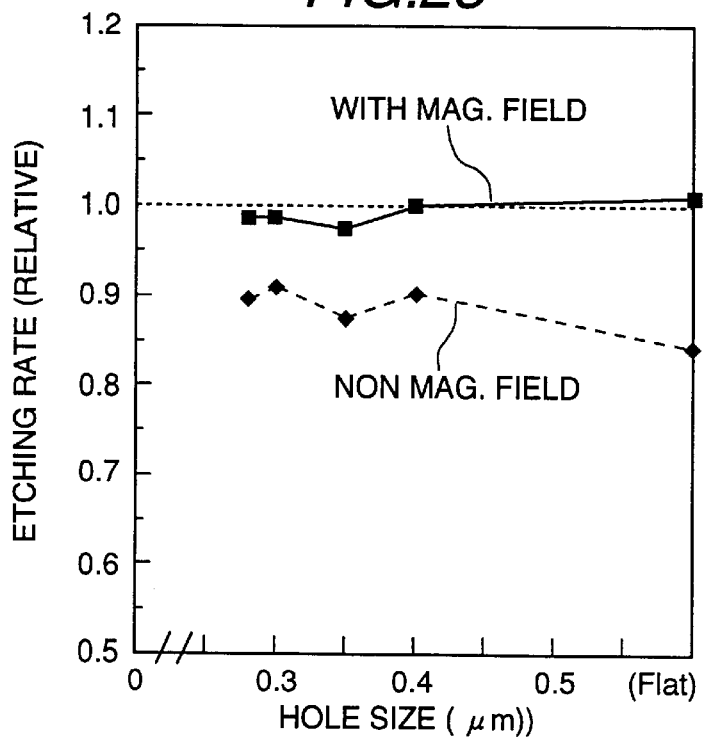
FIG. 23 is a drawing indicative of the changes in etching properties due to application of magnetic fields, as measured by improvement in uniformity of etching rate.

Further, FIG. 22 indicates an effect of the magnetic field on the improvement of micro-loading (this refers to the phenomenon that its etching rate decreases more substantially with a decreasing size of a hole). Here, etching rates in the hole are plotted as normalized values relative to the etching rate in a flat sample. Thereby, it indicates that as the curve approaches a dot line (=1.0), its micro-loading becomes smaller. It is known from this figure that micro-loading in the case (indicated by a solid line) where the magnetic field of 30 gauss which is the intensity of ECR-S magnetic field is applied, becomes smaller than in the case (indicated by broken line) where no magnetic field is applied. Namely, it is understood that the micro-loading has been suppressed by the magnetic field.

Further, with reference to FIG. 28, an effect of the magnetic field on the improvement in uniformity of etching rates will be described. A ratio of etching rates between the center portion and the peripheral portion of the sample (periphery/center ratio) is compared for both cases with (solid line at 30 gauss) and without (broken line) application of magnetic fields. For any hole sizes, a difference of etching rates between the center portion and the peripheral portion is small under application of the magnetic field, thereby proving that the uniformity of etching rates has been improved by application of the magnetic field. This is considered because that while in the case without application of magnetic field, an ion current density in the peripheral portion decreases due to an edge effect of the edge portion of the electrode, thereby decreasing the pierceability in the peripheral portion compared to that in the center portion, however, in the case with application of magnetic field, the ion current density increases over the entire portion of the surface of the wafer, thereby improving the pierceability.

Figure 13:
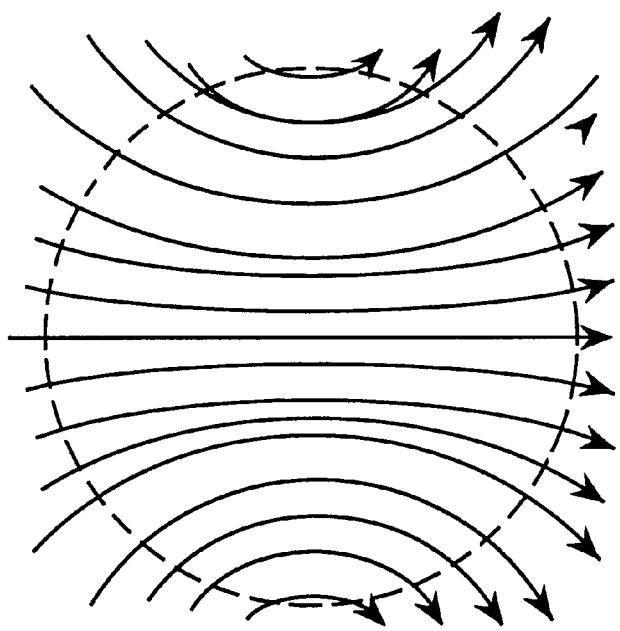
FIG. 13 is an example of magnetic field patterns which is a divergent type formed by the magnetic field forming means of the invention.

By way of example, the above-mentioned results are obtained for the divergent type magnetic pattern indicated in FIG. 13. on the other hand, with respect to the mirror type magnetic field as indicated in FIG. 15, the changes of optical emission intensities of F and CF$_2$ by magnetic fields are such that while that of CF$_2$ remains approximately constant as in the divergent type, that of F increases linearly in the same manner as indicated by broken line in FIG. 18. Therefore, by changing the magnetic field patterns, it becomes possible to control the ratio of radical components.

As described heretofore, in the plasma etching apparatus of the embodiment of the invention, by utilization of the electron resonance phenomena due to interaction between the magnetic field and the electrical field in the sheath portion, and by controlling the intensity of the magnetic field in a range less than 100 gauss, more preferably, in a range from 2 to 60 gauss which will not cause the drift of electrons as well as controlling the magnetic field patterns, it becomes possible for the dissociation state of plasma and the radical component ratio, or the plasma density and distribution to be controlled appropriately. Further, as a result of such effects of the magnetic field, improvements of uniformity in the shape of the hole having been etched, the micro-loading, and the etching rate can be achieved. Still further, since the electron resonance phenomena according to the invention can be caused to occur in a wide region of the sheath portion on the entire surface of the electrode, a uniform control of the plasma density and the dissociation state across the entire portion of plasma and over the entire surface of the wafer can be ensured without causing their local distributions.

Further, as have been described in the paragraphs of the related art, when applying the RIE method or M-RIE method to etching of oxide films, etching characteristics are changed to improve, for example, pierceability by changing the radical component ratio of the process gas through addition of an additive gas. This is because that if any process conditions such as the pressure or the gas flow rate are changed, it may deviate from the process window, thereby causing the rate or the uniformity to decrease or deteriorate. However, for example, in the case of SAC etching of oxide films, when oxygen gas is added in order to increase the pierceability, etching of a nitride film results in, thereby preventing for a high selectivity between an oxide film/nitride film from being achieved.

Here, as have been described hereinabove, the electron resonance control method by application of magnetic field according to the invention should be noted as a novel and effective method to be able to control the dissociation state of the etching gas. Therefore, for example, in the case of SAC etching of oxide films, without resorting to addition of oxygen gas, the radical component ratio can be changed so as to modify its etching characteristics, or in other word, the pierceability of etching can be improved with a high selectivity being maintained.

In the following, we will discuss a relationship between the frequency of a high frequency power applied to the upper electrode 20 and the intensity of magnetic field formed by magnetic field forming means 50. When the plasma etching apparatus according to the embodiment of the invention is taken as a parallel plate type capacitively coupled plasma equipment, it is preferable for the frequency of the high frequency power supplied to upper electrode 20 to be an integer multiple of 13.56 MHz which is industrial frequency. However, it is not limited thereto, and it may be selected from RF to VHF bands, for example, from a range of 20–300 MHz. On the other hand, as described hereinabove, magnetic field intensities Bc and Bs (gauss) of ECR-S and ESR are expressed by the following equations.

$$Bc = 0.357 \times f$$

$$Bs = Bc/2 = (½) \times 0.357 \times f,$$

where f is a frequency of plasma generating high frequency power (MHz). Respective values of Bs and Bc for some examples of frequency (f) are given in the following table.

| f (MHZ) | Bs (G) | Bc (G) |
|---|---|---|
| 13.6 | 2.4 | 4.8 |
| 20 | 3.5 | 7 |
| 27 | 5 | 10 |
| 40 | 7 | 14 |
| 68 | 12 | 24 |
| 100 | 18 | 36 |
| 150 | 27 | 54 |
| 200 | 36 | 72 |
| 300 | 54 | 108 |

As have been described hereinabove, by causing the intensity of magnetic fields to change in the range from zero intensity to ESR magnetic field intensity, then up to ECR-S magnetic field intensity, the plasma state can be controlled advantageously. However, when $f \leq 10$ MHz, ESR and ECR-S magnetic field densities become from 1 to several gauss at most, consequently, the plasma state becomes difficult to control since it is more susceptible to disturbance due to its weak magnetic field. Further, as can be understood from the principles of ESR and ECR-S, electrons move in synchronism with frequency (f). It is known, however, from the experiments and calculation that the effects of ESR and ECR-S start to appear at f=68 MHz and at approximately 1 Pa of pressure. In a condition of f=10 MHz or less, since the frequency of electrons in motion is too low, a range of pressures to allow the effects of ESR and ECR-S to appear is limited to approximately 0.1 Pa or less. Therefore, the frequency (f) of the plasma generating high frequency power is required to be approximately 20 MHz or greater. Further, if frequency (f) is set at 40 MHz or greater, a range from several gauss to 10 gauss or greater of magnetic fields becomes controllable, thereby substantially improving the controllability of the magnetic fields. Still further, a range of pressures which allows the effects of ESR and ECR-S to appear includes an extent approximately from 0.5 Pa and greater. Thereby, it is preferable for the frequency (f) of the plasma generating high frequency power to be set at 40 MHz or greater.

On the other hand, if f=300 MHz, ESR magnetic field intensity becomes 54 gauss, and ECR-S magnetic field intensity becomes 108 gauss, respectively. However, as has been described hereinabove with respect to the problems associated with the M-RIE method and MERIE method, at an intensity of magnetic fields in excess of approximately 50–60 gauss, drift (E×B drift) starts to appear, and at intensities in excess of 100 gauss, the influence of drift becomes significant such as to cause a deviation in the plasma density or bias the potential over the wafer, thereby causing a damage on the wafer. Therefore, it is preferable for the intensity of the magnetic fields generated by the magnetic field forming means to be controlled freely in a range below 100 gauss, or more preferably below 60 gauss. In this case, if frequency (f) of the plasma generating high frequency power is set at 300 MHz or less, the plasma state becomes controllable including ESR in a range at 60 gauss or less, and including both ESR and ECR-S in a range at 100 gauss or less. Still further, when frequency (f) is set at 150 MHz or less, in a range of 60 gauss or less where the influence of drift is not so significant, it becomes possible to control the plasma state using the both effects of ESR and ECR-S. Therefore, the frequency (f) of the plasma generating high frequency power supply is preferred to be set at 150 MHz or less.

Further, the effect of ESR decreases at one third or less of the ESR's magnetic field intensity. In order to control the plasma state by a degree of ESR effect in the case of 40 MHz of frequency (f), for example, the magnetic field intensity may only be controlled in a range at 2 gauss and greater considering ESR's magnetic field intensity being 7 gauss. Thereby, the magnetic field forming means required is one that generates a magnetic field at least 2 gauss or more. Of course, if coil current to flow through the magnetic field forming means is zero ampere, since no magnetic filed is formed, the magnetic field control range may include such no magnetic field region.

Figure 24:
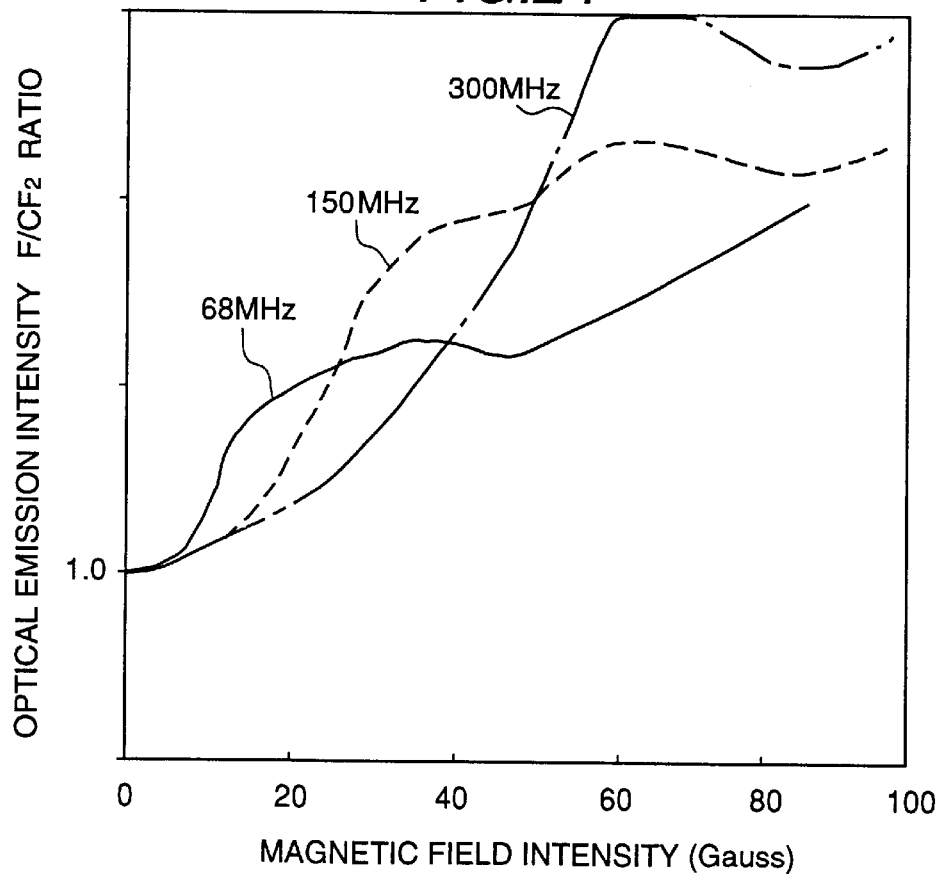
FIG. 24 is a result of measurements of changes in the dissociation state of process gas depending on magnetic field intensity, as measured by optical emission intensities of $CF_2$ and F in a mirror type magnetic field.

With reference to FIG. 24, the changes of the plasma state with respect to the magnetic fields described above and further with respect to the frequencies (f) are schematically illustrated. In this example, on the basis of changes of the dissociation state of gas observed by emission intensities of $CF_2$ and F indicated in FIG. 18, changes of ratios of these emission intensities $F/CF_2$ in a range of magnetic field intensities of 0–100 gauss are plotted for each frequency of 68 MHz, 150 MHz and 300 MHz, respectively.

For frequency of 68 MHz (solid line), its ESR magnetic field intensity is 12 gauss, and its ECR-S magnetic field intensity is 24 gauss. In this case, as indicated in FIG. 18, the curve of $F/CF_2$ rises abruptly approximately at 12 gauss with an increasing magnetic field intensity, and changes to approximately 40 gauss such as to have a hill over a monotonous incremental increase. For frequency of 150 MHz (broken line), its curve has two peaks in the vicinities of 27 gauss and 54–60 gauss corresponding to ESR and ECR-S magnetic field intensities, respectively. Further, heights of these two peaks are higher than the peak of the curve for 68 MHz. For frequency of 300 MHz (dot-line), since its ECR-S magnetic field intensity appears in excess of 100 gauss, there is shown one peak in the vicinity of 54 gauss corresponding to its ESR magnetic field intensity, which peak is still higher than the peaks for 150 MHz. As described above, with an increasing frequency, ESR's and ECR-S's magnetic field intensities increase. Further, since the dissociation proceeds by the effects of ESR and ECR-S, the ratio of $F/CF_2$ tends to take a large value.

In conclusion, the frequency (f) of the plasma generating high frequency power is preferably in a range from 20 MHz to 300 MHz, and more preferably, in a range from 40 MHz to 150 MHz. Further, the magnetic field intensity is preferred to be controlled freely in a range at 100 gauss and less, and more preferably, in a range at 60 gauss and less. The higher the frequency becomes, the greater the effects of ESR and ECR-S appear, that is, the stronger the changes appears in the plasma density and dissociation state or ionization efficiency and excitation efficiency by ESR and ECR-S. However, it is needless to mention that such effects depend greatly on a process to use. Further, the high the frequency, the greater the densities of ESR and ECR-S magnetic fields become. Still further, the plasma distribution varies in accordance not only with the space between the upper and the bottom electrode or the size of the electrodes, but also with the frequency (f). Thereby, an optimum value of the frequency of the plasma generating high frequency power is selected in consideration of the foregoing conditions as a whole.

Figure 25:
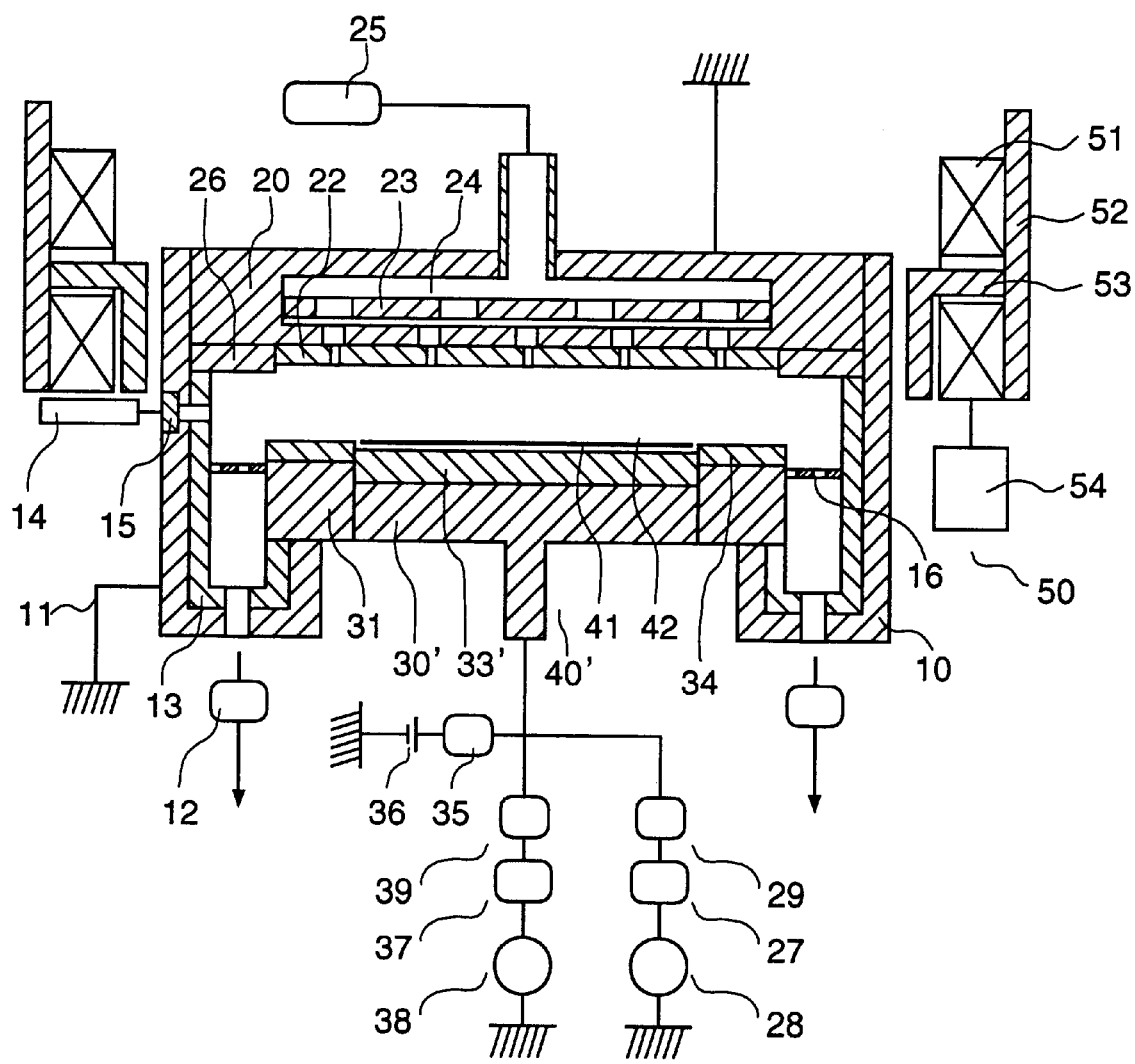
FIG. 25 is a schematic cross-sectional view of an anode coupled plasma etching apparatus according to another embodiment of the invention.

Now, with reference to FIG. 25, a plasma etching apparatus of a cathode coupling type according to another embodiment of the invention will be described. Portions in FIG. 25 corresponding to identical portions in FIG. 1 are attached the same numerals, and the description of which is omitted. The another embodiment of FIG. 25 differs from the embodiment of FIG. 1 in that as a cathode coupling type, upper electrode 20 is grounded, and a bottom electrode on which a sample 42 is mounted is allowed to produce a plasma and apply a bias simultaneously, and that it uses a mono-pole type electrostatic chuck 40'. Bottom electrode 30' is provided with a high frequency power source 28 and a bias power source 38 which are connected thereto via matching box (automatic impedance matching device) 27, 37, and filter 29, 39, respectively. Filter 29 is set to have a low impedance to the frequency of high frequency power source 28 and a high impedance to the frequency of bias power source 38. Further, filter 39 is set to have a low impedance to the frequency of bias power source 38, and a high impedance to the frequency of high frequency power source 28. Thereby, high frequency power source 28 and bias power source 38 are ensured to operate without causing interference to each other, to supply a high frequency power to generate a plasma, and at the same time to apply a bias to sample 42. Further, bottom electrode 80' is connected to a dc supply 36 which applies a dc voltage of several 100 V to several kV to the bottom electrode via a filter 35 which cuts off frequency components of high frequency power source 28 and bias power source 38. on the surface of bottom electrode 30', a dielectric layer 33' for electrostatic chucking (hereinafter referred to as electrostatic chuck film) is provided, and sample 42 is chucked and held firmly on bottom electrode 30' by coulomb force acting between sample 42 and bottom electrode 30' via electrostatic chuck film 33'.

In this embodiment of the invention, the frequency of a power supply to be applied to bottom electrode 30' is the same as one applied in the embodiment of FIG. 1. The frequency of a high frequency power supply to generate plasma is in a range from 20 MHz to 300 MHz inclusive thereof, and more preferably, in a range from 40 MHz to 150 MHz inclusive thereof, and which is advantageously selected as an integer multiple of the industrial frequency 13.56 MHz. The frequency of the bias power supply is preferably 300 kHz or greater and lower than one fourth of the frequency of the plasma generating high frequency power. For example, it may be set such that the frequency of the plasma generating high frequency power is 68 MHz and the frequency of the bias power supply is 800 kHz. Further, the magnetic field to be produced by the magnetic field forming means is preferably a static magnetic field in a range of 100 gauss or less, and more preferably, in a range from 2 to 60 gauss, and their intensities can be controlled freely therein (a low frequency magnetic field at 1 kHz or less).

According to the configuration of this embodiment of the invention, in the same manner as in the embodiment of FIG. 1, since the electron resonance phenomena occurring in the sheath portion due to interaction between the magnetic field and the electrical field can be utilized, the plasma condition can be controlled using a magnetic field with an intensity of several tens gauss at most which does not cause the drift. Further, since the electron resonance phenomena occur in a wide region of the sheath portion over the surfaces of the electrodes, such advantages of the invention are ensured to be obtained that the plasma density and the dissociation state can be controlled uniformly across the entire portion of plasma and over the whole area of the wafer without causing any local distribution. Still further, since its plasma generating high frequency power is not supplied through the upper electrode, the construction of the upper electrode becomes simple, thereby facilitating cleaning of depositions within the chamber and maintenance of the apparatus.

Figure 26:
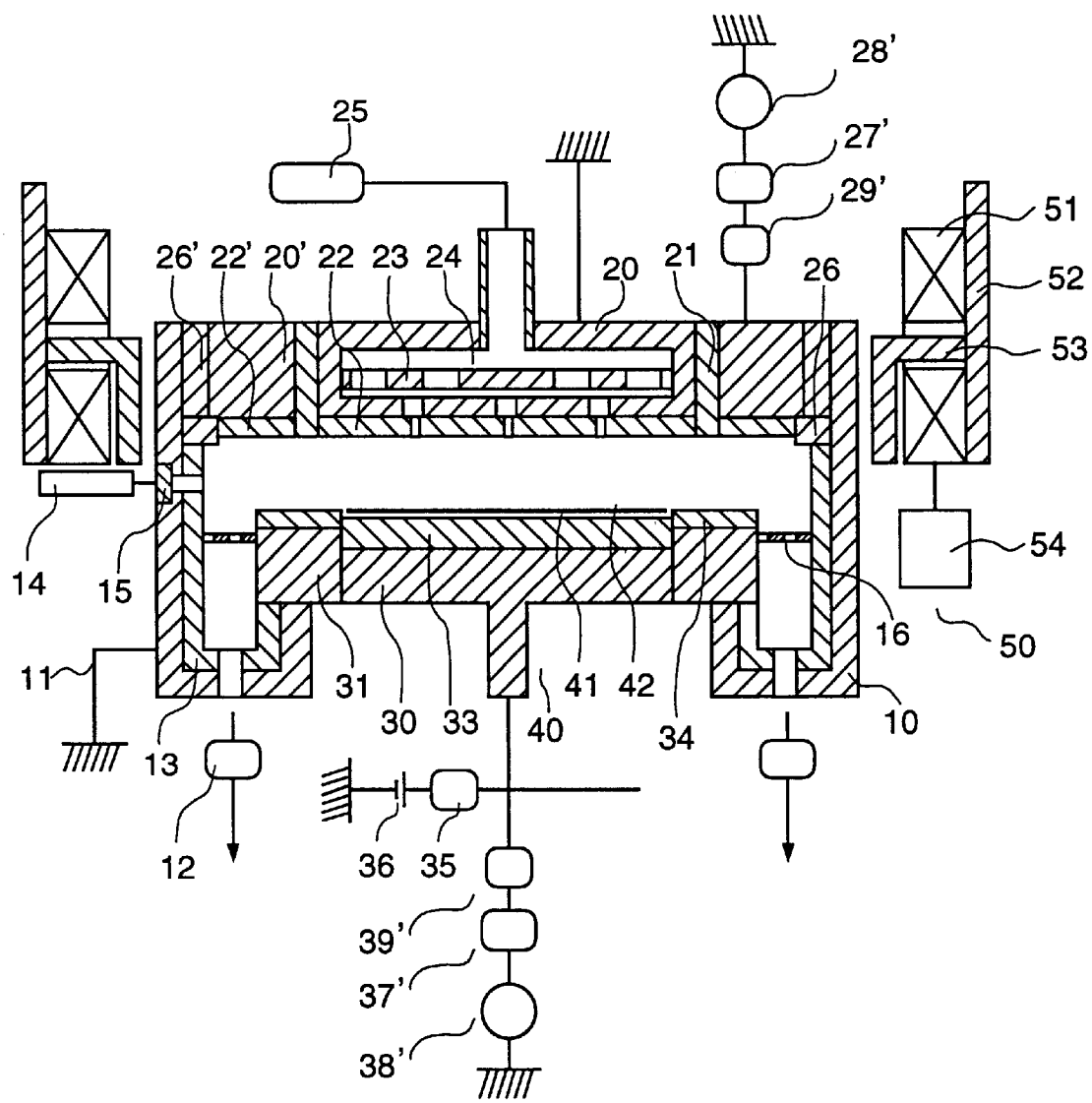
FIG. 26 is a schematic cross-sectional view of a plasma etching apparatus according to still another embodiment of the invention.

A plasma etching apparatus according to still another embodiment of the invention will be described with reference to FIG. 26. Portions in FIG. 26 corresponding to identical portions in FIG. 1 are attached with the same numerals and the description of which is omitted. The embodiment of FIG. 26 is the same cathode coupling type apparatus as that of FIG. 25, however, it differs from the embodiment of FIG. 25 in that a second upper electrode 20' is provided outside its upper electrode 20.

Bottom electrode 30' on which sample 42 is mounted carries out plasma production and bias application simultaneously using power supply 38', matching box (automatic impedance matching device) 37', and filter 39'.

On the other hand, upper electrode 20 is grounded, and second upper electrode 20' which is disposed in the peripheral portion outside the upper electrode 20 is connected to a high frequency power source 28' via matching box (automatic impedance matching device) 27', filter 29'. Respective filters 29', 39' and 35 are set to operate without causing interference with one another. Further, bottom electrode 30' operates as a mono-pole type electrostatic chuck 40'.

The frequency of a high frequency power to be applied to the second upper electrode 20' is in a range from 20 MHz to 300 MHz, and more preferably, in a range from 40 MHz to 150 MHz. On the other hand, the frequency of a power to be applied to bottom electrode 30' is 300 kHz or greater and one fourth or less of the frequency of the power applied to the second upper electrode. For example, it is set such that the frequency of the high frequency power of second upper electrode 20' is 100 MHz, and the frequency of bottom electrode 30' is 13.56 MHz. Further, the magnetic field produced by the magnetic field forming means is preferably 100 gauss or less, and more preferably 60 gauss or less in a static magnetic field (or a low frequency magnetic field less than 1 kHz), and wherein the intensity of the magnetic field can be controlled freely.

According to this embodiment of the invention, bottom electrode 30' is mainly involved in plasma production and bias application, while the second upper electrode is involved in the control of a plasma state using electron resonance phenomena resulting from interaction of the magnetic field and the electrical field in the sheath portion immediately below the second upper electrode. The feature of this embodiment of the invention resides in that by applying a different power with a different frequency to bottom electrode 30' and second upper electrode 20' as described above, respective controls of plasma production, bias application and plasma state can be done independently from one another. Further, since electron resonance phenomena occur in a wide region of the sheath portion extending below the second upper electrode, no localized distribution of plasma occurs. However, since the region where its electron resonance takes place corresponds to a peripheral portion of the wafer, it is preferable for a distance between the upper and the bottom electrodes to be set at 30 mm or greater in order to prevent occurrence of a difference in etching characteristics between the center portion and the peripheral portion of the wafer.

Foregoing respective embodiments of the invention have been described by way of example of the parallel plate type plasma etching apparatus having a pair of the upper and the bottom electrodes. However, since the feature of the invention is to use interaction between the magnetic field and the electrical field occurring in the sheath portion of the electrodes, the effects and advantages of the invention can be realized by other types of plasma processing apparatuses which produce electrical fields in its electrode sheath portion, such as one which uses field emission using microwaves or UHF band waves, or of the inductive coupling plasma processing apparatus in combination with the magnetic field forming means of the invention.

Still further, the foregoing embodiments of the invention are directed to the processing of wafers, and the etching process therefor, however, it is not limited to the wafer, and it can be applied to the processing of a sample for liquid crystal display as well. Also, its process is not limited to the etching process but it is applicable to sputtering and CVD processes.

As already described with reference to FIGS. 1 and 2, it is necessary for the magnetic field which is parallel to the plane of the electrodes to be formed in the space between the upper and the bottom electrodes without causing any mechanical interference with the sample transfer and loading mechanism. Such magnetic fields can be formed by provision of pendant yoke 53 which is arranged suspending downward relative to coil 51 as indicated in FIGS. 1 and 2. The magnetic field forming means and method therefor will be described in detail in the following.

The magnetic field forming means and the method therefor which will be described in detail in the following are not limited to the embodiments of the invention which utilize the electron resonance. That is, the magnetic field forming means to be described can be applied also to any type of plasma processing apparatus, for example, such as M-RIE and MERIE type which forms a magnetic field in a longitudinal direction relative to the parallel plate electrode.

Figure 27:
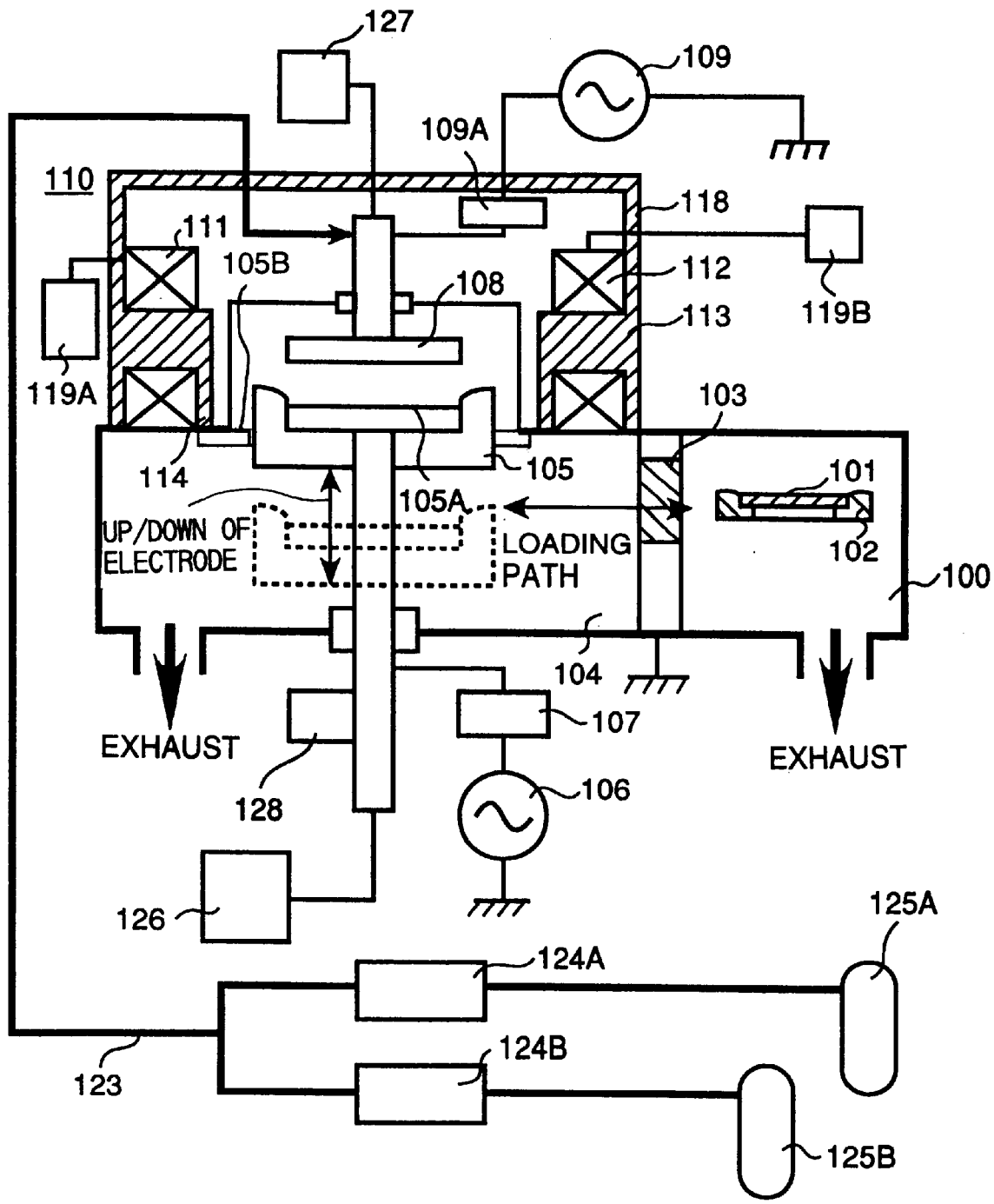
FIG. 27 is a schematic block diagram indicative of a system configuration of the plasma etching apparatus according to the first embodiment of the invention.

We will reexamine the construction of the plasma processing apparatus of the invention mainly from a view point of its magnetic field forming means. FIG. 27 indicates a system configuration of the plasma etching apparatus according to one embodiment of the invention. Here, in order to clearly indicate a relationship of layout of the magnetic field forming means relative to its electrode elevating mechanism and its sample transfer system in an actual apparatus, an overall system configuration is indicated including the electrode elevating mechanism and the sample transfer system which were omitted in the descriptions of the foregoing embodiments of the invention. As to numerals of components and parts in FIG. 27, in order to avoid complications, new numbers are attached. Although some of the following descriptions may duplicate with the foregoing embodiments, a plasma etching apparatus system according to this embodiment will be described with reference to FIG. 27.

The etching apparatus according to this embodiment of the invention is a so-called load lock type apparatus. Namely, a sample 101 introduced into a buffer chamber 100 is transferred by a sample transfer mechanism 102 and loaded into a process chamber 104 via a gate valve 103. In process chamber 104, a bottom electrode 105 having a mount surface (main surface) 105A for mounting sample 101 is provided. Further, an upper electrode 108 is disposed opposite to bottom electrode 105. An electrode elevating mechanism 128 is attached to bottom electrode 105 for moving the bottom electrode in vertical directions to adjust a gap between upper electrode 108 and bottom electrode 105 in order to optimize its process performance.

A bias supply electrode 106 is connected to bottom electrode 105. On the other hand, a plasma generating high frequency power source 109 is connected to upper electrode 108. In order to effectively supply high frequency powers from these power sources, automatic impedance matching devices 107, 109A are used to control each input and reflection power. Etching gas is introduced from gas supply sources 125 (A, B) via flow controllers 124 (A, B) and a gas line 123. Further, temperature controllers 126, 127 are used to control temperatures of bottom electrode 105 and upper electrode 108.

Further, bottom electrode 105 is provided with an earth mechanism 105B. This earth mechanism 105B has a function to allow a high frequency current which flows from high frequency power source 109 to bottom electrode 105 while generating plasma to be grounded by a shortest route, by contacting with an earth portion within the process chamber, thereby contributing to the stabilization of plasma. This earth mechanism is particularly effective when the frequency of high frequency power source 109 becomes higher than several tens MHz.

Now, in this embodiment of the invention, a magnetic field forming means 110 is provided for forming a magnetic field in a gap space between upper electrode 108 and bottom electrode 105, the component of the magnetic field which is parallel to the surface of the electrode is dominant. This magnetic field forming means 110 is comprised of a first coil 111, a second coil 112, yoke 113, a cover shield 118, and coil power sources 119 (A, B) for supplying power to both coils.

Figure 28:
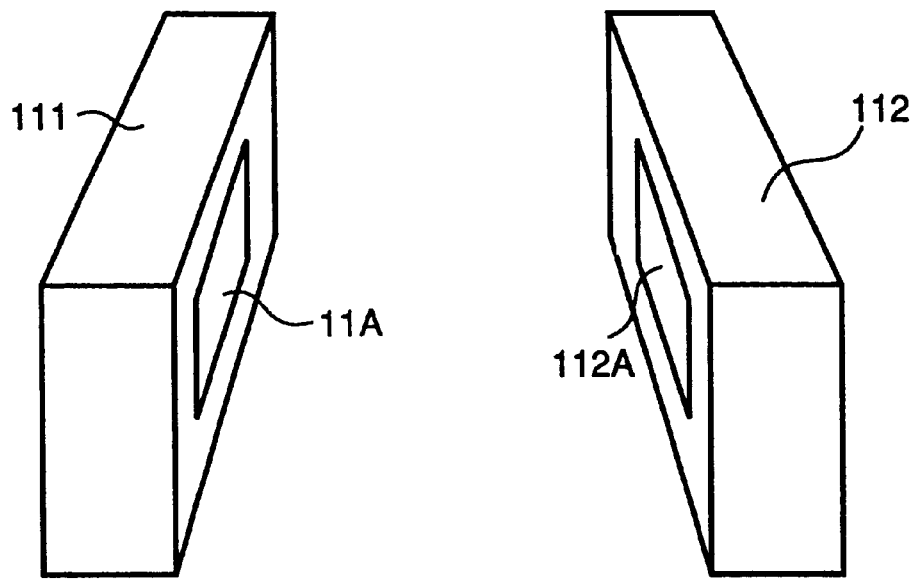
FIG. 28 is a perspective view of coils in FIG. 27.
Figure 29:
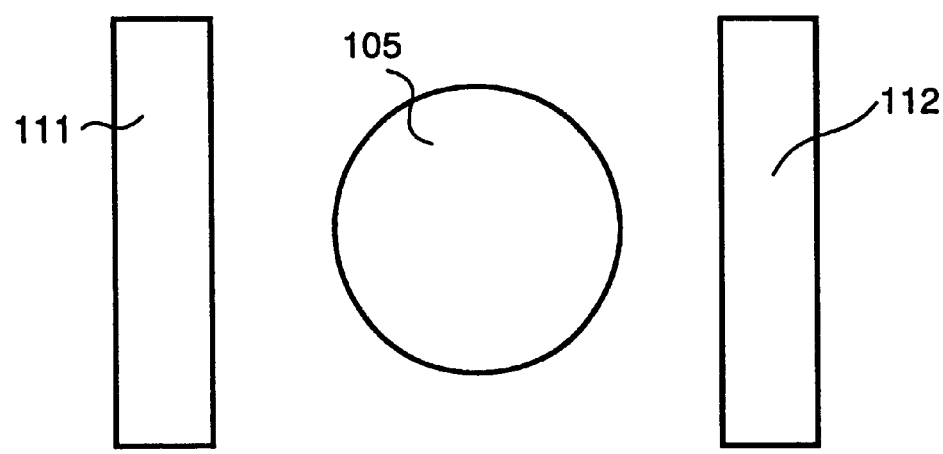
FIG. 29 is a plan view of the coils in FIG. 27.

First coil 112 and second coil 112 are rectangular type coils as indicated in a perspective view of FIG. 28, and they are arranged symmetrically at opposite positions on both sides of bottom electrode 105 as indicated in a plan view of FIG. 29. Each coil has a shape comprising a coil wire being wound around a rectangular frame. Then, respective currents flowing through oppositely disposed coils are arranged to flow in the same direction on the upper side of respective coil frames so as to be able to form a magnetic field which is directing from one coil to another coil in the same direction.

Figure 30:
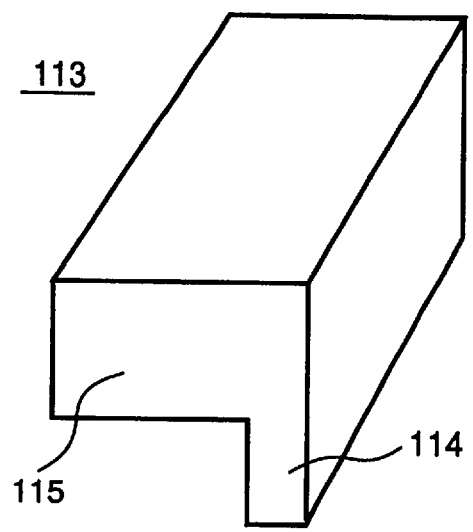
FIG. 30 is a perspective view of a magnetic body having a pendant yoke of FIG. 27.

Yoke 113 has a structure a part of which penetrates coil 111, 112 and another part of which suspends downward. A material of the yoke is preferably a magnetic substance having a relative permeability in a range of 100–10000, and in particular, having iron as its main component. The shape of yoke 113, as indicated in a perspective view of FIG. 30, has a penetration portion 115 and a pendant portion 114, both of which have a square cross-section. The penetration portion 115 needs not to penetrate a whole section inside the coil 111, 112. Its cross-section is set at a value which ensures that magnetic flux does not saturate, and by reducing its cross-section, a light weight yoke 113 can be provided. Further, by lowering the position of yoke penetration portion 115 to the bottom side within the coil, the parallel magnetic field can be formed more effectively in a bottom region of coil 111, 112.

Figure 31:
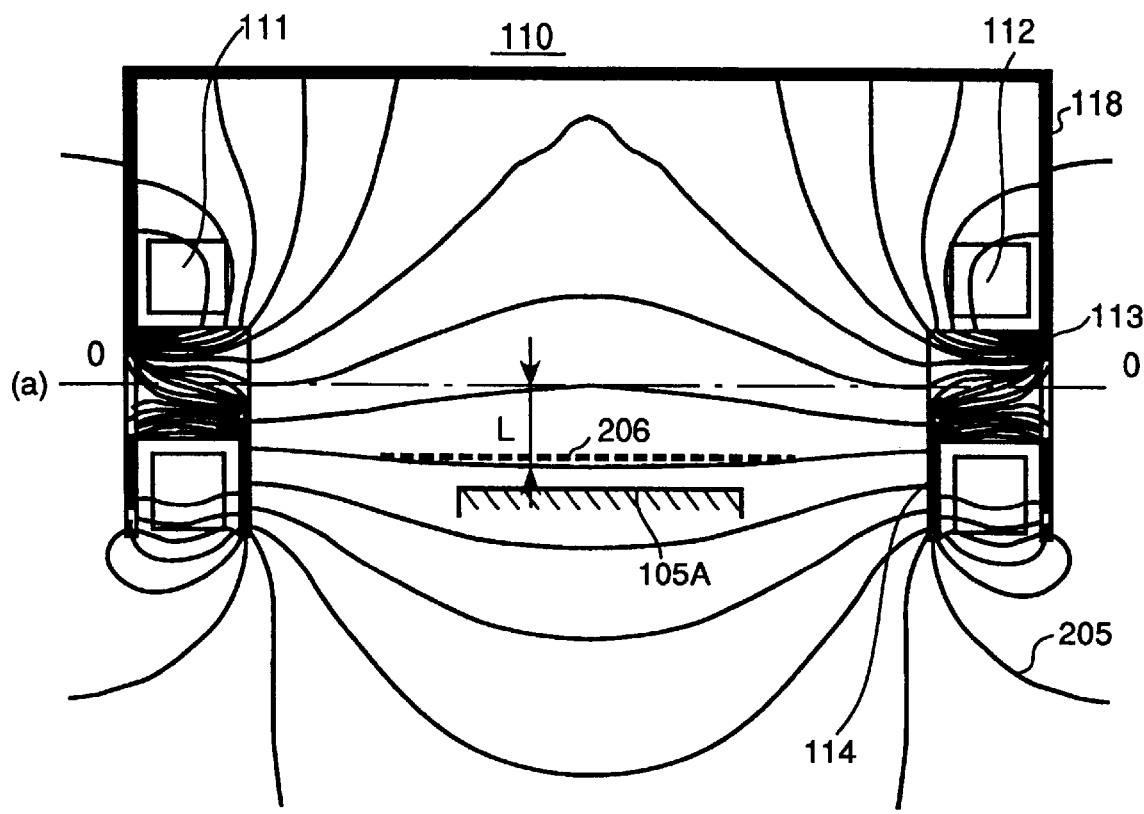
FIGS. 31(a) and (b) show two-dimensional magnetic field analysis diagrams in cross-sectional directions of coils.
Figure 31:
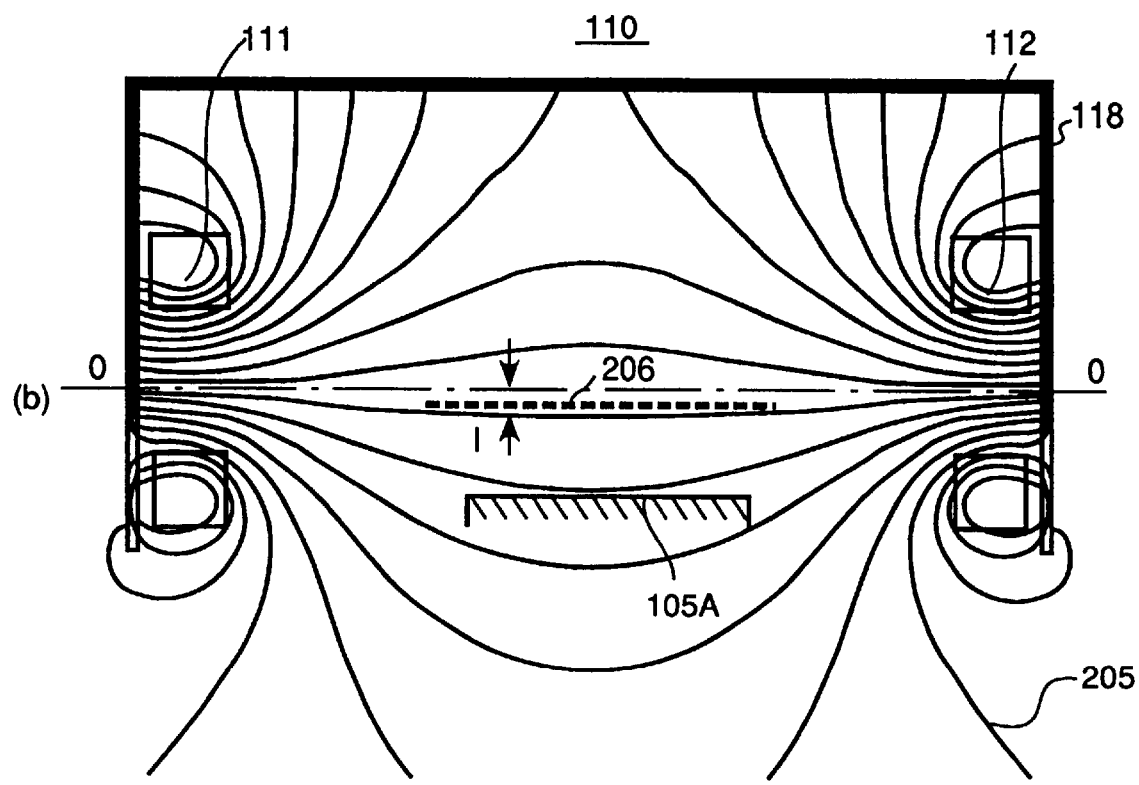

Results of analysis for the effects of yoke 113 having the pendant structure on the parallel magnetic field formation will be described with reference to FIG. 31. A result of two dimensional analysis of magnetic fields formed in the bottom region of the coils is indicated in FIG. 31. FIG. 31($a$) indicated a distribution of lines of magnetic force 205 in a system having oppositely arranged coils 111 and 112, outer shield 118 and pendant type yoke 113. Further, FIG. 31($b$) indicates a result obtained in a system having only outer shield 118 and without the yoke for comparison. As indicated in FIG. 31($a$), in the system provided with pendant type yoke 113, a position 206 of a line of magnetic force 205 at which a parallel horizontal magnetic field component becomes dominant is caused to shift downward by a distance L from a center line 0—0 connecting two coils. In other word, position 206 at which the horizontal magnetic field component becomes dominant is formed along sample mount surface 105A and in the vicinity thereof. On the other hand, as indicated in FIG. 31($b$), in the system without the pendant yoke, its position 206 at which the horizontal magnetic field component becomes dominant is located downward at a distance L' from the center line 0—0 connecting the coils, however, this position nearly coincides with the center line 0—0 of the coils.

Figure 32:
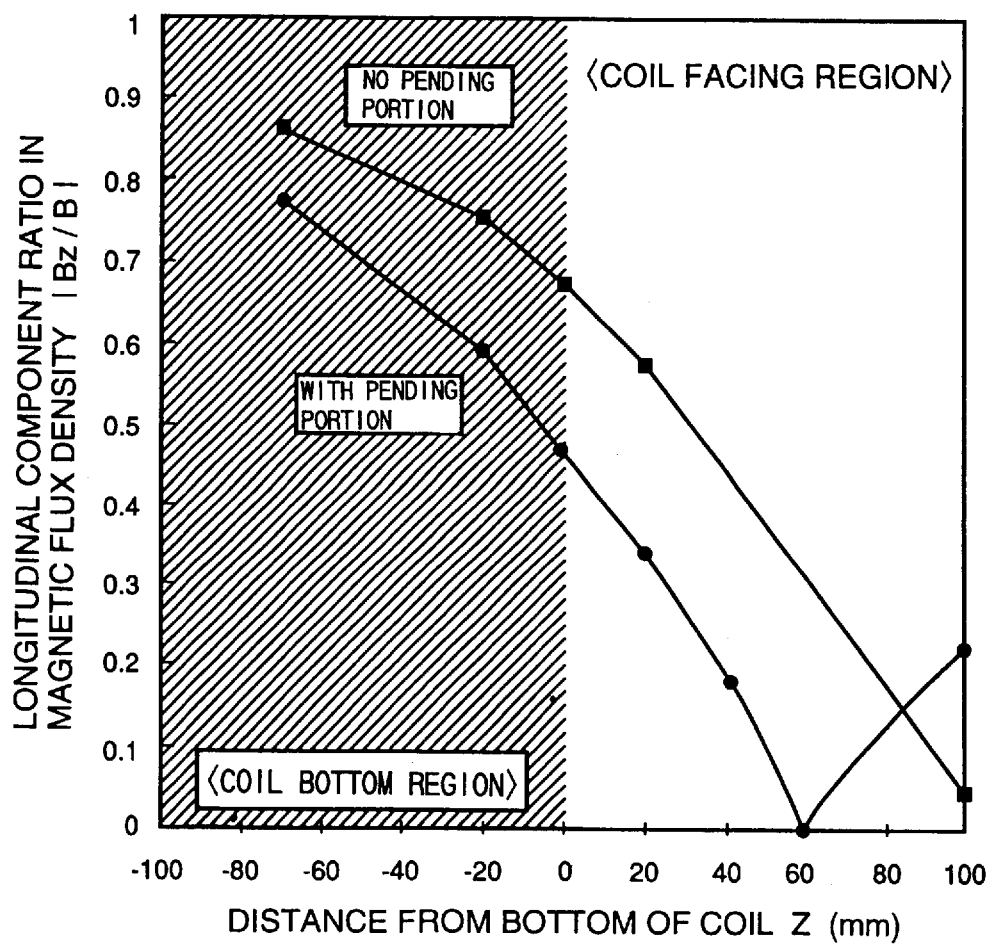
FIG. 32 shows improvements in decreasing of ratios of longitudinal magnetic field component according to the invention.

Therefore, it is understood that provision of yoke 113 having a structure of penetration portion 115 and pendant portion 114 is effective to guide the lines of magnetic force 205 in the downward direction. This downward effect is indicated quantitatively in FIG. 32. In the drawing of FIG. 32, abscissa depicts a distance from the bottom of the coil (in Z direction of height), while ordinate depicts a ratio of vertical components at magnetic flux density B to B. That is, FIG. 32 indicates ratios of vertical components of magnetic fields in the direction of height of coils, and it means that the smaller a value |Bz/B| of ordinate becomes, the more dominant a horizontal component of the magnetic field becomes. The center line of coils is placed at Z=100 mm. In the bottom region of coils (Z<0) which corresponds to the position of the sample mount surface, a curve for a case having pendant yoke 113 indicating the ratio of vertical components at magnetic flux density B is shown to be smaller than a curve for a case without pendant yoke 113. Also, in a region between counterposed coils (Z>0), and in particular, in a lower region than the center line of coils (0<Z<60 mm), the effect of pendant yoke 113 to reduce vertical components of magnetic fields is clearly indicated.

Figure 33:
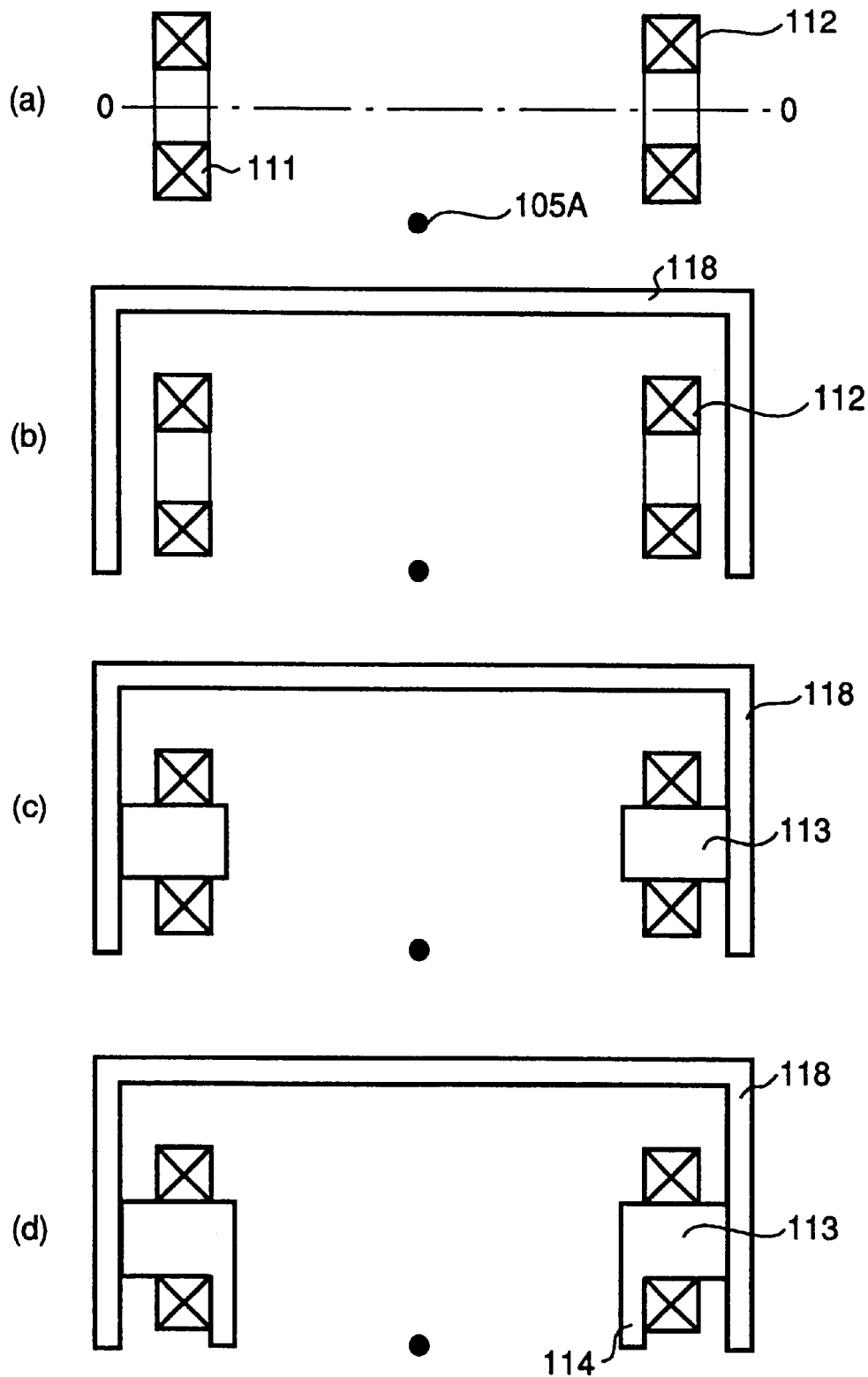
FIGS. 33(a)–(d) show examples of configurations of magnetic body in the magnetic field forming means of the invention.
Figure 34:
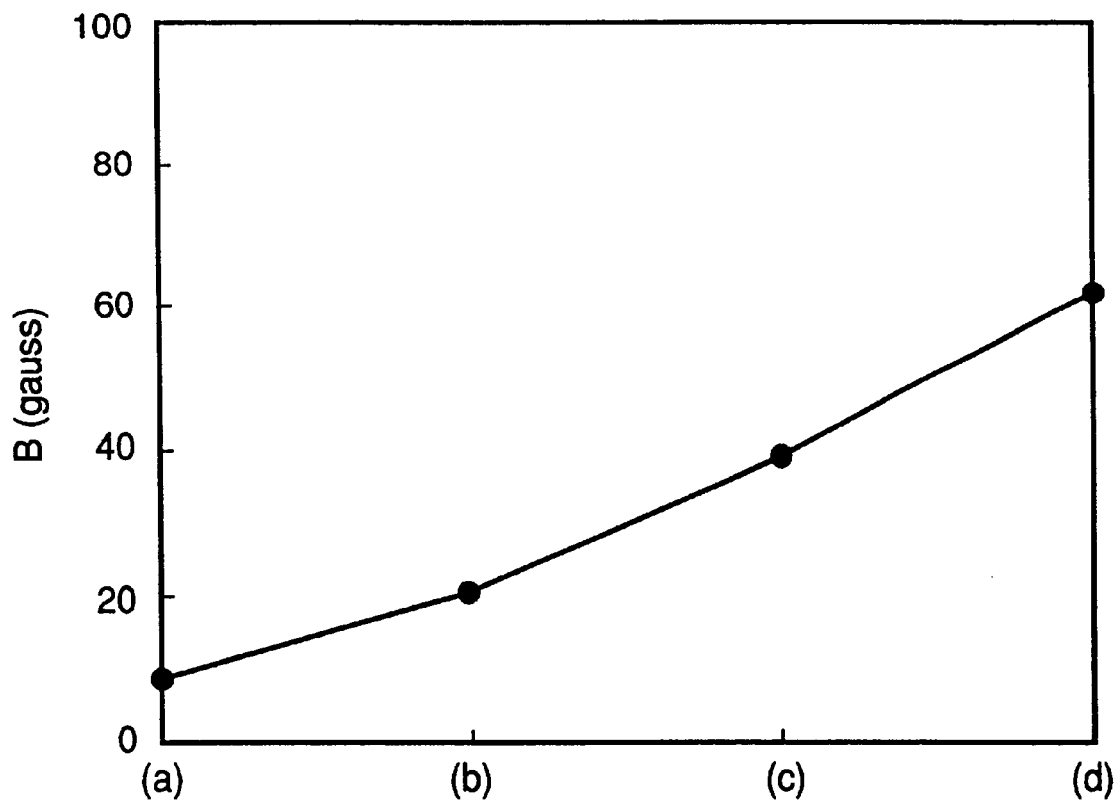
FIG. 34 shows results of experiments having been conducted to obtain a relationship between the shape of shield of a magnetic body when it is varied as indicated in FIGS. 35(a)–(d) and horizontal magnetic field component B in the vicinity of sample mounted surface.

With reference to FIGS. 33 and 34, the results of experiments we have conducted to examine the effects of yoke 113 and outer shield 118 on the density of magnetic flux will be described in the following. The outer shield is provided such as to shield peripheral portions of coils 111, 112 and yoke 113. Here, in four cases indicated in FIG. 33 with and without outer shield 118 and/or yoke 113, as well as with a different structure of yoke, their effects on the magnetic flux density are compared. A pair of coils 111 and 112 disposed oppositely are caused to flow a current of 2 kA ■ turn respectively to form a magnetic field in a direction from coil 111 to coil 112, and a magnetic flux density at test point 105A, i.e., at the center of the sample mount surface, is measured for each case. The result of measurements is indicated in FIG. 34.

As clearly indicated in FIG. 34, the case of (b) which is a simple one with an outer shield which covers the outsides of coils has an effect to double its magnetic flux density compared to the case of (a) which is devoid of a yoke and outer shield. Further, in the case of (c) having yoke 113 made of a magnetic substance which penetrates the coils, its magnetic flux density is quadrupled compared to (a). Further, in the case of (d) having yoke 113 having the structure to penetrate the coil and pendant portion, its magnetic flux density increases 6 to 7 times greater than (a). Conversely, it implies that the same magnetic flux density can be obtained using a current which is one sixth or one seventh of the conventional current. This will be very effective in reducing its power consumption and minimizing the coil size and its heat loss.

As described hereinabove, according to the embodiment of the invention of FIG. 27, the provision of magnetic field forming means 110 provided with yoke 113 having a simple pendant structure and with outer shield 118 has demonstrated the effect that the position 206 of the lines of magnetic force 205 at which they become approximately horizontal, that is, their horizontal magnetic field component becomes dominant, is shifted substantially downward below the center line connecting coils. As a result, a magnetic field of which the horizontal component is dominant can be formed in a gap space between bottom electrode 105 and upper electrode 108. Further, as to the uniformity of the magnetic field, although the magnetic flux density tends to increase in the vicinity of each coil, its uniformity can be maintained within ±10% at least in the region of sample mount surface 105A. As a result, it becomes possible to form a uniform horizontal magnetic field in the space between the electrodes, to control the electron resonance and the plasma state by the magnetic field, or to increase the plasma density by the magnetron effect, thereby controlling the etching characteristics and increasing etching rate.

Further, although bottom electrode 105 is movable in vertical directions by electrode elevating mechanism 128, since its horizontal magnetic field is formed in the bottom region substantially below the center line connecting between the coils by provision of pendant type yoke 113, an elevation stroke of bottom electrode 105 can be minimized, thereby simplifying a mechanical construction of electrode elevating mechanism 128. Still further, since coils 111, 112 can be installed in the upper portion with an adequate clearance from sample mount surface 105A and the sample transfer path, transfer of the sample from buffer chamber 100 adjacent thereto becomes easier. Further, coils 111, 112 for forming horizontal magnetic fields according to this embodiment of the invention are electromagnetic coils. Thereby, they are ensured to have a uniform property unlike the permanent magnet which differs from unit to unit, and thereby eliminating variance among apparatuses of the same type. Still further, outer shield 118 and pendant yoke 113 in combination have an effect to increase the magnetic flux density, thereby contributing to the reduction of coil currents and power consumption as well as minimization of coil size and its heat loss.

As have been described hereinabove, the provision of pendant type yoke 113 to the magnetic field forming means has an effect to lower the position at which the horizontal component of the magnetic field become dominant than the position of the center line connecting the pair of coils. Since the length and shape of a suspending portion 114 of the pendant yoke, or the outer shield will influence the distribution of the lines of magnetic force 205, this will be described in detail with reference to FIGS. 35(a)–(d).

Firstly, by lengthening pendant portion 114 of yoke 113 as indicated in FIG. 35(a), the position at which the lateral magnetic field component becomes dominant can be shifted downward, and in addition, its position can be adjusted appropriately by the length of pendant portion 114. This has been confirmed also by experiments. According to the result of the experiments, in order to most efficiently form a magnetic field having its horizontal component which is dominant in the vicinity of the sample, it is effective for the pendant portion 114 to be extended to the vicinity of the sample mounting position in the etching chamber.

In this case, pendant portion 114 of the pendant yoke is caused to contact the etching plasma in the process chamber. Thereby, a countermeasure is required to prevent occurrence of any problem associated with maintenance of the process or the apparatus. For example, pendant type core 113 is not necessarily required to be an integral member, and it may have a structure which can be split into two parts between inside and outside of process chamber 104 provided that they are magnetically coupled. Further, the pendant type core within process chamber 104 may be coated by a plasma resistant coating film (ceramic such as SiC). Further, when loading a sample from buffer chamber 100 into process chamber 104, if the position of pendant portion 114 of the pendant type yoke interferes sample transfer path, an opening for loading the sample may be provided to the side of buffer chamber 100 under pendant portion 114.

According to the structure described above, since the bottom end of the pendant yoke is allowed to extend adjacent to the sides of the gap between the upper and the bottom electrodes, an ideal horizontal magnetic field devoid of vertical components can be formed in the gap between the electrodes. Further, the uniformity of the magnetic fields, although its magnetic flux density tends to increase in the vicinity of each coil, is ensured to be suppressed within ±5% at least in the region of the sample mount surface of bottom electrode 105.

Figure 35:
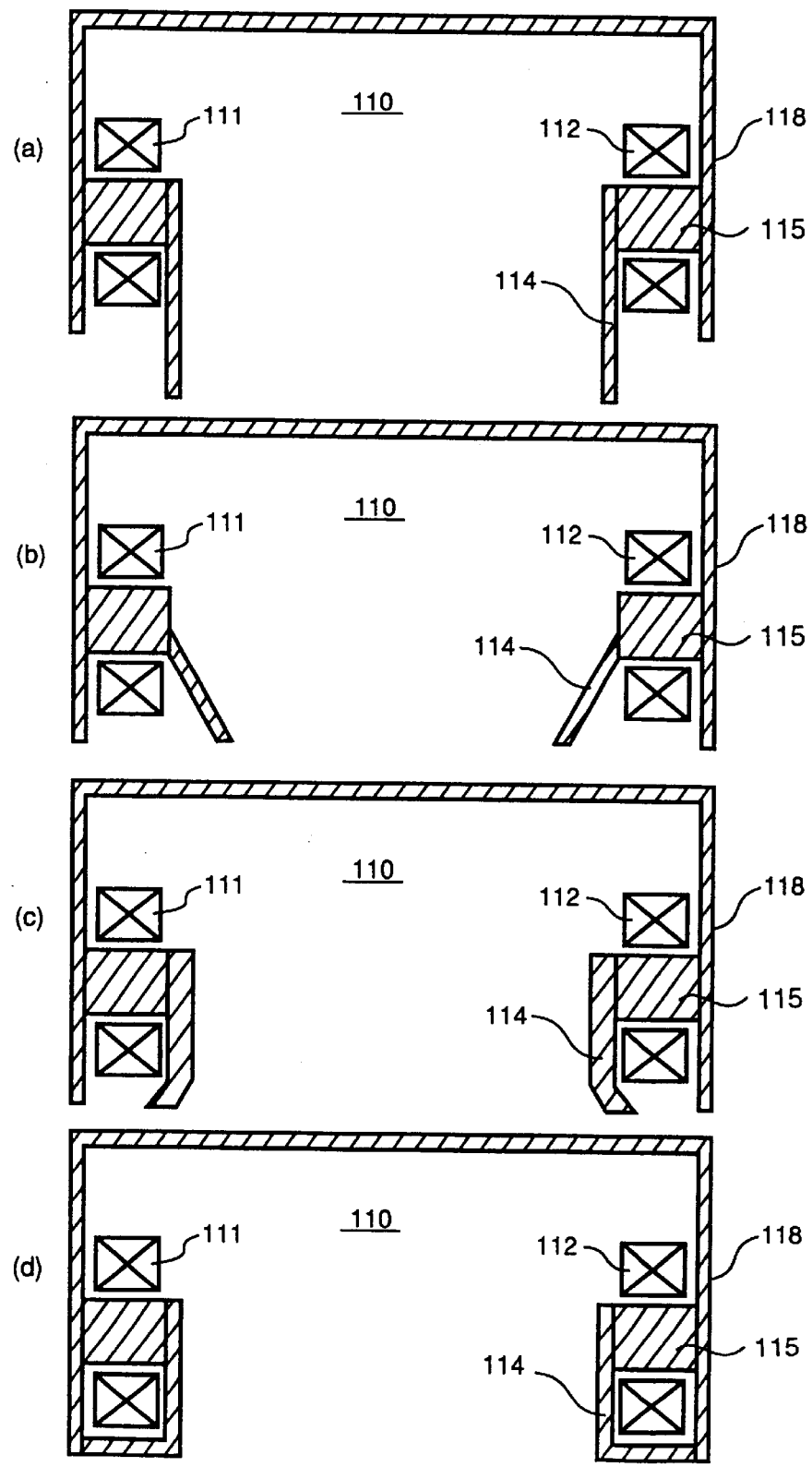
FIGS. 35(a)–(d) compare various cross-sections of magnetic bodies with pendant core and of coils.

Further, by providing pendant portion 114 having an obliquely hanging shape tilting toward the opposite direction from coils 111, 112 as indicated in FIG. 35(*b*), the magnetic flux from the penetration portion can be guided toward the opposite coil. On the other hand, when the pendant portion is formed to have a tilt end directed toward outer shield 118 as indicated in FIG. 35(*c*), its lines of magnetic force will be guided to the nearest skirt portion of outer shield 118, thereby remarkably reducing the magnetic flux density between the coils. Still further, when pendant portion 114 is formed to surround the bottom portions of coils 111, 112, since its lines of magnetic flux are guided to the nearest skirt portion of outer shield 118, the magnetic flux density between these coils is remarkably reduced.

Although a role of outer shield 118 depicted in these figures for forming the magnetic field having the horizontal component which is dominant is small, it has a role to effectively guide the lines of magnetic force from the coils to penetration portion 115 and pendant portion 114. A cross-section of penetration portion 115 is adequate if it has a sufficient area to prevent saturation of the magnetic flux, and the smaller the cross-section, the more light weight the penetration portion 115 can be made. Further, the lower the position of the penetration portion 115 within the coil, the greater the ratio of the horizontal component of magnetic filed in the bottom region of the coils is achieved.

Figure 36:
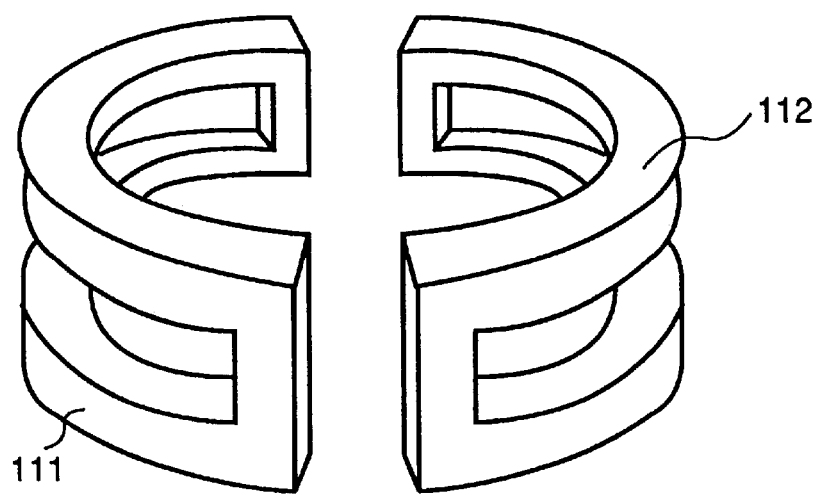
FIGS. 36(a)–(b) show a coil shape according to another embodiment of the invention.
Figure 36:
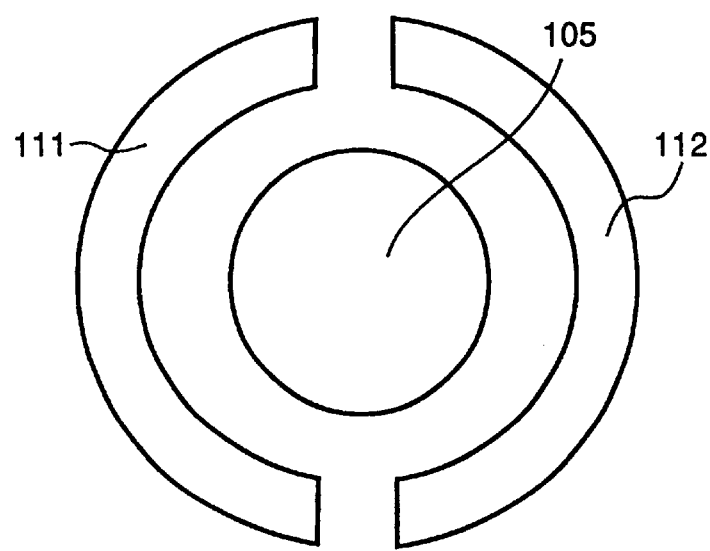

In each embodiment of the invention described hereinabove, the rectangular type coil as indicated in FIG. 28 is used as coils 111 and 112. However, it is not limited thereto, and this may have such a shape as indicated in FIGS. 36(*a*)–(*b*) to the same effect, in which a pair of curved coils 111 and 112 are disposed oppositely with their concave inner surfaces facing each other with respect to bottom electrode 105 interposed therebetween. In this case, its pendant yoke 113 is formed suitable for the shape of the curved type coils. Use of this curved type coils is advantageous to reduce a space of coils. Here, use of a pair of curved coils is indicated, but it is not limited thereto, and any number of pairs 2, 3 or more may be used. It should be noted, however, that a plurality of pairs of rectangular type coils other than the curved coils may also be used to the same effect. Further, in the case where pendant portion 114 having a lengthened structure as indicated in FIG. 35(*a*) is used, by providing a structure which surrounds the peripheral portions of bottom electrode 105 and upper electrode 108, there is such an advantage that plasma formed between these electrodes can be contained therein.

Figure 37:
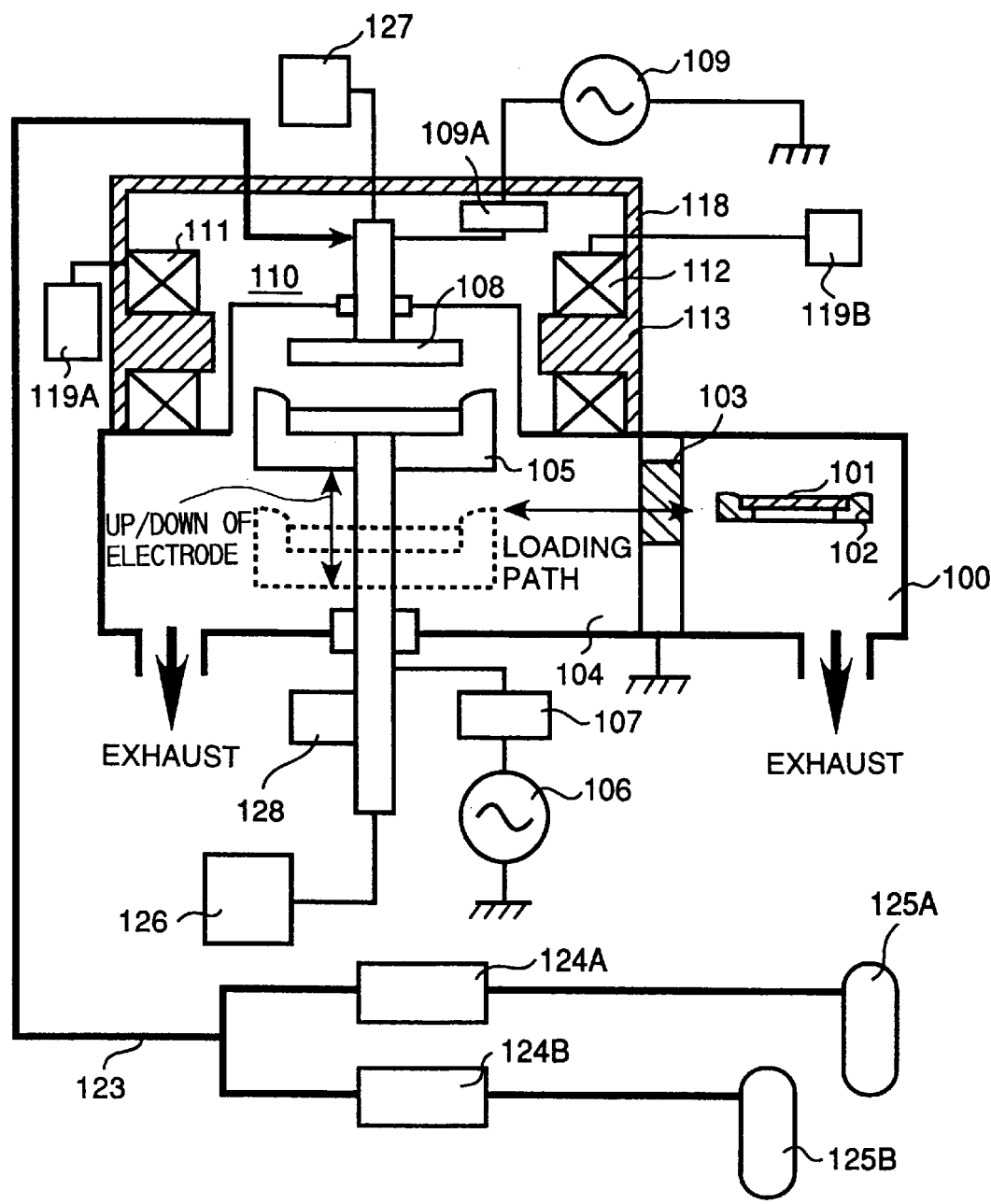
FIG. 37 is a schematic block diagram indicating a system configuration of an etching apparatus according to a third embodiment of the invention.

With respect to the shapes of coils used in the aforementioned embodiments of the invention, as indicated in FIGS. 28 and 36, their frames to wind coils, and heights of penetration portion 115 of their pendant type yoke 113 are constant each other. These shapes are preferable for forming a uniform magnetic field in a region between the oppositely disposed coils. However, depending on particular conditions of magnetic fields or etching, there occurs such a case that a uniform magnetic field does not always provide a preferable etching characteristic since there may occur a local distribution of electrons in plasma due to the drift effect resulting from interaction between the electrical field and the magnetic field. This becomes significant when using a strong magnetic field. In this case, by changing the heights of the coil frame and the penetration portion of the pendant yoke relative to the lateral direction, the magnetic flux density distribution can be changed with respect to the direction of the drift, thereby enabling to achieve a uniform plasma while avoiding the adverse effect of the drift. Further, another method to cause the magnetic flux density distribution to change is contemplated in which coils 111 and 112 in FIG. 37 are disposed not symmetrically with respect to bottom electrode 105, but to have side surfaces of the coils titled in a range of 10–60 degrees of angles (i.e., to differ in distances between coils 111 and 112 at their different ends of sides) such as to surround bottom electrode 105.

The magnetic field forming means in the embodiments of the invention described hereinabove is provided with pendant type yoke 113. However, by maintaining a predetermined relationship of positions between the process chamber and the magnetic field forming means without provision of the pendant portion to the yoke, a similar effect achievable by the pendant type yoke can be obtained to some extent. Such another embodiment of the invention will be described with reference to FIG. 37. This embodiment of FIG. 37 has almost the same configuration as that of the embodiment of FIG. 27 excepting that yoke 113 is not provided with a pendant portion 114 and that a gap space between bottom electrode 105 and upper electrode 108 exists in a region between coils 111 and 112 which are counterposed. Since the gap between the upper and the bottom electrodes and the center axis between these coils are in close proximity in this arrangement of the embodiment, without use of the pendant type yoke of FIG. 27, a magnetic field having a horizontal component which is dominant can be formed in the space between the upper and the bottom electrodes. In this case, although its elevating mechanism for elevating the electrode will have to have a longer stroke, the weight of the yoke member can be reduced since the pendant portion is eliminated. Further, according to the effect of the penetration portion of its yoke, as have been indicated in FIGS. 33(*c*) and 34(*c*), the intensity of its magnetic field generated in the space between the electrodes becomes greater than the case without the yoke. Thereby, the efficiency of forming of magnetic fields can be improved, thereby reducing the coil current required to one third or less of the current without the yoke.

Of course, it is also possible for the magnetic field forming means to have a structure which is provided only with outer shield 118 and without provision of the yoke, thereby substantially reducing its weight. In this case, according to the effect of the outer shield, external leakage of magnetic fields are prevented from occurring. Thereby, the intensity of magnetic fields formed between the upper and the bottom electrodes is greater than the case without the outer shield, therefore, the coil current required can be reduced to a half or less of the current in the case without the outer shield.

A magnetic field forming means of still another embodiment of the invention which has a feature of a rotating magnetic field or gradient magnetic field will be described with reference to coil arrangements of FIGS. 38 and 39. This embodiment of the invention differs from the foregoing embodiments in the numbers of coils and yokes used, and further in a method of controlling the current which flows through each coil. The shapes of each coil and yoke are basically the same as those in respective embodiments described hereinabove. By way of example which uses curved type coils and pendant type yokes, this embodiment of the invention will be described in the following. However, it is not limited thereto, and the foregoing yokes of the square type or having only the penetration portion may be used as well, and also the case of using only the outer shield should be construed within the scope of the invention.

Figure 38:
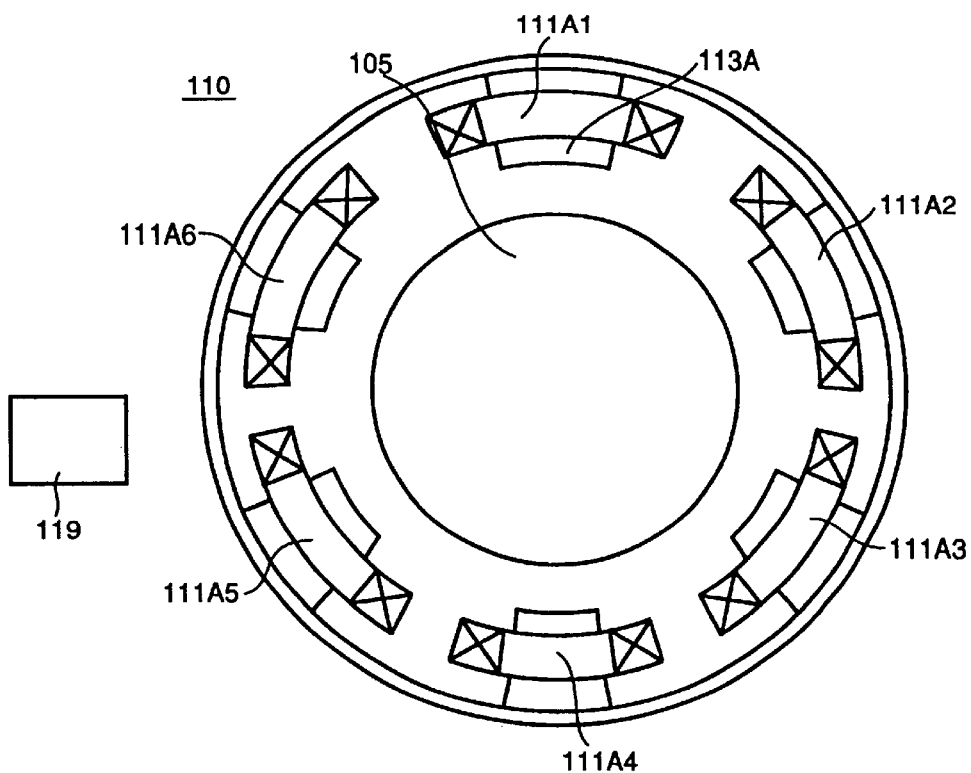
FIG. 38 shows a coil arrangement according to another embodiment of the invention.
Figure 39:
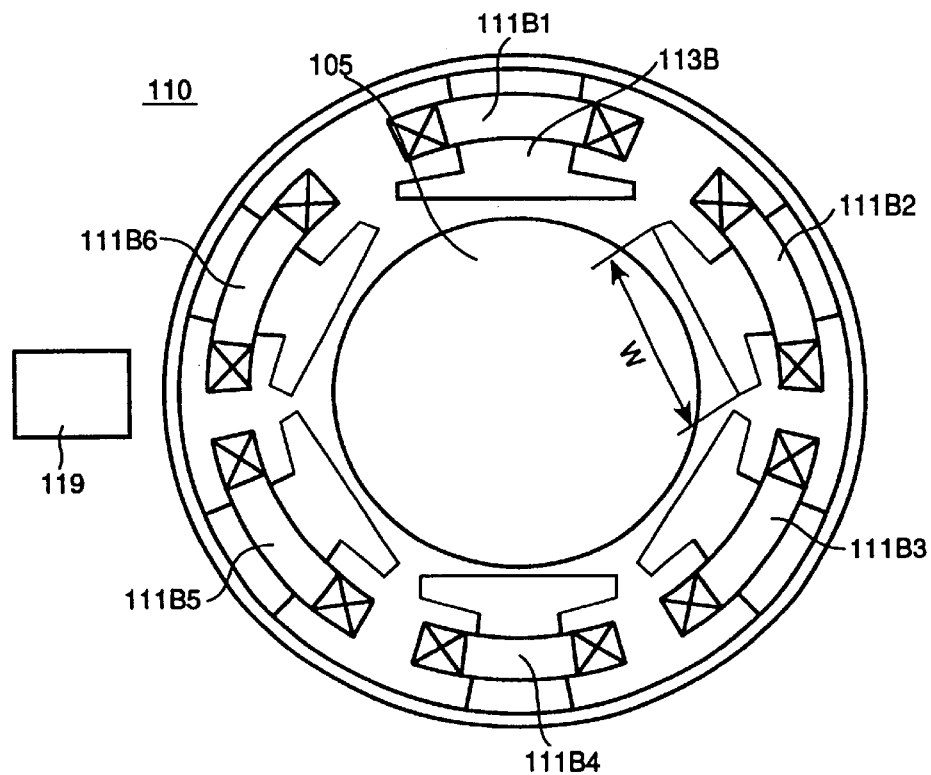
FIG. 39 shows a coil arrangement according to still another embodiment of the invention.

With reference to FIG. 38, according to this embodiment of the invention, six pieces of coils 111 A1–A6 are disposed such as to surround bottom electrode 105. When these six pieces of coils are arranged in the manner as depicted, electromotive force of each coil is caused slightly to decrease due to a gap influence of coil positions, thereby changing the uniformity thereof. In order to suppress this influence, it is effective to increase a width W of pendant type yoke 113B which penetrates coils 111 B1–B6 and suspends downward. In this case, each width W may extend such as to contact with another pendant type yoke 118B adjacent thereto.

In this arrangement of coils, it is possible to rotate a direction of magnetic fields over bottom electrode 105 by time modulation of each current flowing through each coil. For example, directions of coil currents flowing through respective coils are set such that at a first time band, directions of coil currents of 111-A4, 111-A5 and 111-A6 are set in opposite directions with respect to 111-A1, 111-A2 and 111-A3, and that at a second time band, directions of coil currents of 111-A5, 111-A6 and 111-A1 are set in opposite directions with respect to 111-A2, 111-A3 and 111-A4. According to this manner of setting, if each coil current is changed sequentially, the direction of magnetic field can be rotated.

Further, by setting a current ratio of each current flowing through each coil appropriately, it becomes possible to provide a gradient magnetic flux density. For example, in the case in the first time band, where directions of coil currents of 111-A4, 111-A5 and 111-A6 are set in opposite directions with respect to 111-A1, 111-A2 and 111-A3, and by further setting each current ratio of each current flowing through each coil such that 111-A3:111-A2:111-A1 (or 111-A4:111-A5:111-A6)=1:5:5, it becomes possible to provide a gradient in magnetic flux density in a vertical direction with respect to a main direction of its line of magnetic force directing from 111-A2 to 111-A5. This current ratio can be varied according to a gradient of magnetic field required. Further, it is also possible to rotate the magnetic field while maintaining such current ratio. Thereby, the influence by electron drift at each time can be alleviated.

By way of example, a frequency of magnetic field rotation is preferably 0.3–100 Hz. When the frequency of magnetic field rotation becomes smaller than 0.3 Hz, electrons in plasma tend to be locally distributed due to the drift effect by interaction between the magnetic field and the electrical field. On the other hand, when it becomes greater than 100 Hz, since the coils have a large inductance, there arise such problems that its coil current decreases, its circuit voltage needs to be increased substantially, a large magnetic loss in the core results in, and the like. It is normally preferable for the rotation frequency in a range of 1 Hz to 80 Hz.

Further, the time modulation of the currents described above can be achieved also by changing phases of the currents to be supplied, or by digital control using switching devices. According to the embodiments of FIGS. 38 and 39, since it is possible to rotate the direction of magnetic fields on bottom electrode 105, uniformity of magnetic field thereof on average is improved compared to other magnetic field forming means according to other embodiments of the invention. This is especially effective in a strong intensity magnetic field such as in magnetron for canceling the drift effect due to interaction between the electrical field and the magnetic field, thereby alleviating localization of electrons in plasma.

In this embodiment of the invention, its rotating magnetic field is formed using six pieces of coils, however, such rotating magnetic field can be realized using four or more coils. It is preferable, however, to use 4 to 12 coils in consideration of cost and mounting thereof.

Figure 40:
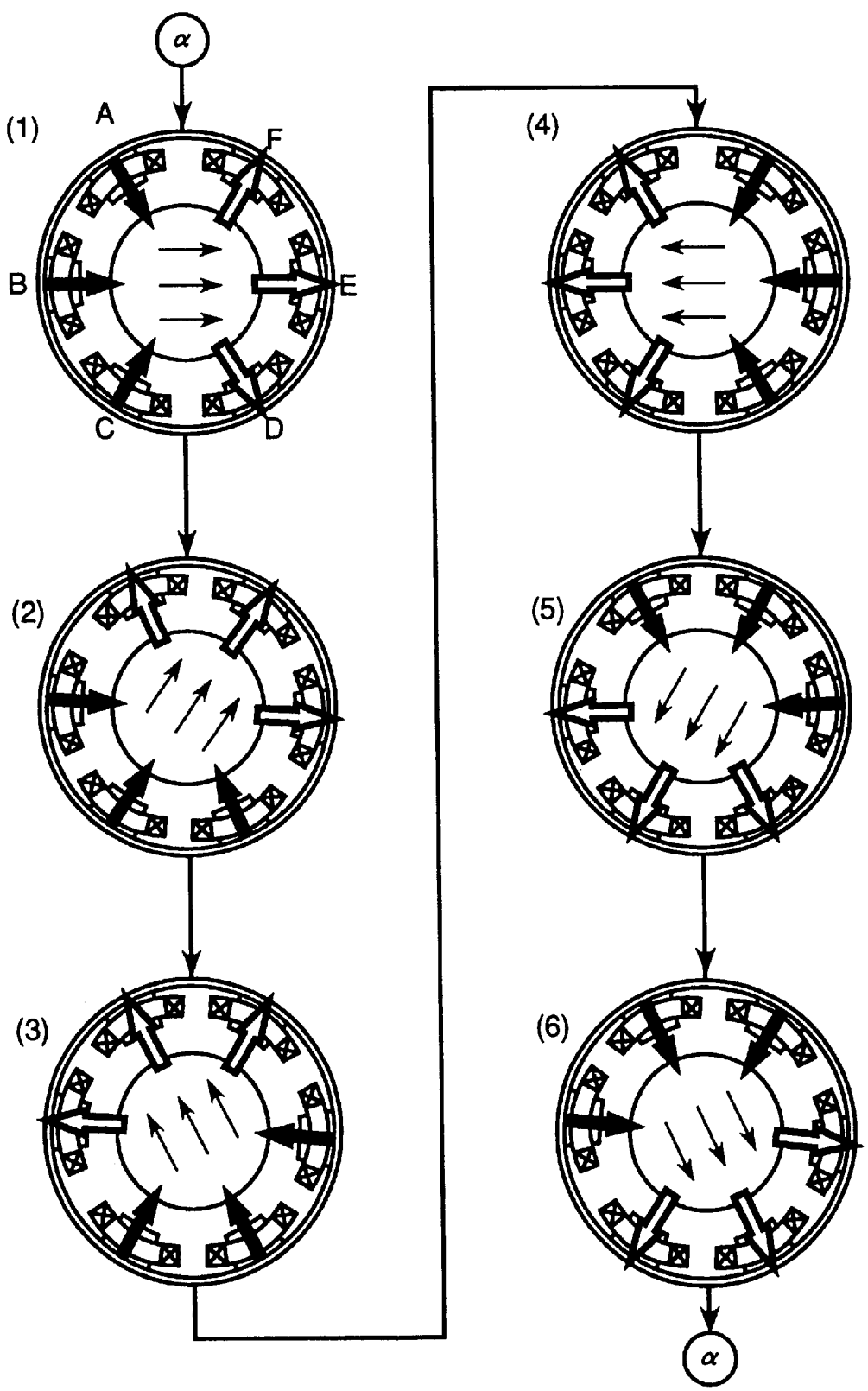
FIGS. 40(1)–(6) show changing directions of magnetic fields in respective coils and of a synthetic magnetic field under rotation of magnetic fields in respective arrangements of FIGS. 38 and 39.
Figure 41:
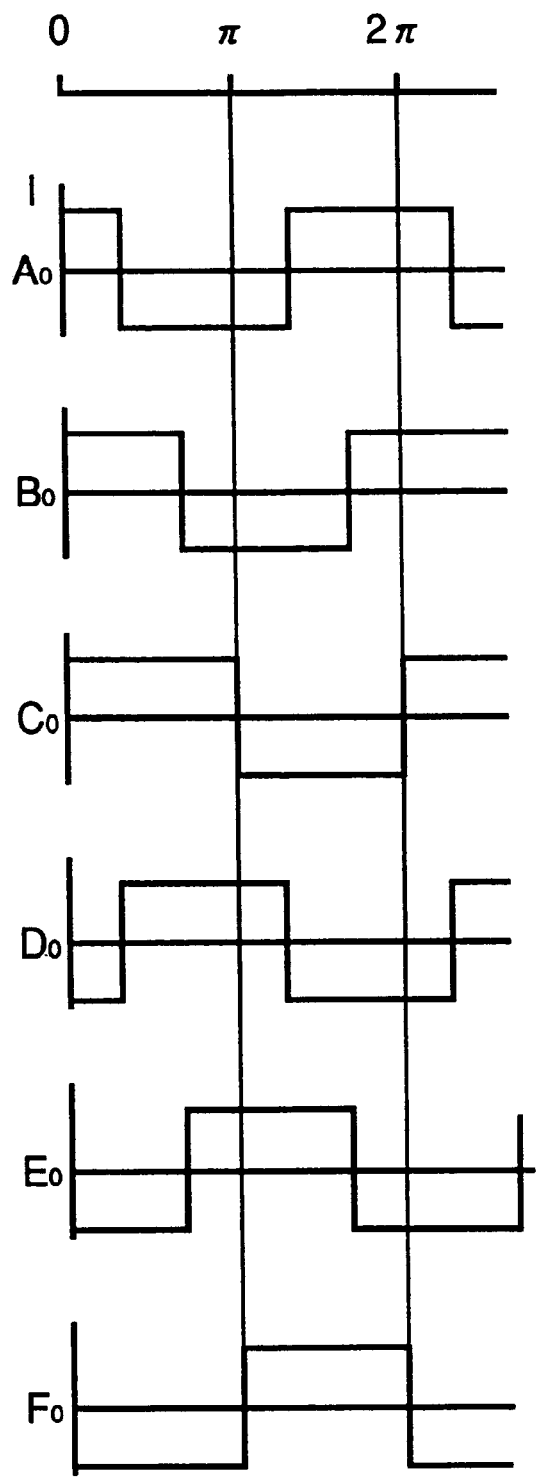
FIG. 41 shows respective currents supplied to flow through respective coils under rotation of magnetic fields in FIG. 40.

Now, with reference to FIGS. 40 and 41, the method of rotating the magnetic field by changing coil currents in the embodiments of FIGS. 38 and 39 as well as their coil currents will be described more in detail. FIGS. 40(1)–(6) indicate respective directions of magnetic fields of respective coils, a direction of a synthetic magnetic field, and how they change when the magnetic fields are rotated by changing the directions of coil currents supplied from coil power supply 119 to each coil. A current supplied to each coil changes its direction twice in a cycle of 0–2π as indicated in FIG. 41. As indicated by thick solid arrows in FIG. 40, directions of respective currents each having the same magnitude of current are shifted sequentially at a timing of π/3 phase, a synthetic magnetic field depicted by thinner lines in FIG. 40 which rotates as a whole is obtained. As a result, this rotating magnetic field has a feature to cancel the drift effect due to interaction between the electric field and the magnetic field, and to alleviate localization of electrons in plasma. It is preferable for the frequency of magnetic field rotation to be 0.3–100 Hz.

The method of rotating the magnetic fields described in FIGS. 40 and 41, however, is not always adequate for eliminating any local distribution of electrons in plasma due to the drift thereof. In particular, in a plasma which uses such gases as oxygen, chloride, fluorocarbon gas, $SF_6$ or the like which produces a large quantity of negative ions, adverse effect by localized distribution of electrons due to the drift appears most significantly. In such occasion, the localized distribution of electrons cannot be eliminated always simply by increasing the frequency of the magnetic field rotation. In this case, it is effective to adopt either of the following two methods in order to eliminate the adverse effect of drift.

Figure 42:
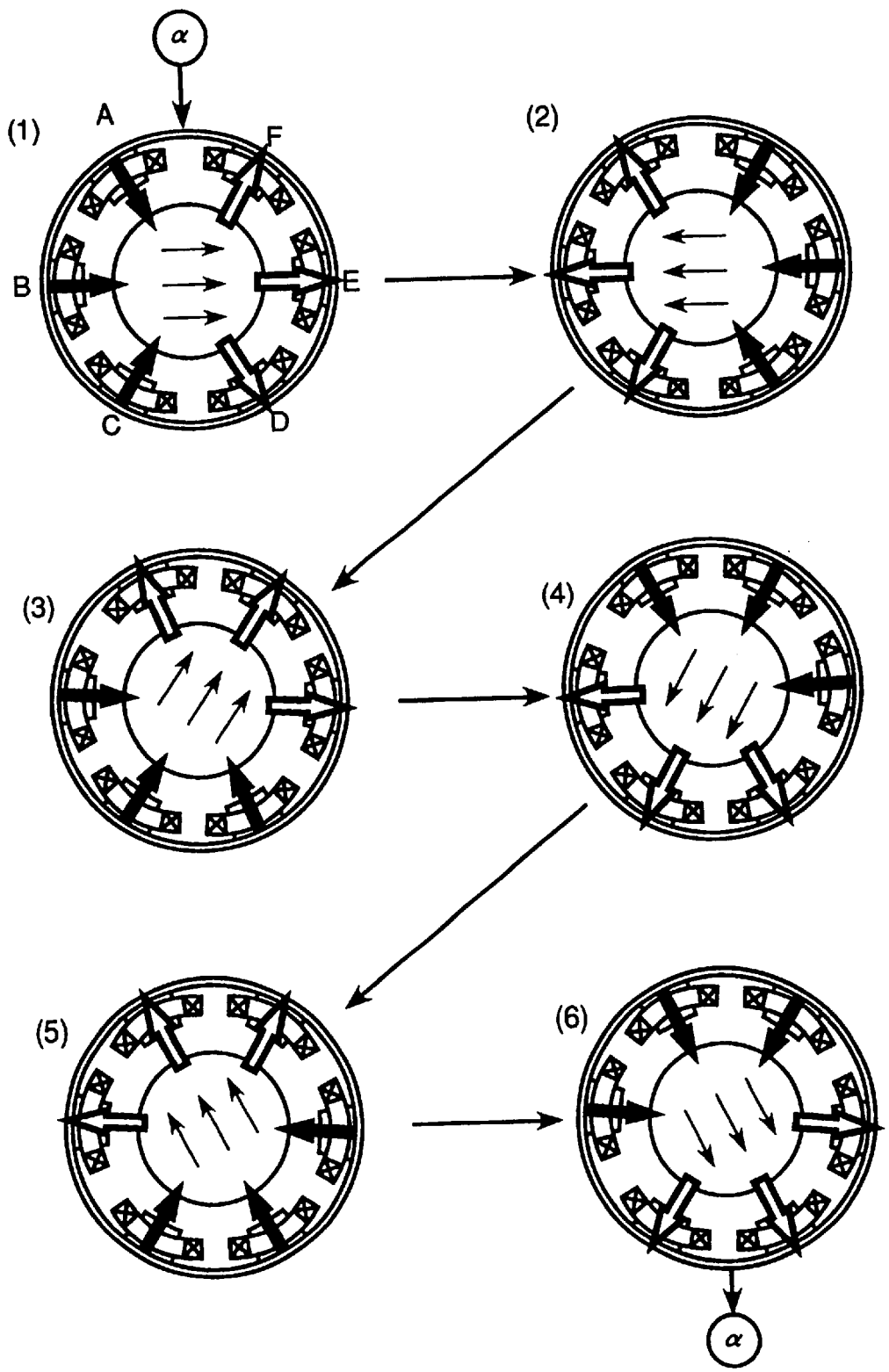
FIGS. 42(1)–(6) show changing directions of magnetic fields in respective coils and of a synthetic magnetic field under rotation of magnetic fields according to another method of rotation.

The first method therefor is to reverse its synthetic magnetic field in a short cycle of 1–100 Hz. This example will be described with reference to FIGS. 42 (1)–(6) and FIG. 43. As indicated in FIGS. 42(1) and (2), a synthetic magnetic field is reversed its direction, then, as indicated in (2)–(3), the direction of the magnetic field reversed is slightly rotated, further as indicated in (3)–(4), the slightly rotated magnetic field is reversed of its direction. Subsequently, in the same manner as described above, the reversal and rotation of the magnetic field are executed alternatively. Any number of rotation of the magnetic field may be executed without limiting to once.

Figure 43:
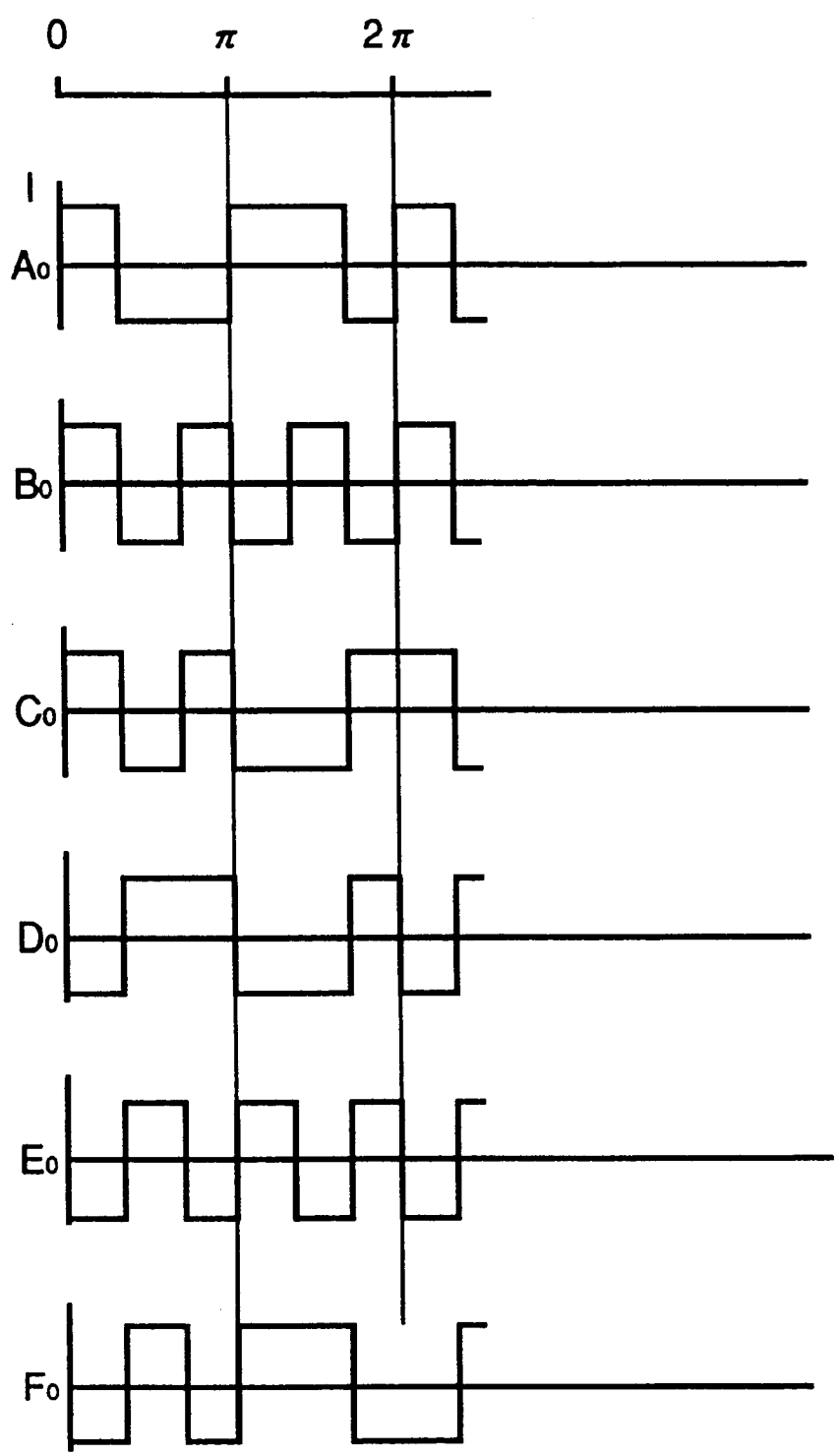
FIG. 43 shows respective currents supplied to flow through in respective coils under rotation of magnetic fields in FIGS. 42.

The current waveforms subjected only to the rotation of magnetic field as indicated by FIG. 41 and the current waveforms subjected both to the reversal and rotation of magnetic field as indicated by FIG. 43 differ respectively in the number of reversals of its current in one cycle; the former being twice while the latter being four times. Generally, if there is any portion which has the number of current reversals which is three times or more in one cycle, the effect of its current reversal to reduce the adverse effect by drift starts to appear.

Figure 44:
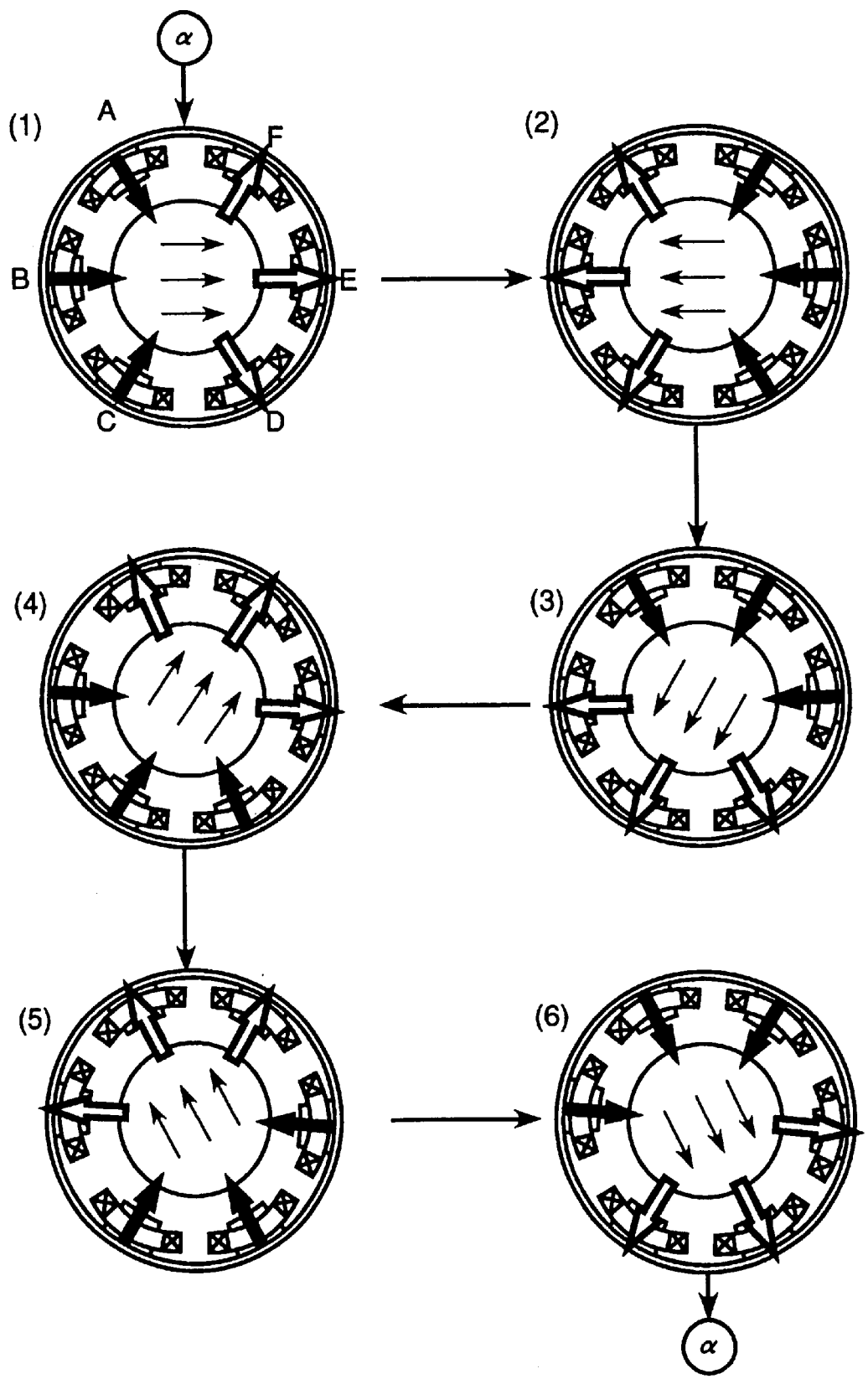
FIGS. 44(1)–(6) show still another method for rotating the magnetic fields according to the invention.

Further, the rotation of the magnetic field indicated in FIG. 42 is not always essential. In short, what is required here is to be able to equalize the magnetic field in one cycle through reversals of the synthetic magnetic field. For example, the same effect can be realized by the rotation and reversals of the magnetic field as indicated in FIG. 44 in which the sequence of their rotation and reversals are modified from the sequence of FIG. 42.

Figure 45:
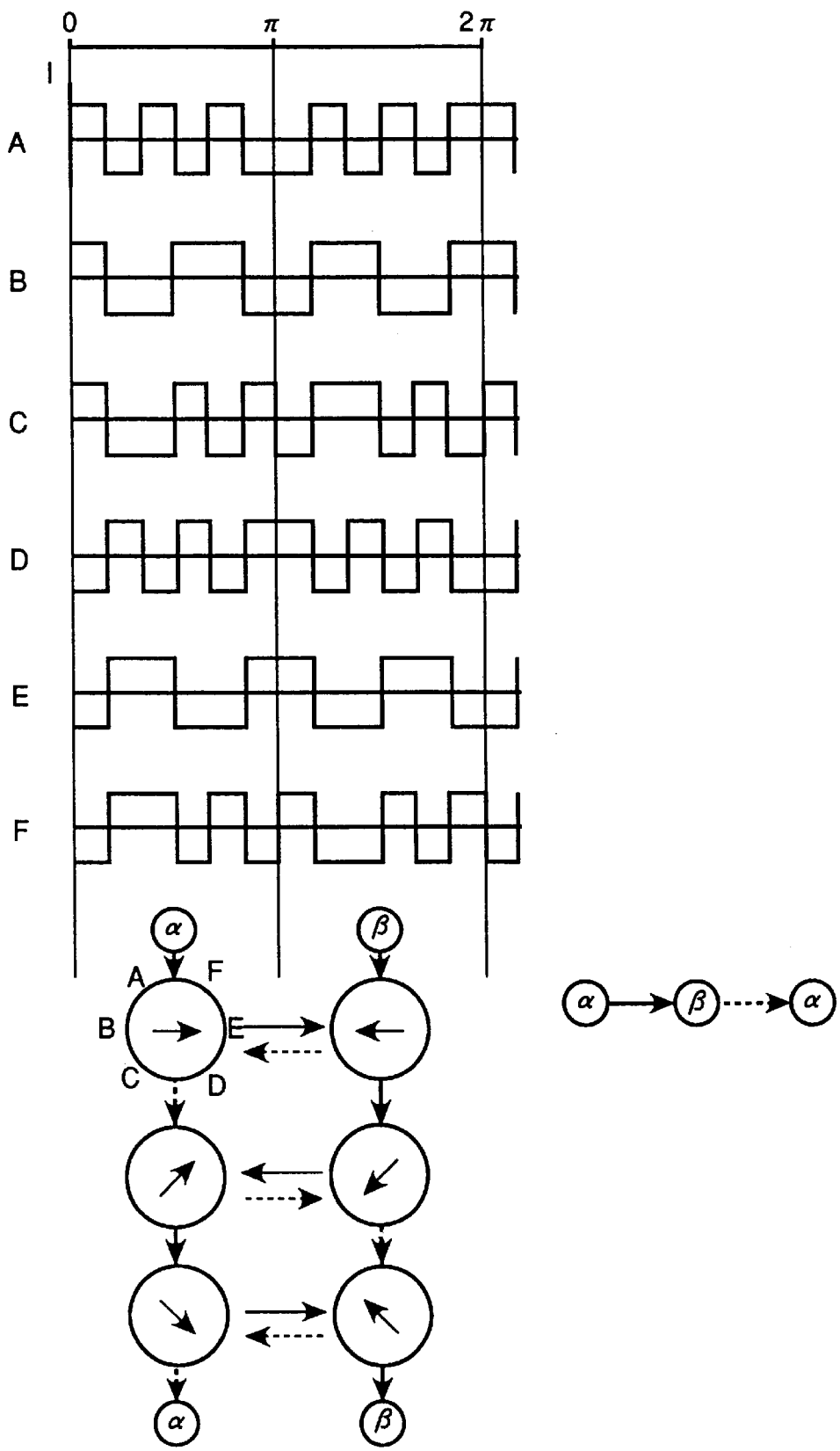
FIG. 45 indicates a method for rotating magnetic fields by alternating two consecutive reversals and rotations of directions of magnetic fields.

With reference to FIG. 45, further improvements in reduction of the drift effect and enhancement of the uniformity can be achieved by the method of rotating magnetic field which in addition to the method of FIG. 42 repeats the reversal and rotation alternatively.

Figure 46:
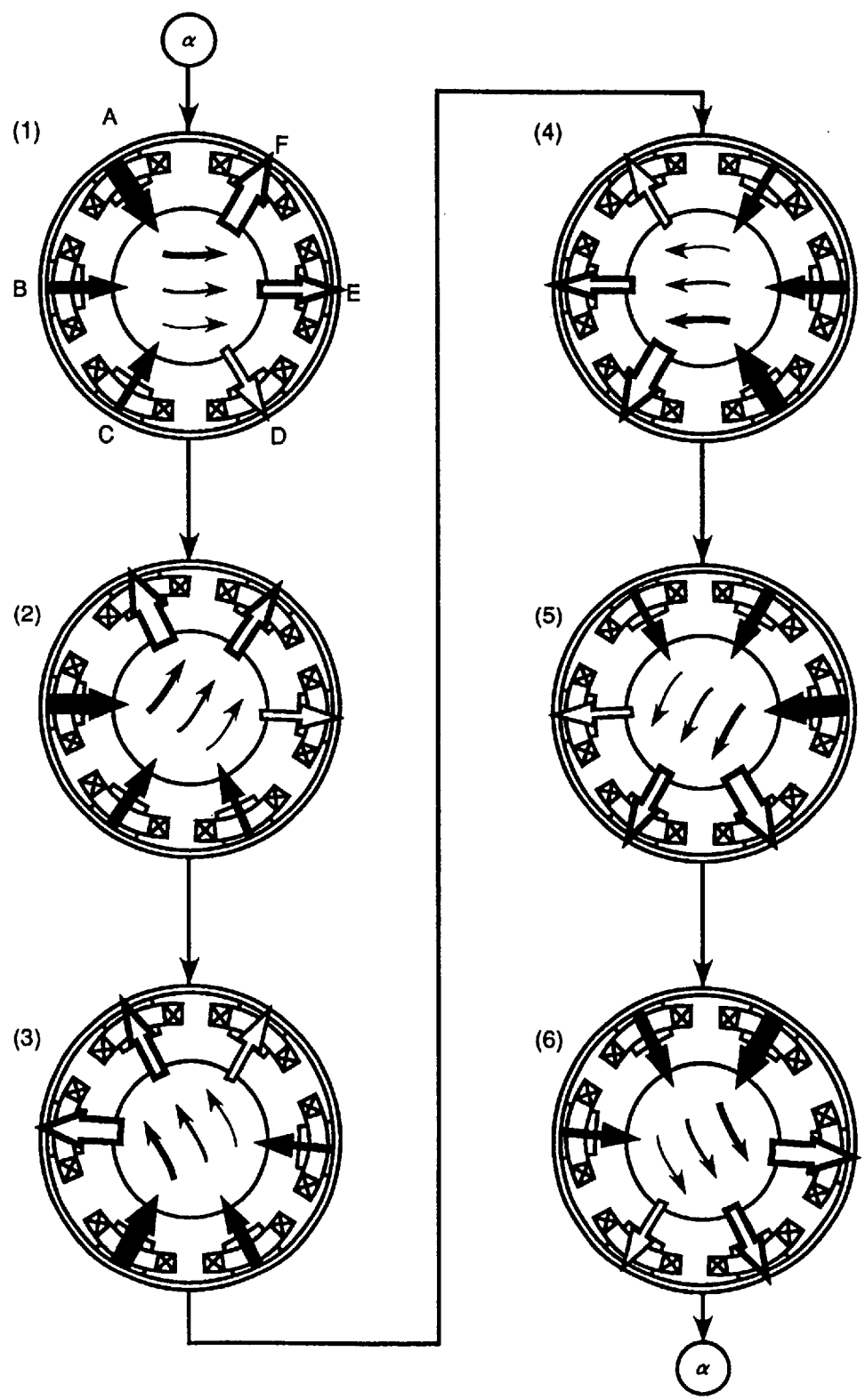
FIGS. 46(1)–(6) shows examples for providing inclination in the magnetic field distribution according to the invention.

A second method of cancelling the drift effect is to provide a gradient magnetic field distribution by supplying a different coil current to each coil from coil power source 119 as indicated in FIGS. 46 (1)–(6). At a first timing of FIG. 46(1), coils A and F; coils B and E; coils C and D are supplied with currents I0;I1;I2, respectively, which are $I0 \geq I1 > I2$. Thereby, a magnetic field distribution indicated by thin arrows on a plane parallel to a sample (indicated by thin arrows in the center portion of the drawing) is caused to have a gradient in a direction perpendicular (in the case of (1), in the direction from the upper to the bottom) to a major direction of magnetic fields (in the case of (1), in the direction from the left side to the right side). By provision of such gradient magnetic field distribution, the drift effect due to interaction of the electrical field and the magnetic field can be reduced significantly. Further, by executing the rotation and reversal of magnetic fields as well as equalization thereof with respect to the state of the first timing of FIG. 46 (1), the drift and localization or nonuniform distribution can be eliminated.

By way of example, coil currents are shown to change in rectangular pulses in FIGS. 41, 43 and 45, however, it is not limited thereto. When the coil current changes abruptly, it may cause instability in plasma, thereby, when changing the direction of the coil current, it is preferable to provide a timing of current zero at which the current is maintained zero, or to cause the current to vary gradually (at a sufficiently small ratio of 1/10 or less in one cycle).

Further, as have been described hereinabove, application of the magnetic field forming means and the method therefor are not limited to the plasma processing apparatus using the electron resonance phenomena, nor the intensity of the magnetic fields is limited to 100 gauss or smaller. For example, in the case where magnetron discharge is utilized, the intensity of its magnetic field is increased more than 100 gauss to enhance its plasma density. The magnetic field forming means and the method therefor according to the invention are also effective for forming such high intensity magnetic fields.

Now, the plasma dispersion prevention means of the invention will be described in detail with reference to FIG. 1. In the embodiment of FIG. 1, plasma dispersion prevention means 26 is provided in the periphery of the bottom electrode in the process chamber 10. This is provided for preventing plasma in the process chamber from dispersing into the lower portion of the process chamber, and thereby improving plasma density between the upper and the bottom electrodes. Further, when plasma is allowed to disperse outside the process chamber to the lower portion thereof or into the vacuum exhaust system, deposits of reaction products are caused to deposit on a wider area including such regions. The plasma dispersion prevention means is provided to prevent such plasma dispersion, to restrict the region which allows deposition of reaction products, and to reduce the time and cost required for removal of such depositions.

Figure 47:
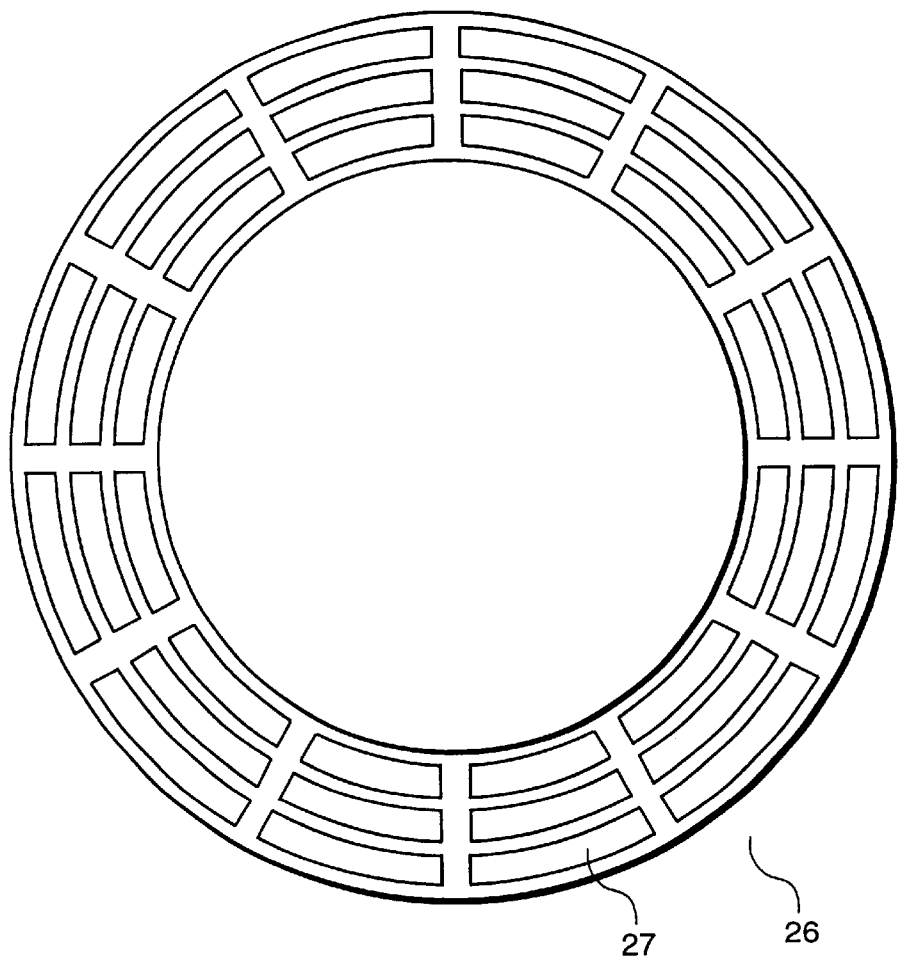
FIG. 47 is a plasma dispersion prevention means embodying the invention.

A structure of this plasma dispersion prevention means of the invention is indicated in FIG. 47. This plasma dispersion prevention means is comprised of a thin plate shaped in a ring, in which a plurality of openings 27 in a slit are formed concentrically. In consideration of easiness of manufacture, the shape of the openings is preferably a circle which can be easily processed using a drill. However, in the case of openings which is in a circle, its vacuum exhaust property, plasma stability and the effect of the plasma dispersion prevention means act contradictorily, thereby causing difficulty in satisfying all of them simultaneously. First of all, as to the exhaust property, it is required to minimize conductance of process gas to evacuating, thereby it is preferable for a diameter of the opening to be large, for example, 5 mm or larger. However, with the circle openings, when its diameter is increased exceeding its threshold, plasma is allowed to disperse through its openings. In addition, by the hollow cathode effect, local discharge occurs in the opening, thereby causing instability of plasma. On the other hand, when the diameter of the openings is reduced in order to prevent such problems, reaction products are caused to deposit at the openings with time, thereby changing effective opening area, and thereby causing its exhaust property to change with time.

Accordingly, in this embodiment of the invention, the shape of each opening is formed not in a circle, but in a rectangular narrow slit having a different size of width and length, and a plurality of these slits are arranged concentrically. A width of the opening which is to be determined by a desirable dispersion prevention effect is preferably 6 mm at largest. A yardstick for an appropriate width of the opening is to set approximately at twice or less of a thickness of its plasma sheath. By setting the width as such, it can be ensured that its bulk plasma will not enter the openings, thereby preventing the plasma dispersion. As to the length of each opening (a length in the peripheral directions in the case of concentrical arrangements of slits), any length if it is more than twofold of the size of width will do. Further, a thickness of the thin plate into which the plurality of openings are formed is set preferably at 3 mm or more in order to prevent inflow of bulk plasma.

According to this openings with the slit shape, a ratio of openings, that is, a ratio of openings relative to the entire area of the plate, can be increased compared to the ratio of the openings in the shape of circle. For example, in the case where a plurality of openings each having a slit with 3 mm width and 20 mm length are formed concentrically with a pitch of 4 mm therebetween, its opening ratio becomes approximately 75%. On the other hand, in the case where a plurality of openings are formed circularly with 3 mm diameter and disposed at a pitch of 4 mm, its opening ratio becomes 50% at most. Since a larger opening ratio is ensured using the slit shape openings as described above, its conductance to exhausting can be advantageously reduced. Further, since the length of its opening to the width thereof (aspect ratio) is sufficiently large, local discharge due to the hollow cathode effect is suppressed to occur, thereby causing no instable plasma. The effect of the plasma dispersion prevention is determined by its width in the case of the slit opening, and by its diameter in the case of the circular opening. Thereby, the effect of the plasma dispersion prevention does not change with an increasing length of the slit opening.

The features and advantages according to the plasma dispersion prevention means of the invention are summarized in the following by way of an example using a thin plate of 5 mm thick and with a slit opening of 3 mm wide, 30 mm length in the peripheral direction. By provision of the plasma dispersion prevention means, the optical emission intensity of plasma between the electrodes increased approximately 1.6 times greater, and the optical emission intensity of plasma having dispersed to the bottom portion of the plasma processing chamber decreased approximately to one fourth. Further, as to its discharge voltage, there is such an advantage that its effective plasma generating high frequency power increased approximately from 10 to 20%. Accordingly, its etching properties such as etching rate and selectivity have increased advantageously. The operating pressure in the processing chamber increases approximately 0.2 to 0.5 Pa by provision of the plasma dispersion prevention means. However, since the pressure increase is small and the operating pressure is still under several Pa, the operating pressure can be set at a predetermined value by regulating the set pressure without a difficulty.

Figure 48:
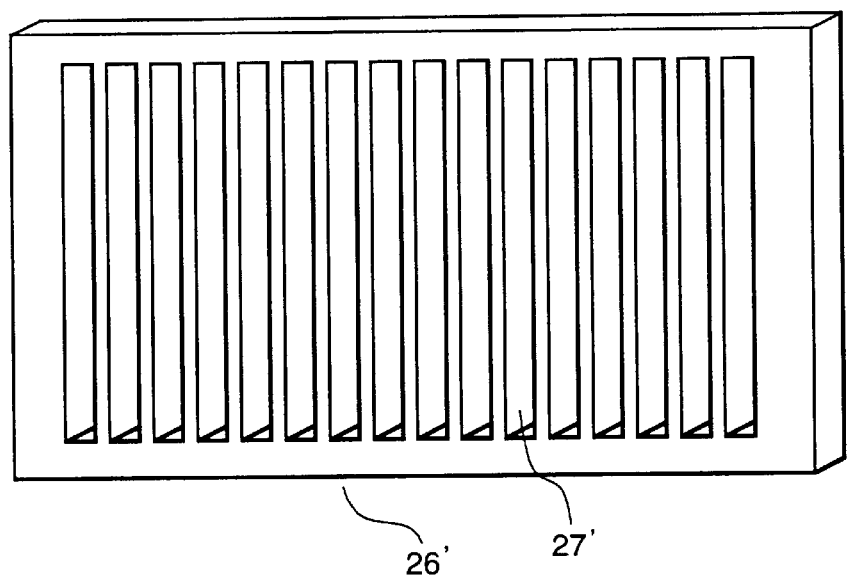
FIG. 48 is another plasma dispersion prevention means embodying the invention.

Further, according to this embodiment of the invention, the plurality of slit openings are formed concentrically, however, it is not limited thereto, and they may be formed radially, or to have an appropriate angle with respect to the peripheral directions. Further, according to this embodiment of the invention, the plasma dispersion prevention means for preventing plasma from dispersing to the bottom portion of the plasma processing chamber is provided using the thin plate shaped in a ring which is disposed in the periphery of the bottom electrode provided in the lower portion in the process chamber. The position of this plasma dispersion prevention plate is not limited thereto, and may be placed anywhere suitable for preventing plasma dispersion, and also its shape may be changed as desired to suit to any particular position to be disposed. For example, in the case of preventing plasma dispersion to a turbo molecular pump of the vacuum exhaust system, it may be placed in front of the entrance to the exhaust port or the turbo pump, after being formed in any appropriate shape such as a rectangular or circular thin plate provided with slit openings. One example of such is indicated in FIG. 48. In this embodiment, plasma dispersion prevention means 26' is provided using a square thin plate having a plurality of slit openings 27'.

Figure 49:
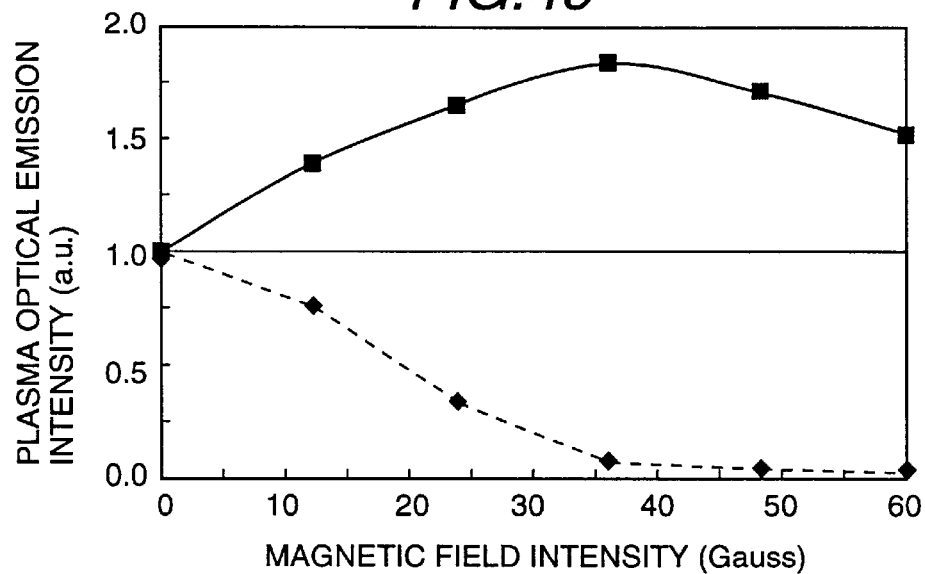
FIG. 49 indicates an effect of application of magnetic field on the prevention of plasma dispersion as measured in terms of the intensities of plasma emission.

The effect of the plasma dispersion prevention means described above is based on the results obtained without applying the magnetic field between the upper and the bottom electrodes. However, the effect of the plasma dispersion prevention becomes more significant in combination with the magnetic field. This combined effect is indicated in FIG. 49, where it is indicated in terms of optical emission intensity from plasma. FIG. 49 indicates changes in the optical emission intensity of plasma when the intensity of magnetic fields formed by magnetic field forming means 50 of FIG. 1 is changed from 0 to 60 gauss both for plasma in the process chamber (indicated by a solid line) and dispersed plasma in the periphery of the bottom electrode in the bottom portion of the process chamber (indicated by dot line). Plasma dispersion prevention means 26 used here has a structure of FIG. 47. The shape of its openings is the same as described above and is 3 mm wide, 30 mm long in the peripheral direction, and its plate thickness is 5 mm. Measurement conditions are that a gas flow of Ar 500 sccm and $C_4F_8$ 4 sccm; pressure at 2 Pa; a gap of the electrodes at 20 mm. The intensity of plasma emission is evaluated for Ar at 419 nm, and their optical emission intensities are normalized by the value obtained at the magnetic field intensity of zero. As clearly indicated in FIG. 49, the intensity of plasma emission of plasma in the process chamber increases (solid line), while the intensity of emission of dispersed plasma in the bottom portion decrease (broken line). For example, when a magnetic field of 40 gauss is applied, an intensity of emission of the dispersed plasma decreases to less than one tenth of a value obtained without application of the magnetic field.

As described hereinabove, the effect of the plasma dispersion prevention of the invention is enhanced remarkably by application of the magnetic field of several tens of gauss. The reason for this is as follows. While the direction of magnetic field formed by the magnetic field forming means is parallel to the plane of the electrodes, the direction of the openings in the plasma dispersion prevention means is formed in the vertical direction, namely in the perpendicular direction intersecting the line of magnetic force. Since electrons in plasma move along the lines of magnetic force, plasma dispersion is constrained along the direction of magnetic fields. Thereby, when the lines of magnetic force and the direction of the openings are arranged to intersect, plasma is caused to extinct on the wall of the openings, thereby preventing plasma dispersion effectively.

Figure 50:
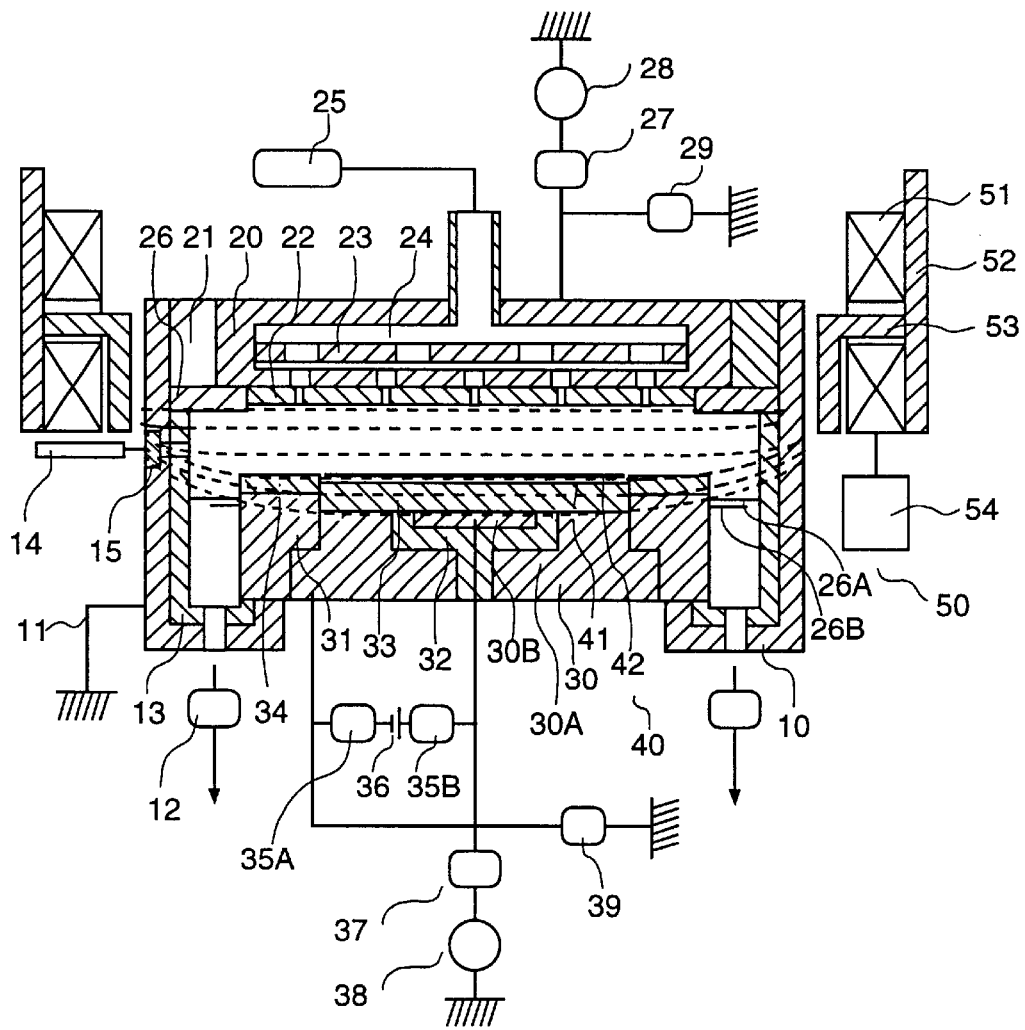
FIG. 50 indicates still another plasma dispersion prevention means embodying the invention.

The mechanism for achieving the effect of the plasma dispersion prevention according to the invention has been described as above. It is expected therefore that when the internal wall of the openings of the plasma dispersion prevention means and the lines of magnetic force are arranged to intersect under application of the magnetic fields, the plasma dispersion can be effectively prevented. FIG. 50 shows an embodiment of such arrangement. Although most of its arrangements are the same as FIG. 1, its plasma dispersion prevention means has a structure of thin plate parallel rings 26A and 26B which are disposed stepwise. Lines of magnetic force which are indicated by broken lines intersect the surfaces of the ring plates, thereby effectively preventing plasma dispersion. In addition, according to this structure, the ring plate needs not be formed a plurality of openings. However, since the angle of intersection between the lines of magnetic force and the parallel ring surfaces is shallow, there may occur that prevention of the plasma dispersion is not adequate. In such a case, an additional line of magnetic force may be formed locally using permanent magnets such that the angle of intersection between the ring surfaces and an overall line of magnetic force increases.

Further, examples of the circular or square thin plate provided with slit openings which are used for the prevention of plasma dispersion into the vacuum exhaust system have been described in the foregoing paragraphs. The above-mentioned method to form additional local magnetic field is also effective in these examples described above. Namely, by forming additional magnetic field locally using permanent magnets such that it intersects the direction of slit openings in the thin plate, plasma dispersion into the vacuum exhaust system can be prevented effectively.

[Advantages and Effects of the Invention]

According to the present invention, it becomes possible to control the plasma density, electron energy distribution or the dissociation state of process gas in the plasma sheath portion by forming electron resonance regions of ECR-S and ESR due to interaction between the electrical field and the magnetic field which is applied parallel to the plane of the electrodes in the plasma sheath portion of the electrodes, and further controlling the electron resonance by the magnetic field. Further, since the electron resonance region extends to the wider region of the electrode surfaces, the plasma density and the gas dissociation can be controlled uniformly across the entire region of plasma and over the whole area of the wafer without any localization. Thereby, there are such advantages that uniform etching rate and uniform selectivity can be ensured for a large sized wafer. In addition, by regulating the size of the electron resonance region, the plasma distribution can be controlled as well.

Further, according to another feature of the invention, as to the intensity of the magnetic field, when the frequency of the high frequency power for generating plasma is, for example, 68 MHz, its ECR-S magnetic field intensity is 24 gauss and its ESR magnetic filed intensity is 12 gauss, thereby the range of magnetic fields to be controlled is at most in a range up to several tens gauss. Therefore, since a high magnetic field that will cause the drift is not necessary, damages of the wafer resulting from the deviation of potentials over the wafer, and the difficulty in the design for providing gradient magnetic fields to avoid such damages can be eliminated. Still further, since the dissociation state of the process gas can be controlled without addition of gas, contradicting properties such as the etching rate and the selectivity can be achieved compatibly.

According to still another feature of the invention, by magnetically shielding external portions of the plurality of coils with the magnetic shield, and using the magnetic field forming means provided with the yoke having the coil penetration portion and the pendant portion, the magnetic field of which the horizontal component is dominant in the space between the upper and the bottom electrodes in the process chamber can be formed at the lower portion of the center line between the coils. Further, the magnetic field having a preferred intensity can be formed to the proximity of the electrode for mounting a large sized wafer without need of increasing coil currents. As a result, such advantages have been achieved that the efficiency of plasma processing of the large sized sample and uniformity of processing have been improved substantially, and that the size of coils and the thermal loss thereof are reduced.

Further, still another feature of the invention, the magnetic field is rotated and reversed by controlling coil currents flowing through the plurality of coils by shifting each phase, and any nonuniform distribution of plasma due to electron drifts can be suppressed by changing the ratio of coil currents flowing through the plurality of coils.

Still further, according to the feature of the invention, plasma dispersion in the process chamber can be prevented. As a result, the plasma density between the upper and the bottom electrodes can be increased, thereby improving the etching property. Further, deposition or sticking of reaction products by plasma dispersion on the surface in the bottom portion of the process chamber or on the other surfaces outside the process chamber such as the vacuum exhaust system can be prevented. Thereby, since the region on which deposition is allowed is restricted, the time and cost needed for removal of such deposition can be minimized. Further, by increasing the intensity of magnetic field, for example, in excess of 40 gauss, the plasma dispersion can be more effectively prevented, thereby further enhancing the effects on the improvement of plasma density and the restriction of deposition areas.

What is claimed is:

1. A plasma process apparatus comprising a vacuum process chamber, a plasma generation means containing a pair of electrodes placed at the top and bottom inside of said vacuum process chamber, a sample table having a sample placement surface on which the sample to be process is placed, said table being one of said pair of electrodes, and a vacuum exhaust means that evacuates said vacuum process chamber, wherein said top electrode has a bottom surface which is flat and forms part of said process chamber, a high frequency power source that applies high frequency power at 40 MHZ to 150 MHZ between said pair of electrodes and provides an electric field, a magnetic field forming means for forming an electron sheath resonance (ESR), said magnetic field forming means generating one of a low frequency alternating magnetic field and a static magnetic field having an intensity controllable to a value in the range of 2 gauss to 60 gauss, wherein said magnetic field which is generated is formed in a region immediately below said top electrode, is concentrated on the region and is formed substantially parallel to the bottom surface of said top electrode, said magnetic field forming means containing a plural number of pairs of electromagnetic coils placed on a left and right exterior side of said process chamber and a current control means for controlling the current passed through said electromagnetic coils so that said electron sheath resonance (ESR) is formed at an electron resonance magnetic field intensity due to mutual effect of the magnetic field generated by said magnetic field forming means and the electric field in a sheath part of said plasma over substantially the entire surface in the neighborhood of the sheath of the plasma at the bottom surface of said top electrode, the condition of said plasma being controlled by controlling said electron resonance through the control of the current flowing through said electromagnetic coils of said magnetic field forming means.

2. A plasma process apparatus according to claim 1, wherein electron resonance region is formed by the electron sheath resonance (ESR) which occurs at a magnetic field intensity Bs which is defined by Bs (gauss)=½×0.357×f (MHz), where f is a frequency of said high frequency power supply.

3. A plasma process apparatus according to claim 1, wherein a spacing between said pair of electrodes is 15 mm to 100 mm.

4. A plasma process apparatus according to claim 1, wherein said electrodes are a pair of parallel flat plate electrodes placed at the top and bottom, and a region of generating said electron resonance is formed over substantially the entire surface of the sheath on the bottom surface of the top electrode plate by making the position of forming the parallel magnetic field come on the bottom surface of the top electrode plate.

5. A plasma processing method for a plasma process apparatus having a vacuum process chamber, a plasma generation means containing a pair of electrodes placed at the top and bottom inside of said vacuum process chamber, a sample table having a sample placement surface on which the sample to be processed is placed said table being one of said pair of electrodes, and a vacuum exhaust means that evacuates said vacuum process chamber, said method comprising the steps of:

applying a high frequency power at 20 MHz to 300 MHz from a high frequency power generation means between said pair of electrodes to generate an electric field;

generating one of a low frequency alternating magnetic field and a static magnetic field having an intensity controllable to a value of no greater than 100 gauss with said magnetic field being at right angles to the electric field generated by said high frequency power source at the surface coming into contact with the plasma of at least one of said pair of electrodes;

forming electron sheath resonance (ESR) at the electron resonance magnetic field intensity due to mutual effect of said magnetic field and said electric field at a position that extends over substantially the entire surface in the neighborhood of the surface coming into contact with the plasma at at least one of said pair of electrodes; and controlling at least one of plasma density, electron energy distribution in the plasma, and the condition of dissociation of the process gas by controlling said electron resonance using said magnetic field forming means.

6. A method of plasma processing of samples according to claim 5, wherein a spacing between said pair of electrodes is 15 mm to 100 mm, and a magnetic field from said magnetic field forming means and that can cause electron resonance is applied in a direction substantially parallel to the electrode surface of said pair of electrodes, the extent of said electron resonance being controlled by varying the intensity of said magnetic field.

7. A method of plasma process of samples according to claim 5, wherein a spacing between said pair of electrodes is 15 mm to 100 mm, and controlling constituent ratios of different radicals in a process gas by forming a magnetic field at an interface section between said pair of electrodes with said magnetic field being substantially parallel to said sheath, and by utilizing both resonances of said ESR and said ECR-S that are generated by varying the intensity of said magnetic field.

8. A method of plasma processing of samples according to claim 5, wherein the step of applying a high frequency power applies high frequency power at 40 MHz to 150 MHz between said pair of electrodes, said top electrode having a bottom surface which is flat and forms part of said process chamber, said magnetic field which is generated being intensity controllable to a value in the range of 2 Gauss to 60 Gauss and said magnetic field being formed in a region immediately below said top electrode, being concentrated on the region and being formed substantially parallel to the bottom surface of said top electrode.

9. A method of plasma processing of samples according to claim 5, wherein the step of forming the electrode sheath resonance (ESR) is formed at a magnetic field intensity Bs which is defined by Bs (Gauss)=½×0.357×f (MHC), where f is a frequency of said high frequency power supply.

10. A method of plasma processing of samples according to claim 5, wherein said pair of electrodes are a pair of parallel flat plate electrodes placed at the top and bottom and said electron sheath resonance (ESR) is formed over substantially the entire surface of the sheath on the bottom surface of said top electrode plate by making the position of forming the parallel magnetic field come on the bottom surface of said top electrode plate.

* * * * *